(12) United States Patent
Otsu et al.

(10) Patent No.: US 10,937,801 B2
(45) Date of Patent: Mar. 2, 2021

(54) THREE-DIMENSIONAL MEMORY DEVICE CONTAINING A POLYGONAL LATTICE OF SUPPORT PILLAR STRUCTURES AND CONTACT VIA STRUCTURES AND METHODS OF MANUFACTURING THE SAME

(71) Applicant: SANDISK TECHNOLOGIES LLC, Addison, TX (US)

(72) Inventors: Yoshitaka Otsu, Yokkaichi (JP); Koichiro Nagata, Yokkaichi (JP); Junpei Kanazawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/361,773

(22) Filed: Mar. 22, 2019

(65) Prior Publication Data

US 2020/0303398 A1  Sep. 24, 2020

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC ......... H01L 27/11526; H01L 27/11548; H01L 27/11573; H01L 27/11575;
(Continued)

(56) References Cited

U.S. PATENT DOCUMENTS 5,915,167 A  6/1999 Leedy
8,394,716 B2 * 3/2013 Hwang ................. H01L 21/768
                                                        438/667
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Victoria K. Hall
(74) *Attorney, Agent, or Firm* — The Marbury Law Group, PLLC

(57) ABSTRACT

A vertically alternating sequence of continuous insulating layers and continuous sacrificial material layers is formed over a substrate, and is patterned to form stepped surfaces. Memory stack structures are formed in a memory array region of the alternating stack. Support pillar structures are formed through the vertically alternating sequence within a staircase region. The support pillar structures are formed at lattice sites of a hexagonal lattice structure that includes unoccupied lattice sites. Portions of the continuous sacrificial material layers are replaced with electrically conductive layers. Contact via structures are formed on a respective one of the electrically conductive layers at the unoccupied lattice sites. Geometrical centers of the support pillar structures are arranged at vertices of a polygon having more than four vertices having a respective contact via structure located at a geometric center of the polygon in a plan view.

19 Claims, 45 Drawing Sheets

US 10,937,801 B2

Page 2

(51) Int. Cl.
*H01L 27/1157* (2017.01)
*H01L 27/11573* (2017.01)
*H01L 27/11519* (2017.01)
*H01L 27/11524* (2017.01)
*H01L 27/11529* (2017.01)
*H01L 27/11556* (2017.01)

(52) U.S. Cl.
CPC .. *H01L 27/11524* (2013.01); *H01L 27/11529* (2013.01); *H01L 27/11556* (2013.01); *H01L 27/11565* (2013.01); *H01L 27/11573* (2013.01)

(58) Field of Classification Search
CPC ......... H01L 27/11519; H01L 27/11565; H01L 27/11582; H01L 27/11524; H01L 27/11529; H01L 27/11556; H01L 27/1157
See application file for complete search history.

(56) References Cited

U.S. PATENT DOCUMENTS

| | | | |
|---|---|---|---|
| 8,956,968 B2 * | 2/2015 | Higashitani | H01L 28/87 438/630 |
| 9,362,306 B2 * | 6/2016 | Park | H01L 27/1157 |
| 9,419,011 B2 * | 8/2016 | Lee | H01L 27/11582 |
| 9,449,987 B1 * | 9/2016 | Miyata | H01L 27/11582 |
| 9,455,268 B2 * | 9/2016 | Oh | H01L 27/11556 |
| 9,502,471 B1 * | 11/2016 | Lu | H01L 27/2481 |
| 9,530,790 B1 * | 12/2016 | Lu | H01L 27/11582 |
| 9,536,897 B2 * | 1/2017 | Yoo | H01L 27/11582 |
| 9,543,318 B1 * | 1/2017 | Lu | H01L 27/11582 |
| 9,553,101 B2 * | 1/2017 | Kim | H01L 29/7926 |
| 9,576,966 B1 * | 2/2017 | Peri | H01L 27/115 |
| 9,576,967 B1 | 2/2017 | Kimura et al. | |
| 9,659,956 B1 | 5/2017 | Pachamuthu et al. | |
| 9,716,105 B1 * | 7/2017 | Tsutsumi | H01L 27/11582 |
| 9,748,258 B2 * | 8/2017 | Jeong | H01L 27/11565 |
| 9,754,963 B1 | 9/2017 | Kawamura et al. | |
| 9,805,805 B1 * | 10/2017 | Zhang | H01L 27/11565 |
| 9,812,461 B2 | 11/2017 | Doda et al. | |
| 9,824,966 B1 * | 11/2017 | Kanakamedala | H01L 21/76816 |
| 9,853,038 B1 | 12/2017 | Cui | |
| 9,875,929 B1 * | 1/2018 | Shukla | H01L 27/11582 |
| 9,881,929 B1 | 1/2018 | Ravikirthi et al. | |
| 9,899,399 B2 | 2/2018 | Ogawa et al. | |
| 9,905,573 B1 | 2/2018 | Mada et al. | |
| 9,922,987 B1 * | 3/2018 | Mizutani | H01L 27/11582 |
| 9,929,174 B1 * | 3/2018 | Mizutani | H01L 27/1157 |
| 9,935,050 B2 * | 4/2018 | Dunga | H01L 27/2481 |
| 9,941,299 B1 * | 4/2018 | Chen | H01L 27/11597 |
| 9,947,684 B2 * | 4/2018 | Park | H01L 27/11565 |
| 9,960,180 B1 * | 5/2018 | Zhou | H01L 29/40117 |
| 9,966,386 B2 * | 5/2018 | Kato | H01L 27/11519 |
| 9,972,640 B1 * | 5/2018 | Kai | H01L 21/76877 |
| 9,972,641 B1 * | 5/2018 | Zhang | H01L 27/11582 |
| 9,978,766 B1 | 5/2018 | Hosoda et al. | |
| 10,014,316 B2 | 7/2018 | Yu et al. | |
| 10,038,006 B2 * | 7/2018 | Furihata | H01L 27/1157 |
| 10,043,818 B2 * | 8/2018 | Lee | H01L 27/11573 |
| 10,115,459 B1 * | 10/2018 | Yamada | G11C 13/0002 |
| 10,115,632 B1 | 10/2018 | Masamori et al. | |
| 10,115,681 B1 * | 10/2018 | Ariyoshi | H01L 23/564 |
| 10,115,730 B1 * | 10/2018 | Baraskar | H01L 27/11582 |
| 10,115,732 B2 * | 10/2018 | Yu | H01L 21/0214 |
| 10,121,794 B2 * | 11/2018 | Gunji-Yoneoka | H01L 27/11556 |
| 10,141,331 B1 * | 11/2018 | Susuki | H01L 27/11582 |
| 10,192,878 B1 * | 1/2019 | Tsutsumi | H01L 21/76801 |
| 10,199,326 B1 * | 2/2019 | Ohsaki | H01L 27/11568 |
| 10,209,636 B1 * | 2/2019 | Toda | G03F 9/7034 |
| 10,224,240 B1 * | 3/2019 | Funayama | H01L 23/5226 |
| 10,229,931 B1 * | 3/2019 | Hinoue | H01L 27/11582 |
| 10,256,167 B1 * | 4/2019 | Fukuo | H01L 29/518 |
| 10,256,247 B1 * | 4/2019 | Kanakamedala | H01L 29/7926 |
| 10,256,252 B1 * | 4/2019 | Kanazawa | H01L 27/11582 |
| 10,269,820 B1 * | 4/2019 | Kaminaga | H01L 27/11556 |
| 10,283,493 B1 * | 5/2019 | Nishida | H01L 27/11573 |
| 10,283,513 B1 * | 5/2019 | Zhou | H01L 27/11565 |
| 10,290,643 B1 * | 5/2019 | Kai | H01L 27/1157 |
| 10,290,648 B1 * | 5/2019 | Zhou | H01L 29/41725 |
| 10,290,650 B1 * | 5/2019 | Iwai | H01L 27/11556 |
| 10,319,680 B1 * | 6/2019 | Sel | H01L 23/53295 |
| 10,355,139 B2 * | 7/2019 | Sharangpani | H01L 27/11565 |
| 10,361,213 B2 * | 7/2019 | Sharangpani | H01L 27/11582 |
| 10,373,970 B2 * | 8/2019 | Lee | H01L 27/11556 |
| 10,381,322 B1 * | 8/2019 | Azuma | H01L 24/08 |
| 10,381,372 B2 * | 8/2019 | Amano | H01L 21/76879 |
| 10,381,434 B1 * | 8/2019 | Pachamuthu | H01L 27/11556 |
| 10,381,450 B1 * | 8/2019 | Yada | H01L 27/11573 |
| 10,461,030 B2 * | 10/2019 | Hwang | H01L 27/11548 |
| 10,475,804 B1 * | 11/2019 | Nishikawa | H01L 29/4234 |
| 10,475,879 B1 * | 11/2019 | Pachamuthu | G11C 16/0466 |
| 10,490,569 B2 * | 11/2019 | Mushiga | H01L 21/76805 |
| 10,559,583 B2 * | 2/2020 | Park | H01L 27/1157 |
| 10,629,606 B2 * | 4/2020 | Sugawara | H01L 27/11575 |
| 10,629,613 B1 * | 4/2020 | Shimizu | H01L 27/11573 |
| 10,629,616 B1 * | 4/2020 | Kai | H01L 27/11524 |
| 10,651,196 B1 * | 5/2020 | Sharangpani | H01L 27/11565 |
| 10,665,607 B1 * | 5/2020 | Sugiura | H01L 21/76829 |
| 10,672,780 B1 * | 6/2020 | Kawamura | H01L 27/11582 |
| 10,714,497 B1 * | 7/2020 | Nishida | H01L 27/1157 |
| 10,734,400 B1 * | 8/2020 | Fukuo | H01L 23/5329 |
| 2010/0052042 A1 * | 3/2010 | Tanaka | H01L 27/11556 257/324 |
| 2011/0092038 A1 * | 4/2011 | Choi | H01L 27/11556 438/268 |
| 2011/0104869 A1 * | 5/2011 | Hyun | H01L 27/11575 438/430 |
| 2011/0169071 A1 * | 7/2011 | Uenaka | H01L 27/105 257/326 |
| 2011/0284943 A1 * | 11/2011 | Hwang | H01L 27/0207 257/314 |
| 2012/0119287 A1 * | 5/2012 | Park | H01L 27/11519 257/329 |
| 2013/0009274 A1 * | 1/2013 | Lee | H01L 29/02 257/499 |
| 2014/0063890 A1 * | 3/2014 | Lee | H01L 27/11524 365/63 |
| 2015/0228623 A1 * | 8/2015 | Oh | H01L 27/11582 257/4 |
| 2015/0235939 A1 * | 8/2015 | Lee | H01L 27/11573 257/774 |
| 2015/0287710 A1 * | 10/2015 | Yun | H01L 23/5226 257/314 |
| 2016/0276360 A1 | 9/2016 | Doda et al. | |
| 2016/0336193 A1 * | 11/2016 | Park | H01L 27/10852 |
| 2017/0047334 A1 * | 2/2017 | Lu | H01L 27/11575 |
| 2017/0062454 A1 * | 3/2017 | Lu | H01L 29/7926 |
| 2017/0084618 A1 * | 3/2017 | Peri | H01L 27/11582 |
| 2017/0084623 A1 * | 3/2017 | Sharangpani | H01L 29/40114 |
| 2017/0092654 A1 * | 3/2017 | Nishikawa | H01L 29/66545 |
| 2017/0092733 A1 * | 3/2017 | Makala | H01L 27/11582 |
| 2017/0110464 A1 * | 4/2017 | Rabkin | H01L 29/1033 |
| 2017/0110470 A1 * | 4/2017 | Rabkin | H01L 27/11582 |
| 2017/0125433 A1 | 5/2017 | Ogawa et al. | |
| 2017/0125436 A1 * | 5/2017 | Sharangpani | H01L 27/11582 |
| 2017/0148810 A1 * | 5/2017 | Kai | H01L 23/535 |
| 2017/0148811 A1 * | 5/2017 | Zhang | H01L 27/11519 |
| 2017/0170191 A1 * | 6/2017 | Lee | H01L 27/11582 |
| 2017/0179154 A1 * | 6/2017 | Furihata | H01L 27/0288 |
| 2017/0236835 A1 * | 8/2017 | Nakamura | H01L 21/31111 257/314 |
| 2017/0243879 A1 * | 8/2017 | Yu | H01L 27/1157 |
| 2017/0352678 A1 * | 12/2017 | Lu | H01L 21/4846 |
| 2017/0365613 A1 * | 12/2017 | Gunji-Yoneoka | H01L 27/11524 |
| 2017/0373079 A1 * | 12/2017 | Sharangpani | H01L 27/11524 |
| 2017/0373197 A1 * | 12/2017 | Sharangpani | H01L 27/11565 |
| 2018/0019256 A1 * | 1/2018 | Amano | H01L 21/76879 |
| 2018/0061850 A1 | 3/2018 | Mada et al. | |
| 2018/0090373 A1 * | 3/2018 | Sharangpani | H01L 21/76865 |
| 2018/0090510 A1 * | 3/2018 | Kato | H01L 27/11565 |

(56) References Cited

U.S. PATENT DOCUMENTS

| | | | |
|---|---|---|---|
| 2018/0108671 A1* | 4/2018 | Yu | H01L 21/76229 |
| 2018/0130812 A1 | 5/2018 | Hosoda et al. | |
| 2018/0138194 A1* | 5/2018 | Shigemura | H01L 23/528 |
| 2018/0151497 A1* | 5/2018 | Makala | H01L 27/11556 |
| 2018/0151588 A1* | 5/2018 | Tsutsumi | H01L 29/0847 |
| 2018/0197876 A1* | 7/2018 | Ge | H01L 23/5283 |
| 2018/0247954 A1* | 8/2018 | Amano | H01L 21/28518 |
| 2018/0261611 A1* | 9/2018 | Norizuki | H01L 27/11582 |
| 2018/0261613 A1* | 9/2018 | Ariyoshi | H01L 27/11575 |
| 2018/0301374 A1 | 10/2018 | Masamori et al. | |
| 2018/0331118 A1* | 11/2018 | Amano | H01L 21/76858 |
| 2018/0342531 A1 | 11/2018 | Susuki et al. | |
| 2018/0366487 A1* | 12/2018 | Okizumi | H01L 27/1157 |
| 2018/0374865 A1* | 12/2018 | Shimabukuro | H01L 29/66553 |
| 2019/0006381 A1* | 1/2019 | Nakatsuji | H01L 27/11565 |
| 2019/0027489 A1* | 1/2019 | Orimoto | H01L 27/11575 |
| 2019/0067025 A1* | 2/2019 | Yada | H01L 21/30608 |
| 2019/0088672 A1* | 3/2019 | Tomimatsu | H01L 27/11565 |
| 2019/0096808 A1* | 3/2019 | Tsutsumi | H01L 23/535 |
| 2019/0096904 A1* | 3/2019 | Noguchi | H01L 21/31111 |
| 2019/0139974 A1* | 5/2019 | Sugawara | H01L 27/11582 |
| 2019/0148392 A1* | 5/2019 | Kanno | H01L 27/11565 257/66 |
| 2019/0148506 A1* | 5/2019 | Kanakamedala | H01L 29/66833 257/315 |
| 2019/0198515 A1* | 6/2019 | Hosoda | H01L 27/11556 |
| 2019/0214344 A1* | 7/2019 | Yu | H01L 21/31053 |
| 2019/0214395 A1* | 7/2019 | Zhang | H01L 27/11578 |
| 2019/0221574 A1* | 7/2019 | Shimabukuro | H01L 27/11582 |
| 2019/0229125 A1* | 7/2019 | Zhou | H01L 27/11556 |
| 2019/0252361 A1* | 8/2019 | Nishida | H01L 25/50 |
| 2019/0252405 A1* | 8/2019 | Tsutsumi | H01L 27/1157 |
| 2019/0259698 A1* | 8/2019 | Takahashi | H01L 27/11575 |
| 2019/0267391 A1* | 8/2019 | Imai | G11C 5/025 |
| 2019/0273088 A1* | 9/2019 | Cui | H01L 27/11556 |
| 2019/0280000 A1* | 9/2019 | Nakamura | H01L 29/7883 |
| 2019/0280001 A1* | 9/2019 | Terasawa | H01L 27/11556 |
| 2019/0287982 A1* | 9/2019 | Hinoue | H01L 21/76846 |
| 2019/0312035 A1* | 10/2019 | Takuma | H01L 27/11529 |
| 2019/0319100 A1* | 10/2019 | Chen | H01L 27/11524 |
| 2019/0355663 A1* | 11/2019 | Nishikawa | H01L 27/11573 |
| 2019/0355672 A1* | 11/2019 | Fujita | H01L 21/76805 |
| 2019/0371800 A1* | 12/2019 | Nishikawa | H01L 27/11582 |
| 2019/0371807 A1* | 12/2019 | Nishikawa | H01L 27/11529 |
| 2019/0386108 A1* | 12/2019 | Nishikawa | H01L 27/11556 |
| 2020/0006358 A1* | 1/2020 | Nishikawa | H01L 29/40117 |
| 2020/0006364 A1* | 1/2020 | Rabkin | H01L 27/11573 |
| 2020/0006374 A1* | 1/2020 | Rabkin | H01L 27/11573 |
| 2020/0020715 A1* | 1/2020 | Nakamura | H01L 27/11556 |
| 2020/0027835 A1* | 1/2020 | Hsu | H01L 27/11565 |
| 2020/0051989 A1* | 2/2020 | Shimizu | H01L 27/11575 |
| 2020/0051993 A1* | 2/2020 | Rabkin | H01L 21/02189 |
| 2020/0066745 A1* | 2/2020 | Yu | H01L 27/11578 |
| 2020/0127006 A1* | 4/2020 | Otsu | H01L 29/40117 |
| 2020/0168619 A1* | 5/2020 | Zhou | H01L 27/11582 |
| 2020/0194445 A1* | 6/2020 | Sharangpani | H01L 27/1157 |
| 2020/0194446 A1* | 6/2020 | Nishida | H01L 29/1037 |
| 2020/0219842 A1* | 7/2020 | Ji | H01L 27/11582 |
| 2020/0219895 A1* | 7/2020 | Mushiga | H01L 27/11582 |
| 2020/0219896 A1* | 7/2020 | Mushiga | H01L 27/11519 |
| 2020/0251149 A1* | 8/2020 | Zhang | G11C 5/063 |
| 2020/0251479 A1* | 8/2020 | Sakakibara | H01L 23/5226 |
| 2020/0258909 A1* | 8/2020 | Amano | H01L 23/485 |
| 2020/0266146 A1* | 8/2020 | Nishida | H01L 23/5226 |
| 2020/0266182 A1* | 8/2020 | Nishikawa | H01L 24/03 |

OTHER PUBLICATIONS

U.S. Appl. No. 15/943,859, filed Apr. 3, 2018, SanDisk Technologies LLC.

U.S. Appl. No. 16/021,749, filed Jun. 28, 2018, SanDisk Technologies LLC.

U.S. Appl. No. 16/021,831, filed Jun. 28, 2018, SanDisk Technologies LLC.

U.S. Appl. No. 16/276,952, filed Feb. 15, 2019, SanDisk Technologies LLC.

U.S. Appl. No. 16/276,996, filed Feb. 15, 2019, SanDisk Technologies LLC.

* cited by examiner

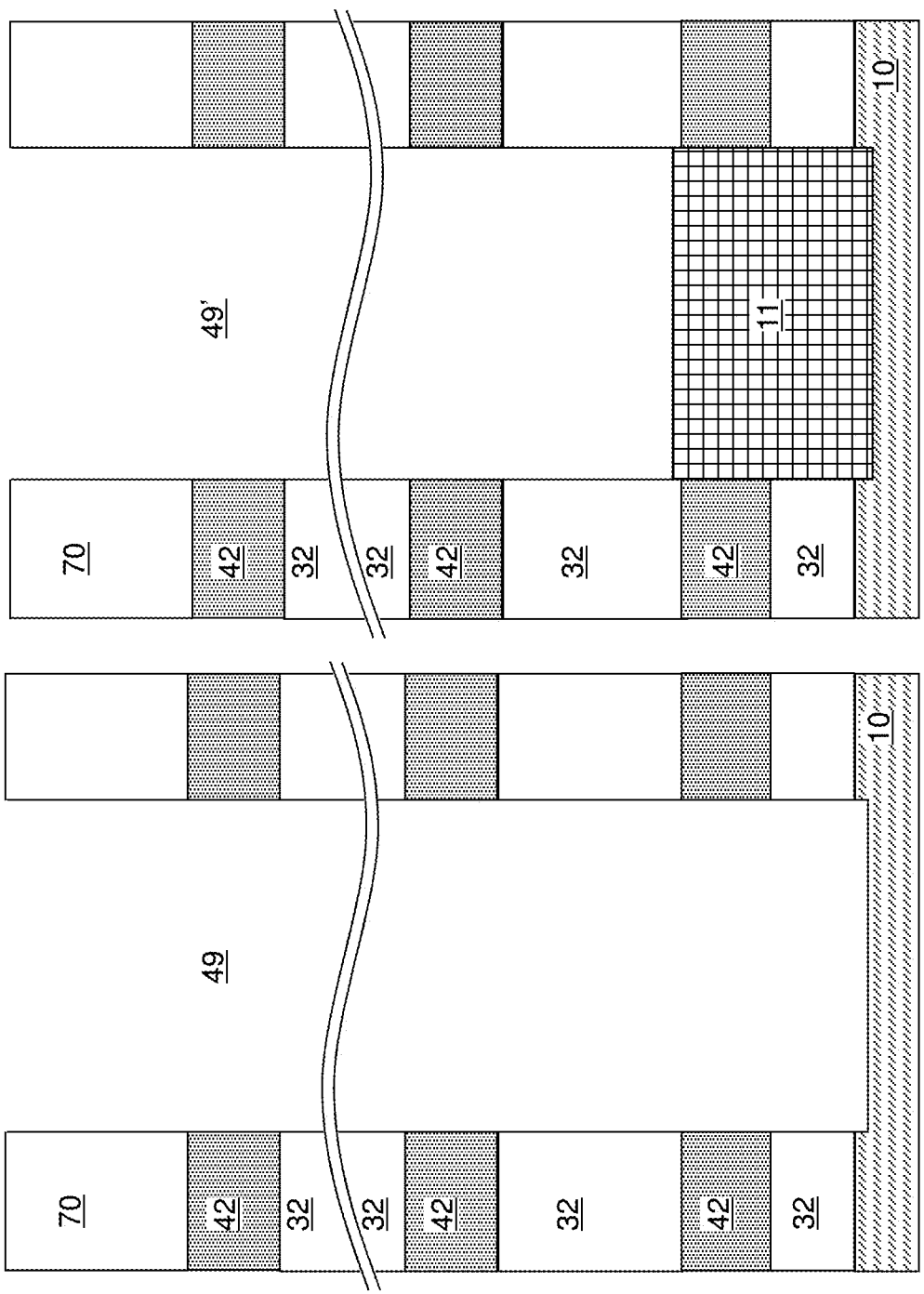

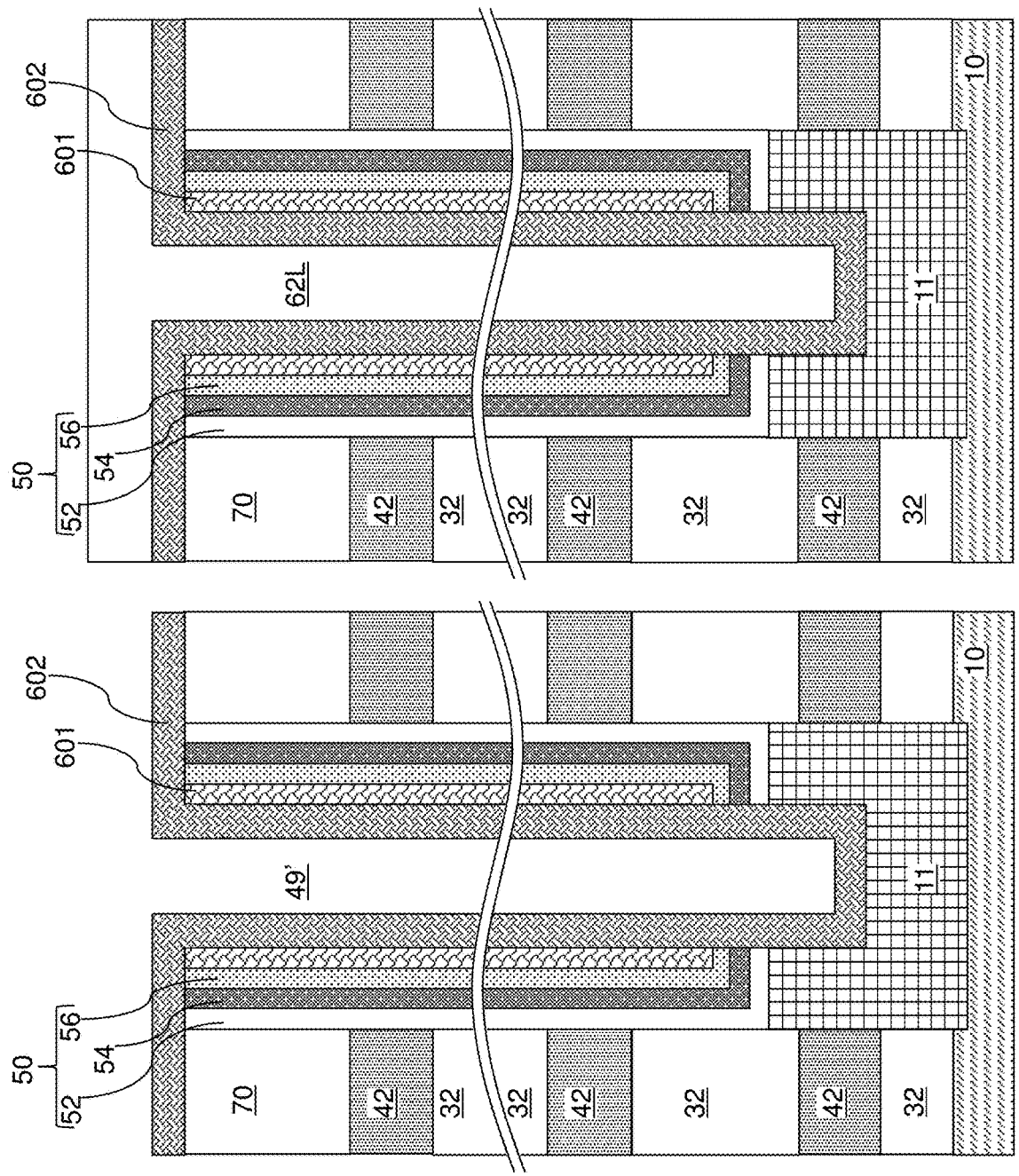

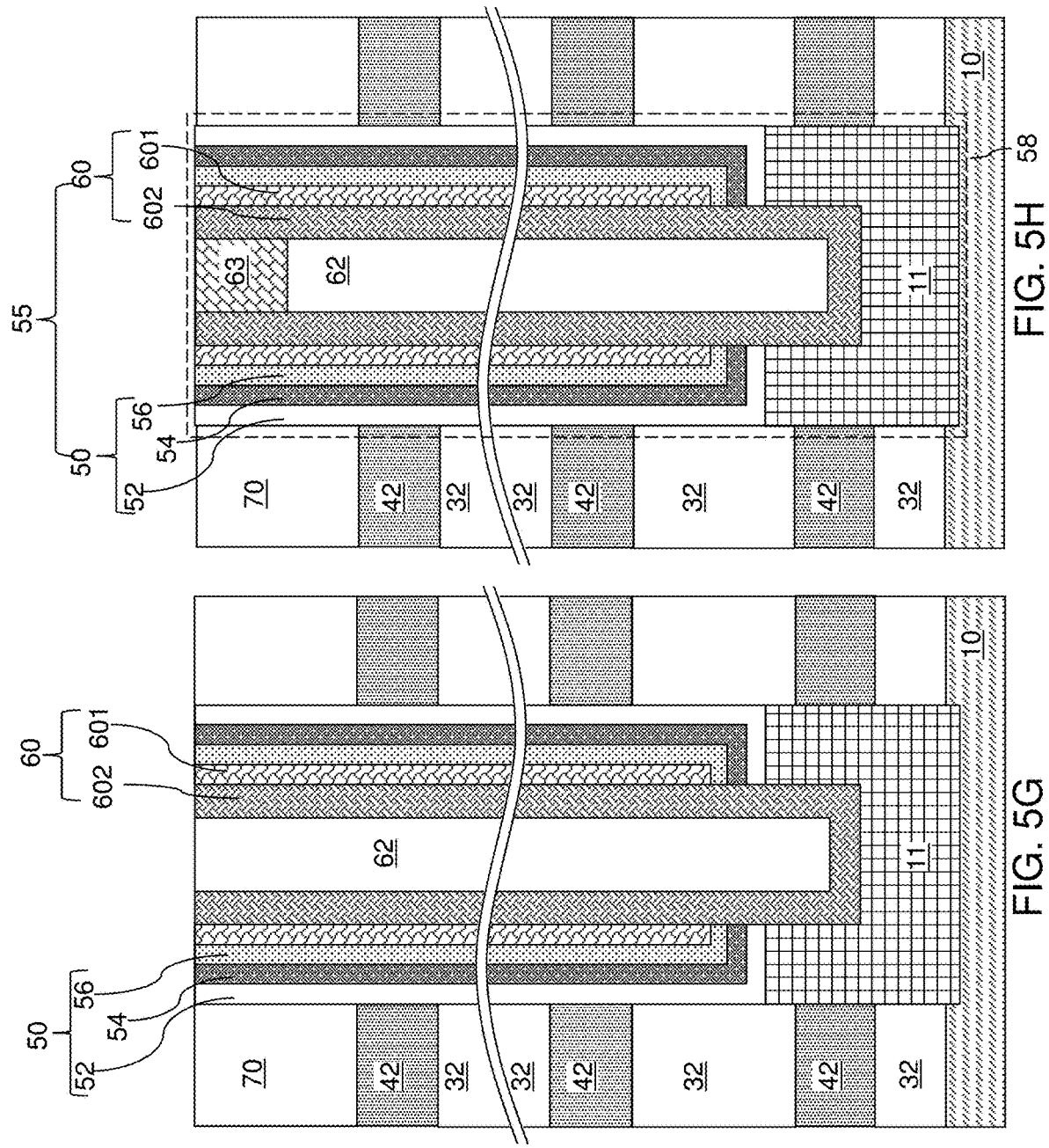

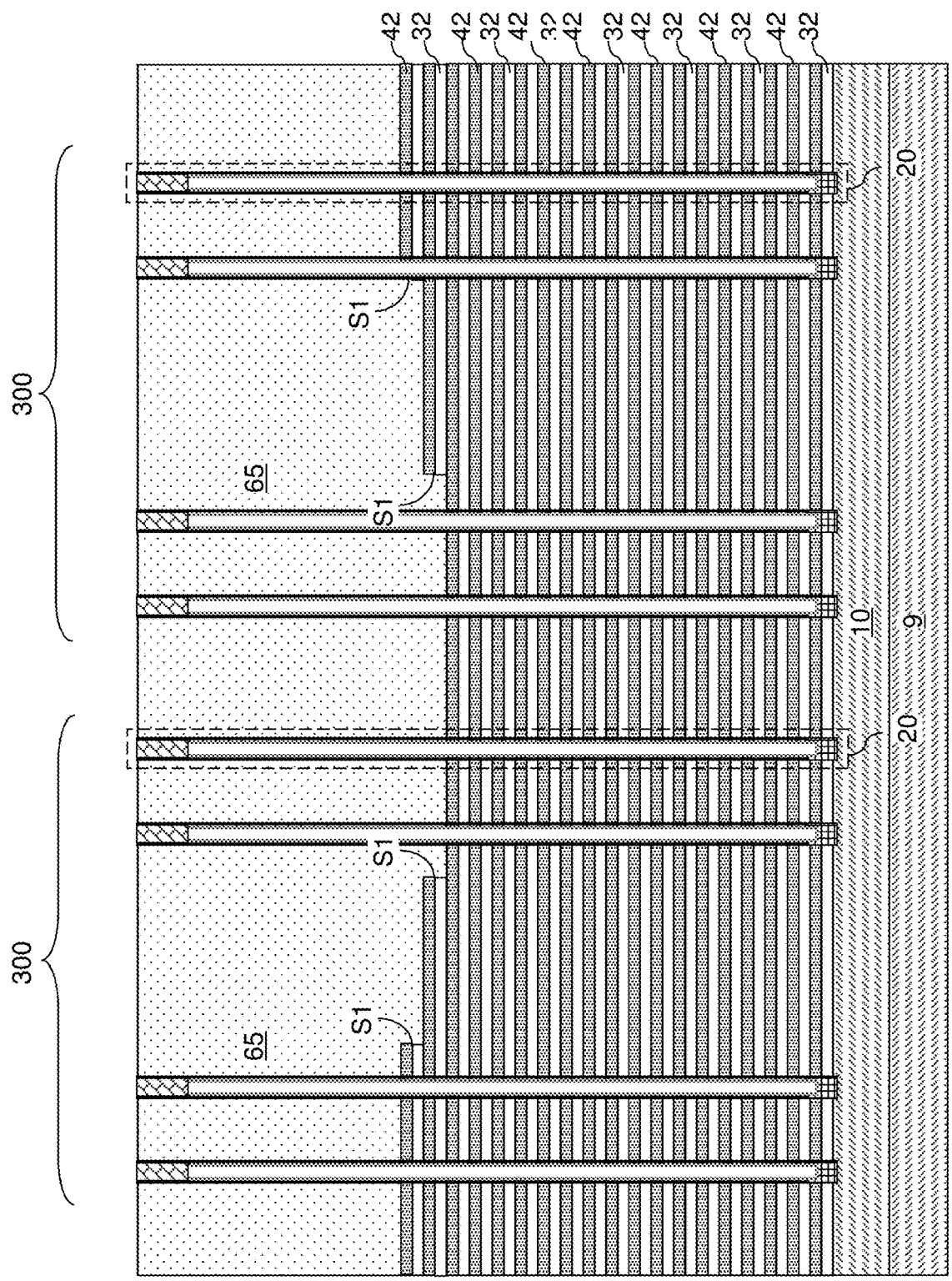

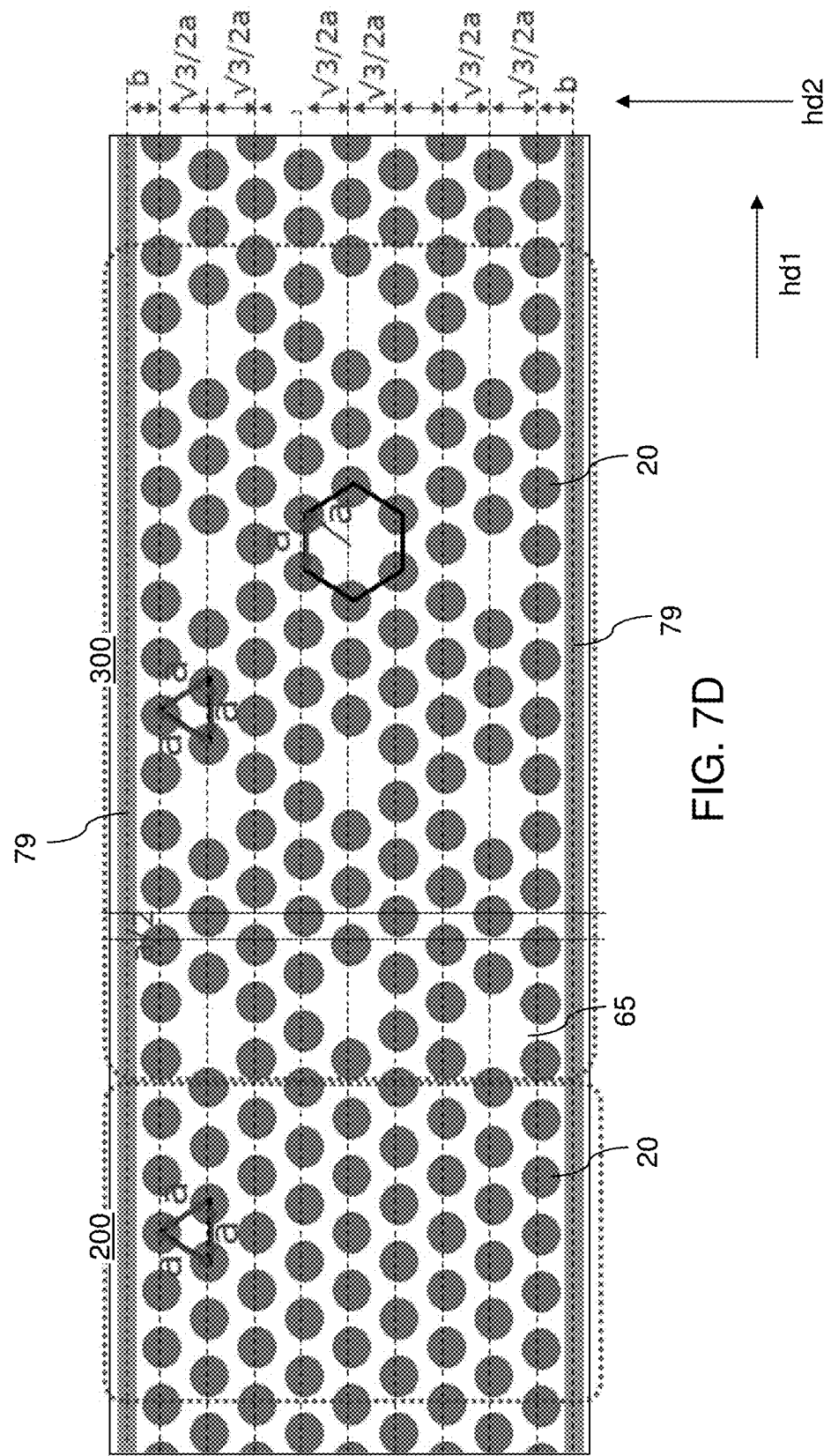

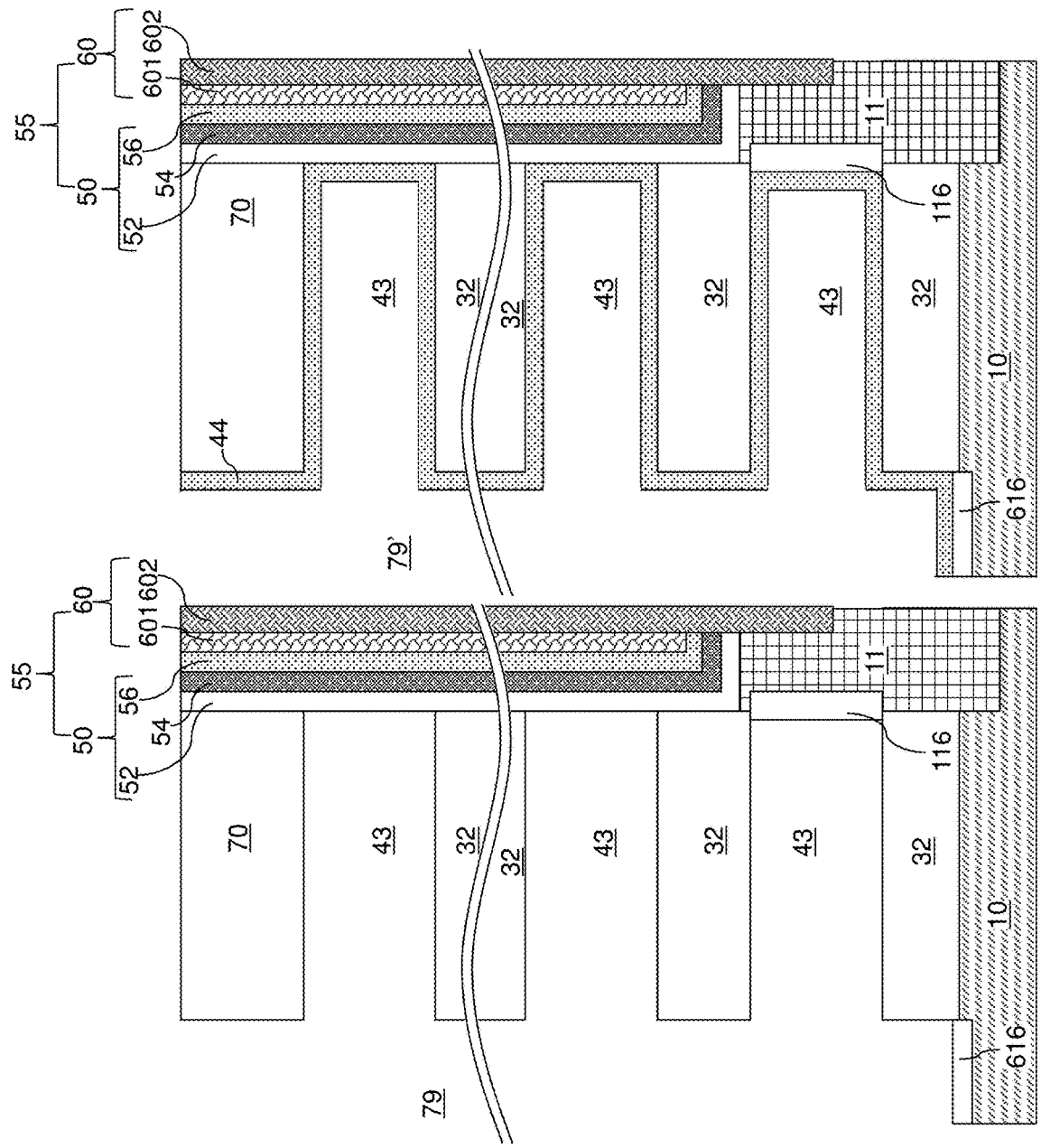

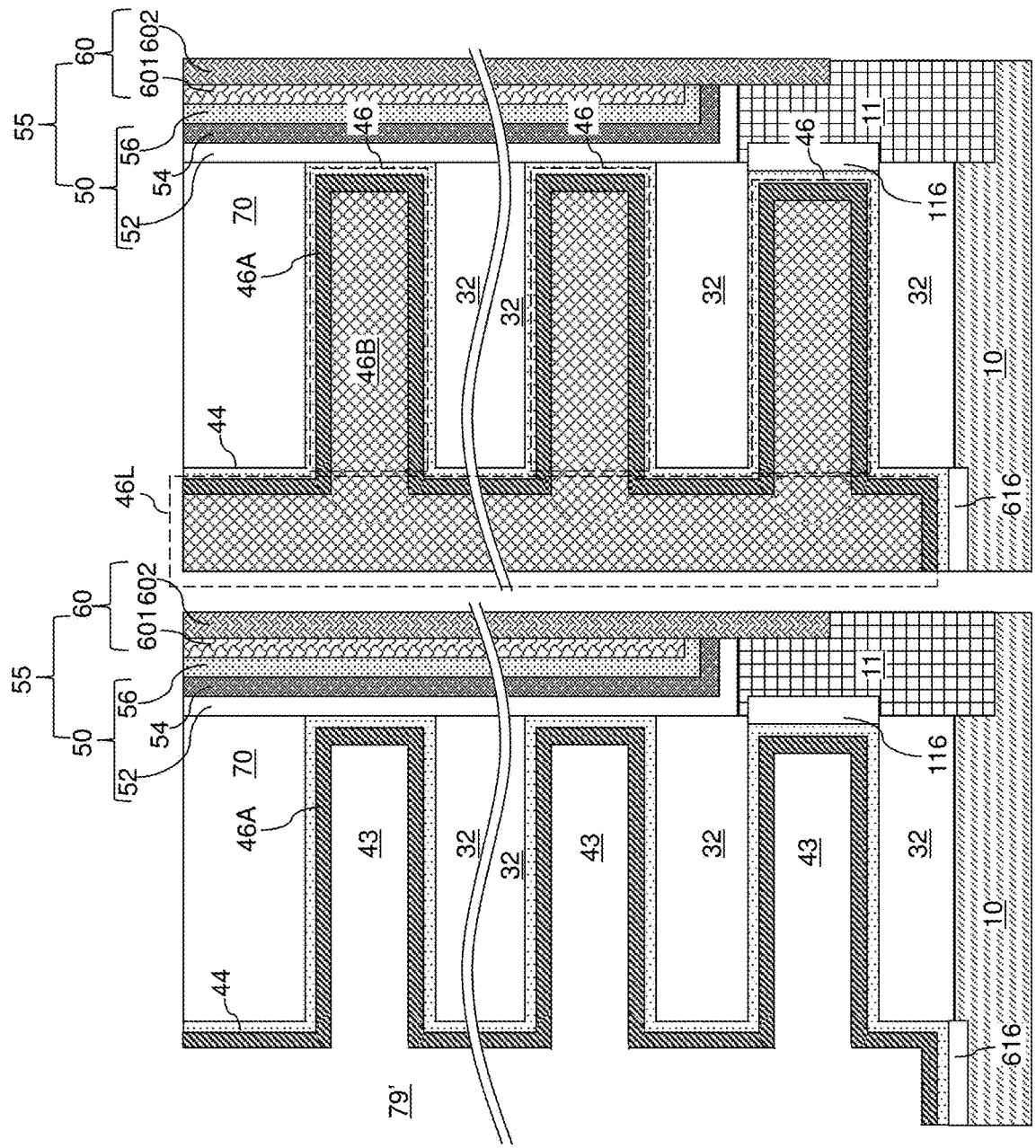

THREE-DIMENSIONAL MEMORY DEVICE CONTAINING A POLYGONAL LATTICE OF SUPPORT PILLAR STRUCTURES AND CONTACT VIA STRUCTURES AND METHODS OF MANUFACTURING THE SAME

FIELD

The present disclosure relates generally to the field of semiconductor devices, and particular to a three-dimensional memory device containing a polygonal lattice of support pillar structures and contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; memory stack structures extending through a memory array region of the alternating stack of insulating layers and electrically conductive layers; a combination of support pillar structures and contact via structures located in a staircase region of the alternating stack of insulating layers and electrically conductive layers that includes stepped surfaces of the alternating stack that include contains surfaces that are adjoined by vertical steps, wherein: the contact via structures contact a respective one of the electrically conductive layers; and geometrical centers of the support pillar structures are arranged at vertices of a polygon having more than four vertices having a respective contact via structure located at a geometric center of the polygon in a plan view.

According to another embodiment of the present disclosure, a method of forming a three-dimensional memory device is provided, which comprises: forming a vertically alternating sequence of insulating layers and sacrificial material layers over a substrate; forming stepped surfaces on the vertically alternating sequence of insulating layers and sacrificial material layers by patterning the insulating layers and the sacrificial material layers in a staircase region, wherein the stepped surfaces comprise horizontal surfaces adjoined by vertical steps; forming memory stack structures extending through the alternating stack is formed in a memory array region; forming support pillar structures through the vertically alternating sequence within the staircase region; forming an alternating stack of insulating layers and electrically conductive layers by patterning the vertically alternating sequence and replacing remaining portions of the sacrificial material layers with electrically conductive layers; and forming contact via structures on a respective one of the electrically conductive layers, wherein geometrical centers of the support pillar structures and contact via structures are arranged in a hexagonal periodic array in a plan view.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 6C is a schematic vertical cross-sectional view along the vertical plane C-C' of FIG. 6B.

FIG. 7D is a magnified horizontal cross-sectional view of a staircase region and a peripheral region of the exemplary structure of at the level of the horizontal cross-sectional plane B-B' of FIG. 7B.

FIGS. 9A-9D are sequential vertical cross-sectional views of a region of the exemplary structure during formation of electrically conductive layers according to an embodiment of the present disclosure.

DETAILED DESCRIPTION

Figure 1:
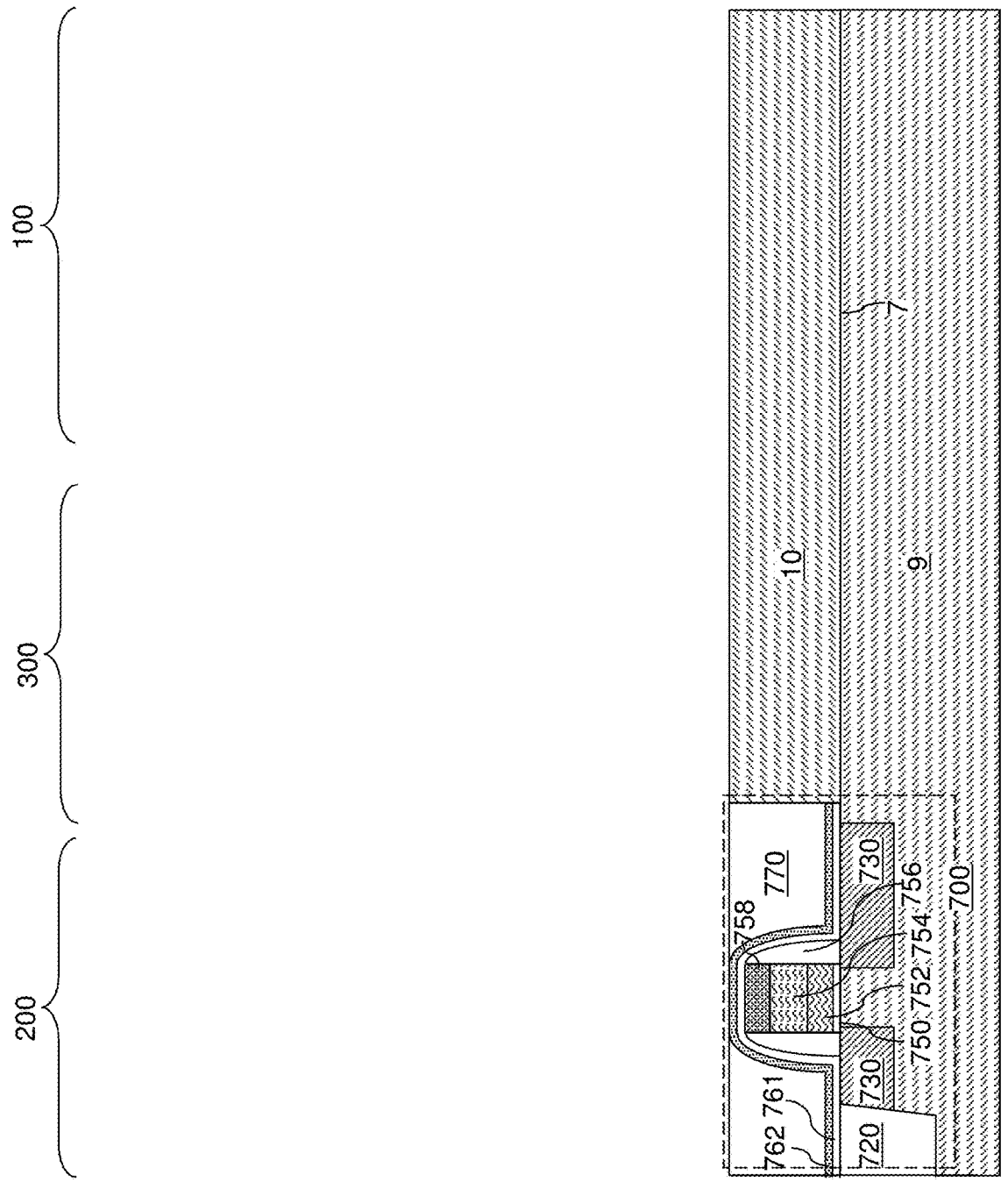
FIG. 1 is a schematic vertical cross-sectional view of an exemplary structure after formation of at least one support device and a semiconductor material layer according to an embodiment of the present disclosure.

As discussed above, the present disclosure is directed to a three-dimensional memory device using a hexagonal lattice of support pillar structures and contact via structures and methods of manufacturing the same, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings. In conventional configurations, cylindrical support pillars may have been replaced with elliptical pillar structures to prevent deflection and deformation. However, such conventional configurations may create additional rate and shape variation problems due to the variation in support pillar structure size and shape variations. The various embodiments disclosed herein provide for consistent size and shape of support pillar structures as well as contact via structures. By forming the support pillar structures and contact via structures in a consistent size and shape, the accuracy of the structures may be improved as the pitch between structures is consistent. In addition, the layout of structures is simplified. The various embodiments disclosed herein form the support pillar structures and contact via structures in a polygonal lattice configuration, which provides a strength to prevent deflection and deformation and further allows for an improved density of structures to be contained within the memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which may be used, for example, to fabricate a device structure containing vertical NAND memory devices. The exemplary structure may include a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include at least one support device for a three-dimensional memory array to be subsequently formed. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device 700 for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral region 200. The region in which a memory array is subsequently formed is herein referred to as a memory array region 100. A staircase region 300 for subsequently forming stepped terraces of electrically conductive layers may be provided between the memory array region 100 and the peripheral region 200.

Figure 2:
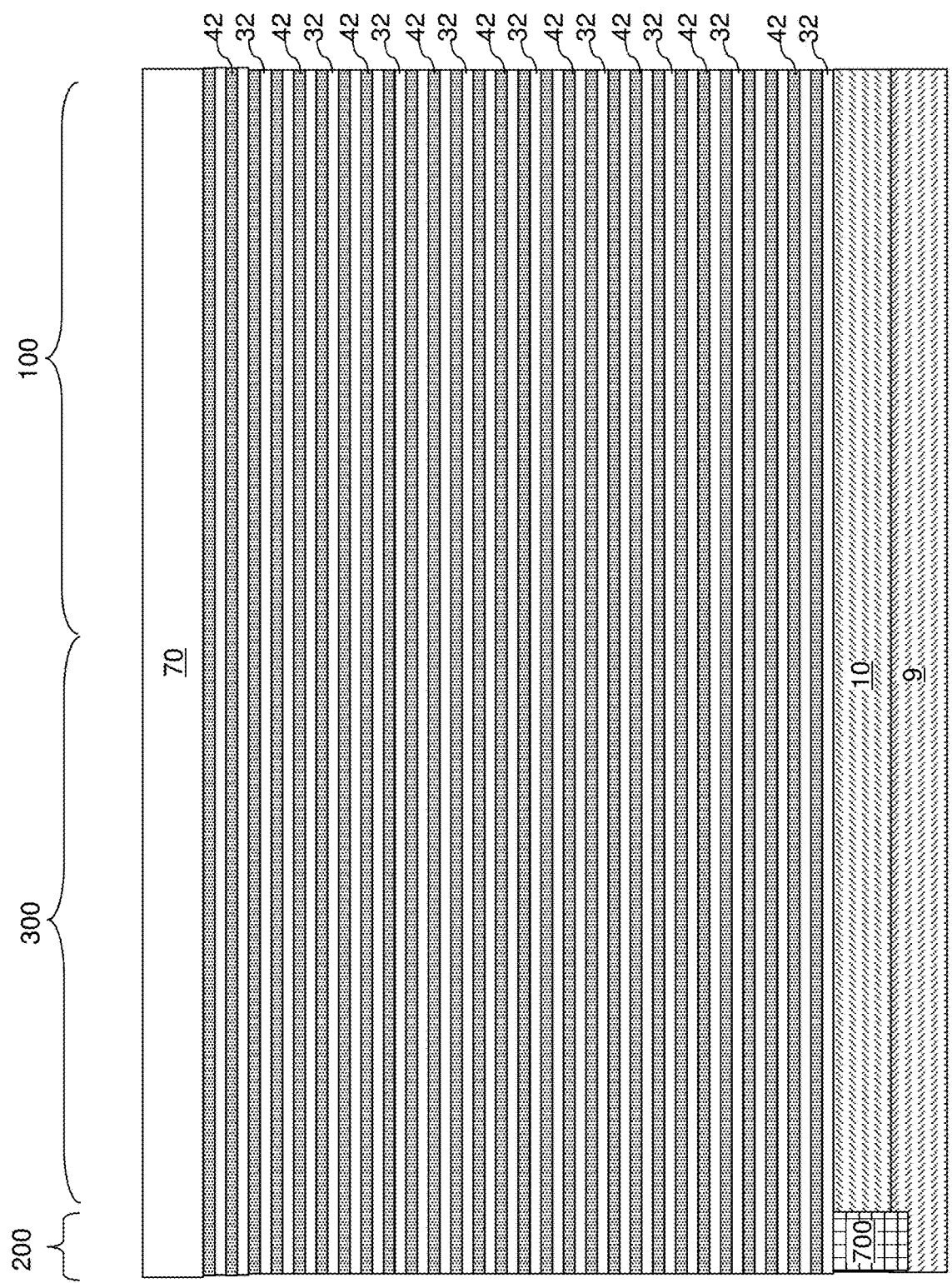
FIG. 2 is a schematic vertical cross-sectional view of the exemplary structure after formation of a vertically alternating sequence of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as a vertically alternating sequence (32, 42). In one embodiment, the vertically alternating sequence (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 may be a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers 42 may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the vertically alternating sequence (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the vertically alternating sequence (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3A:
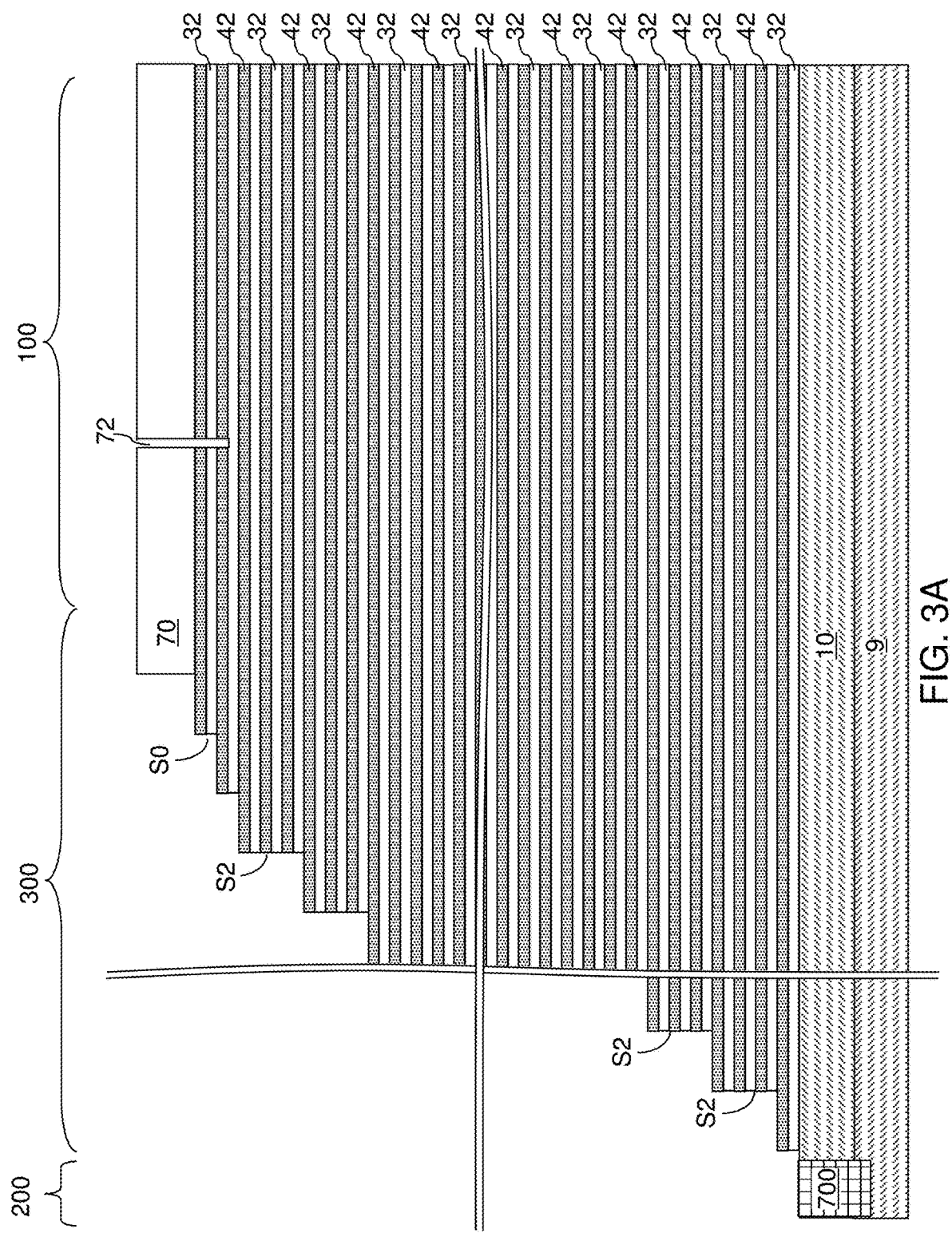
FIG. 3A is a schematic vertical cross-sectional view of the exemplary structure after formation of stepped surfaces by patterning the vertically alternating sequence according to an embodiment of the present disclosure.
Figure 3B:
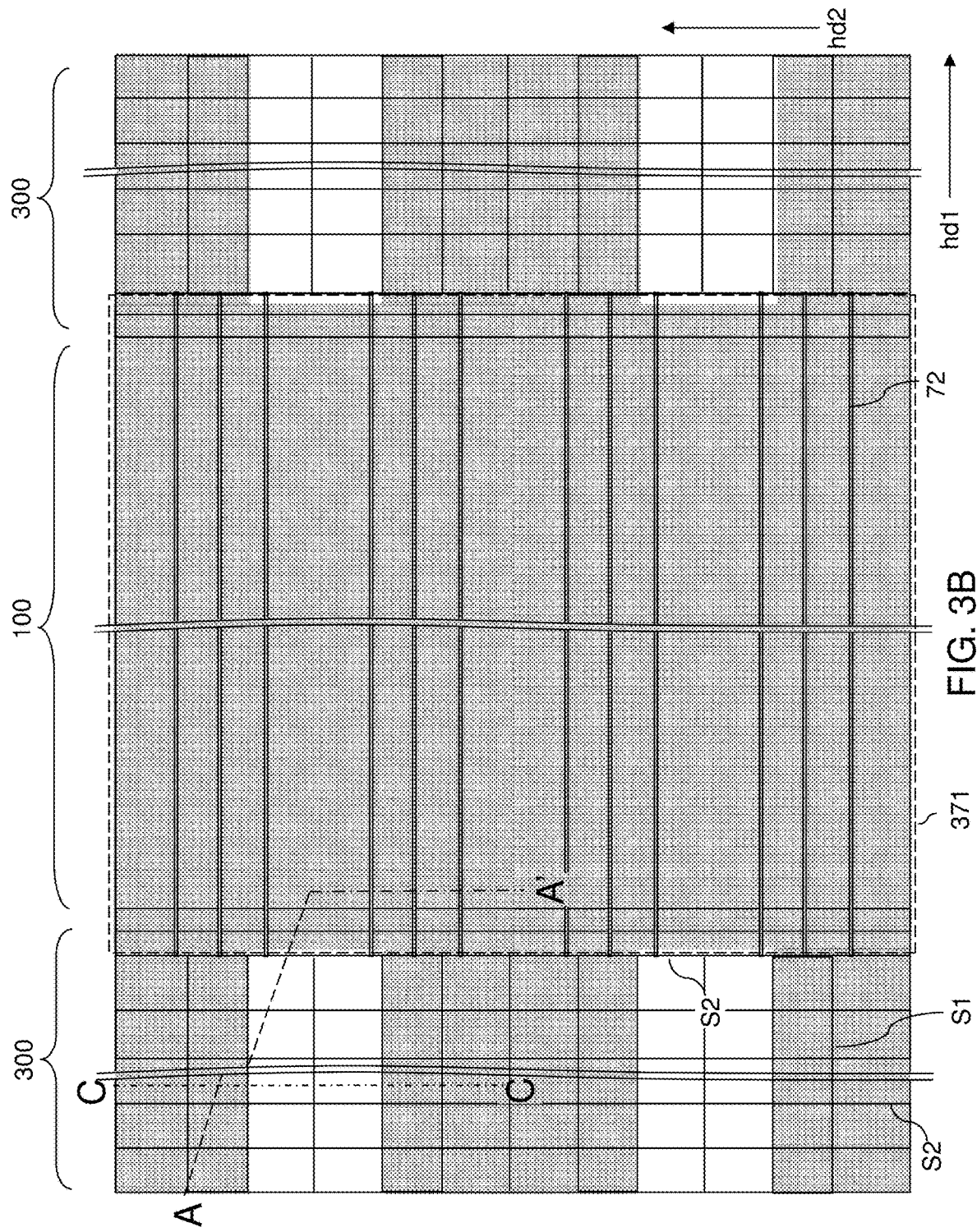
FIG. 3B is a schematic top-down view of the exemplary structure of FIG. 3A. The zig-zag vertical plane A-A' is the plane of the vertical cross-section of FIG. 3A.
Figure 3C:
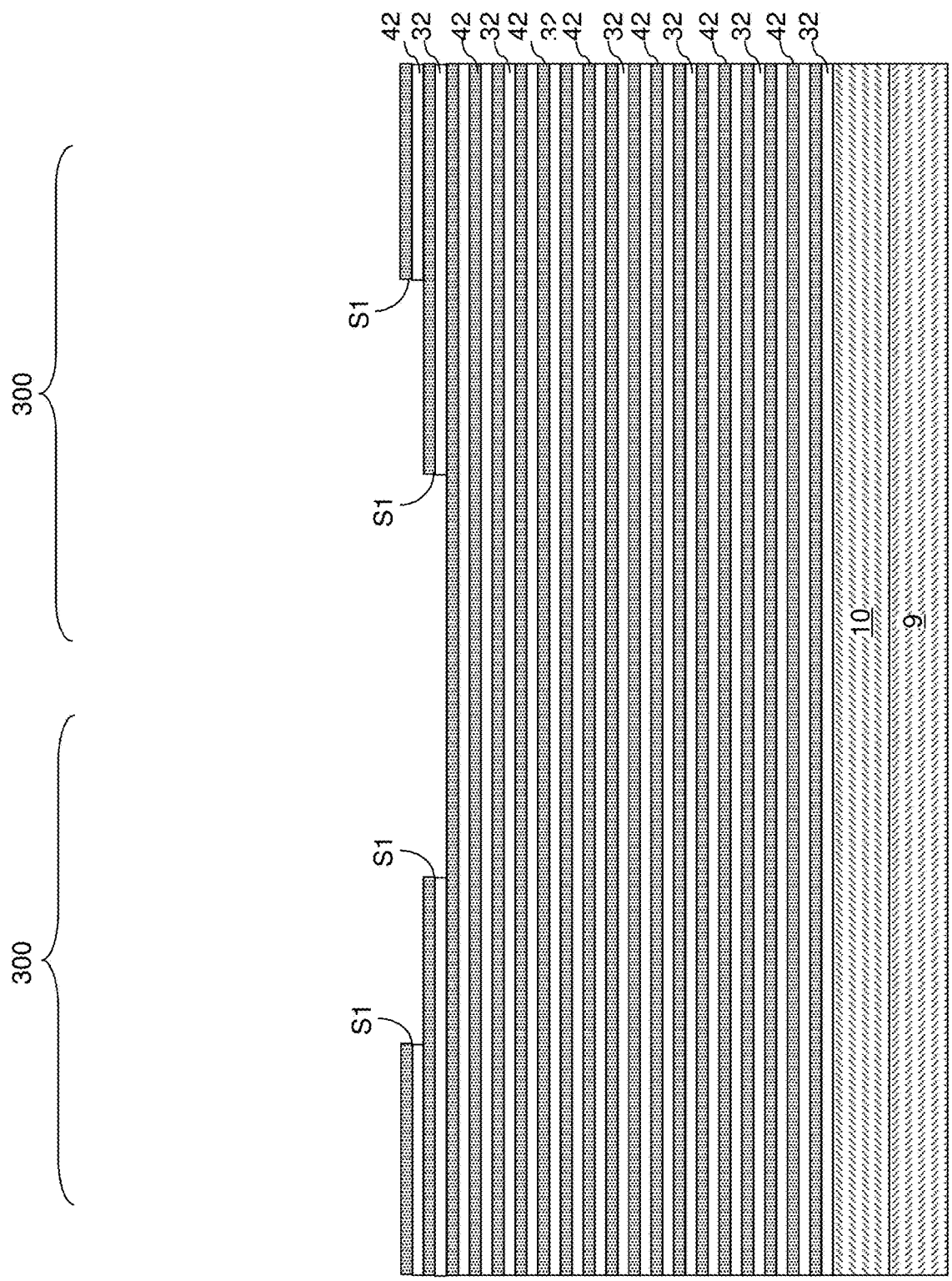
FIG. 3C is a schematic vertical cross-sectional view along the vertical plane C-C' of FIG. 3B.

Referring to FIGS. 3A-3C, processing steps for patterning peripheral regions of the vertically alternating sequence (32, 42) may be performed to form stepped surfaces. For example, a hard mask layer may be formed above the insulating cap layer 70, and may be patterned to cover the areas in which formation of stepped surfaces is to be avoided. The area of the hard mask layer is illustrated by element 371 in FIG. 3B. The hard mask layer may include an etch mask that is formed from materials different from the materials of the alternating stack (32, 42) and the insulating cap layer 70. For example, the hard mask layer may include polysilicon. The area covered by the hard mask layer include the entire area of the memory array region 100 and areas of the staircase region 300 in which drain contact via structures are to be subsequently formed. An anisotropic etch process may be performed to etch the portions of the insulating cap layer 70 that are not covered by the hard mask layer.

A first trimmable mask layer (of which the initial area is illustrated by a lightly shaded region in FIG. 3B) including a trimmable material may be applied over the exemplary structure, and may be lithographically patterned to form rectangular openings with straight edges that extend along the first horizontal direction hd1. An anisotropic etch process may be performed to etch through a pair of a sacrificial material layer 42 and an insulating layer, thereby forming first vertical steps S1 underneath edges of the first trimmable mask layer that laterally extend along the first horizontal direction hd1 and forming second vertical steps S2 that underlie edges of the hard mask layer located within openings in the first trimmable mask layer. The first trimmable mask layer may be isotropically trimmed, for example, by ashing so that the area covered by the first trimmable mask layer shrinks isotropically from the lightly shaded area illustrated in FIG. 3B. The duration of the trimming process may be selected such that the edges of the first trimmable mask layer shifts to a location at which a next set of first vertical steps S1 is to be formed. An anisotropic etch process may be performed to etch through a pair of a sacrificial material layer 42 and an insulating layer 32 with areas that are not covered by any of the hard mask layer and the first trimmable mask layer. Preexisting first vertical steps S1 and preexisting second vertical steps S2 may be transferred downward by the thickness of a pair of a sacrificial material layer 42 and an insulating layer 32, new first vertical steps S1 may be formed underneath edges of the first trimmable mask layer, and new second vertical steps S2 may be formed underneath segments of the hard mask layer that is newly physically exposed during previous trimming of the first trimmable mask layer. The combination of a trimming process and an anisotropic etch process may be repeated until multiple columns of staircase strips are formed. Each staircase strip may have an area defined by a neighboring pair of first vertical steps S1 and a respective second vertical step S2. The first trimmable mask layer may be subsequently removed. An anisotropic etch process may be performed once to vertically recess the physically exposed portions of the vertically alternating sequence by the thickness of a pair of a sacrificial material layer and an insulating layer 32. The hard mask layer may be subsequently removed.

A second trimmable mask layer (not shown) may be formed to cover the entire area of the memory array region 100 and proximal portions of the staircase regions 300 such that straight edges of the second trimmable mask layer that extend along the second horizontal direction hd2 are formed at locations at which most distal second vertical steps S2 are to be subsequently formed. An anisotropic etch process may be performed to etch through multiple pairs of sacrificial material layers 42 and insulating layers 32. The number of pairs of sacrificial material layers 42 and insulating layers 32 that are etched through during the anisotropic etch process may be the same as the total number of different heights of the physically exposed planar surfaces of the vertically alternating sequence (32, 42) formed using the first trimmable mask layer. For example, if three different heights are provided for the physically exposed planar surfaces of the vertically alternating sequence (32, 42) in each staircase region 300, three pairs of sacrificial material layers 42 and insulating layers 32 may be etched through during the anisotropic etch process.

The second trimmable mask layer may be trimmed such that the edges of the second trimmable mask layer are formed at locations at which next second vertical steps S2 are to be formed. An anisotropic etch process may be performed to etch through multiple pairs of sacrificial material layers 42 and insulating layers 32. The number of pairs of sacrificial material layers 42 and insulating layers 32 that are etched through during the anisotropic etch process may be the same as the total number of different heights of the physically exposed planar surfaces of the vertically alternating sequence (32, 42) provided by the patterning step of FIGS. 3A-3C.

A combination of a trimming process for the second trimmable mask layer and an anisotropic etch process may be repeated until all second vertical steps S2 are formed which are more distal from the memory array region 100 than the first distal steps S2 formed using the first trimmable mask layer. Multiple columns of staircase strips may be formed in each of the staircase regions 300. Each column of staircase strips may be located between a neighboring pair of first vertical steps S1 that are perpendicular to the second horizontal direction hd2, and includes multiple second vertical steps S2 that are perpendicular to the first horizontal direction hd1.

Optionally, the second trimmable mask layer may be further trimmed so that straight edges of the second trimmable mask layer extending along the second horizontal direction hd2 are located between the memory array region 100 and the locations at which the second vertical steps S2 are formed using the first trimmable mask layer. An anisotropic etch process may be performed to etch unmasked portions of the vertically alternating sequence (32, 42) by the thickness of a pair of a sacrificial material layer 42 and an insulating layer 32. Drain-select-level steps S0 that extend along the second horizontal direction hd2 may be formed. As used herein, a drain-select-level step refers to a step that is formed at a drain select level, i.e., at a level at which a drain select gate electrode is to be subsequently formed. Optionally, a combination of trimming step and an anisotropic etch step may be repeated to form additional drain-select-level steps S0. Each time an anisotropic etch process is performed, preexisting second vertical steps S2 and preexisting first vertical steps S1 shift downward by the thickness of a pair of a sacrificial material layer 42 and an insulating layer 32. The second trimmable mask layer may be removed, for example, by ashing after formation of the most proximal one of the drain-select-level steps S0. As used herein, the proximity or the distality of the second vertical steps S2 and the drain-select-level steps S0 may be measured from the memory array region 100.

A stepped cavity may be formed within the volume from which portions of the vertically alternating sequence (32, 42) are removed through formation of the stepped surfaces.

A "stepped cavity" refers to a cavity having stepped surfaces. The stepped cavity may have various stepped surfaces such that the horizontal cross-sectional shape of the stepped cavity changes in steps as a function of the vertical distance from the top surface of the substrate (9, 10). Generally, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the vertically alternating sequence (32, 42) may laterally extend farther than any overlying sacrificial material layer 42 within the vertically alternating sequence (32, 42) in the staircase regions 300. The staircase regions 300 may include stepped surfaces of the vertically alternating sequence (32, 42) that continuously extend from a bottommost layer within the vertically alternating sequence (32, 42) to a topmost layer within the vertically alternating sequence (32, 42).

Each vertical step of the stepped surfaces may have the height of one or more pairs of an insulating layer 32 and a sacrificial material layer 42. In one embodiment, multiple columns of staircase strips may be formed along the first horizontal direction hd1 such that at least some vertical steps have the height of a plurality (such as three as illustrated) of pairs of an insulating layer 32 and a sacrificial material layer 42, and the number of columns may be at least the number (such as three as illustrated) of the plurality of pairs. Each column of staircase may be vertically offset from one another such that each of the sacrificial material layers 42 has a physically exposed top surface in a respective column of staircases. Configurations using four, eight, ten, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the second vertical steps S2 within each column of staircases may perpendicular to the first horizontal direction hd1, and the columns of staircases may be arranged along the second horizontal direction hd2 that is perpendicular to the first horizontal direction hd1. In one embodiment, the first horizontal direction hd1 may be perpendicular to the boundary between the memory array region 100 and the staircase region 300.

Generally, stepped surfaces may be formed on the vertically alternating sequence (32, 42) by patterning the insulating layers 32 and the spacer material layers (such as the sacrificial material layers 42) in a staircase region 300. The stepped surfaces comprise horizontal surfaces adjoined by vertical steps. The stepped surfaces comprise first vertical steps S1 including first sidewalls of the insulating layers 32 that are parallel to the first horizontal direction hd1, and second vertical steps S2 including second sidewalls of the insulating layers 32 that are parallel to the second horizontal direction hd2. At least one of the second vertical steps S2 comprise sidewalls of multiple insulating layers 32 selected from the insulating layers 32 that are vertically coincident with each other and are perpendicular to the first horizontal direction hd1.

Referring to FIGS. 4A-4D, a retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity may constitute the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Drain-select-level isolation structures 72 may be formed through the insulating cap layer 70 and a subset of the sacrificial material layers 42 located at drain select levels. The drain-select-level isolation structures 72 may be formed, for example, by forming drain-select-level isolation trenches and filling the drain-select-level isolation trenches with a dielectric material such as silicon oxide. Excess portions of the dielectric material may be removed from above the top surface of the insulating cap layer 70. The drain-select-level isolation structures 72 may extend through a subset of the sacrificial material layers 42 of the vertically alternating sequence (32, 42) that is subsequently replaced with electrically conductive layers. The drain-select-level isolation structures 72 laterally extends along the first horizontal direction hd1 with a respective uniform width, and are laterally spaced apart from one another along the second horizontal direction hd2. The drain-select-level isolation structures 72 may be formed as clusters with gaps that extend along the first horizontal direction hd1.

A lithographic material stack (not shown) including at least a photoresist layer may be formed over the insulating cap layer 70 and the retro-stepped dielectric material portion 65, and may be lithographically patterned to form openings therein. The openings may include a first set of openings formed over the memory array region 100 and a second set of openings formed over the staircase region 300. The pattern in the lithographic material stack may be transferred through the insulating cap layer 70 or the retro-stepped dielectric material portion 65, and through the vertically alternating sequence (32, 42) by at least one anisotropic etch that uses the patterned lithographic material stack as an etch mask. Portions of the vertically alternating sequence (32, 42) underlying the openings in the patterned lithographic material stack may be etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 may be formed through the insulating cap layer 70 and the entirety of the vertically alternating sequence (32, 42) in the memory array region 100. The support openings 19 may be formed through the retro-stepped dielectric material portion 65 and the portion of the vertically alternating sequence (32, 42) that underlie the stepped surfaces in the staircase region 300.

The memory openings 49 may extend through the entirety of the vertically alternating sequence (32, 42). The support openings 19 may extend through a subset of layers within the vertically alternating sequence (32, 42). The chemistry of the anisotropic etch process used to etch through the materials of the vertically alternating sequence (32, 42) may alternate to optimize etching of the first and second materials in the vertically alternating sequence (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the vertically alternating sequence (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

The memory openings 49 may be formed as clusters of memory openings 49 that are located between a respective neighboring pair of drain-select-level isolation structures 72 or between a drain-select-level isolation structure 72 and a gap region that is free of memory openings 49 or drain-select-level isolation structures 72.

According to an embodiment of the present disclosure, geometrical centers of the support opening 19 may be positioned at lattice sites of a hexagonal lattice in a plan view. As used herein, a plan view refers to a view along a direction that is perpendicular to a Euclidean plane including a top surface of a substrate such as the substrate (9, 10) of the exemplary structure. A hexagonal lattice refers to a two-dimensional lattice formed by vertices of a packed array of regular hexagons and center points within the regular hexagons with, or without, compression or expansion along a direction parallel to a subset of edges of the regular hexagons. If a hexagonal lattice includes a two-dimensional lattice formed by vertices of a packed array of regular hexagons and center points within the regular hexagons without any compression or expansion, such a hexagonal lattice is referred to as a regular hexagonal lattice, and the corresponding two-dimensional array of vertices and center points is referred to as regular hexagonal array.

The support openings 19 occupy a predominant subset (i.e., more than 50%) of lattice sites of a hexagonal periodic array with isolated vacancies that are not occupied by the support openings 19. In one embodiment, at least two-thirds of all lattice sites of the hexagonal periodic array may be occupied by the support openings 19 while not more than one-third of the lattice sites of the hexagonal periodic array remain vacant (i.e., are not occupied by the support openings 19). In one embodiment, less than one-third of the lattice sites of the hexagonal periodic array remain vacant. In one embodiment, neighboring pairs of vacant sites (two of which are marked with a respective "x" in FIG. 4B) may be laterally spaced apart by a lateral separation distance lsd that is greater than a separation distance between a neighboring pair of lattice sites of the regular hexagonal lattice (i.e., a nearest vertex-to-vertex distance "a" illustrated in FIG. 4D). In one embodiment, a direction of an edge of the hexagonal lattice (i.e., an edge connecting a vertex of the hexagonal lattice to a nearest-neighbor vertex) in each staircase region 300 may be parallel to the first horizontal direction hd1 or parallel to the second horizontal direction hd2. In one embodiment, the direction of an edge of the hexagonal lattice in each staircase region 300 may be parallel to the first horizontal direction hd1. In case the hexagonal lattice is a regular hexagonal lattice, the center-to-center distance between neighboring rows of lattice sites may be $$\left(\frac{\sqrt{3}}{2}\right)$$

times the nearest vertex-to-vertex distance "a".

In one embodiment, the memory openings 49 may be arranged within the memory array region 100 as at least one two-dimensional hexagonal array in the plan view along the vertical direction. In one embodiment, a direction of an edge of the hexagonal lattice in the memory array region 100 may be parallel to the first horizontal direction hd1 or parallel to the second horizontal direction hd2. In one embodiment, the direction of an edge of the hexagonal lattice in the memory array region 100 may be parallel to the first horizontal direction hd1.

Figure 4A:
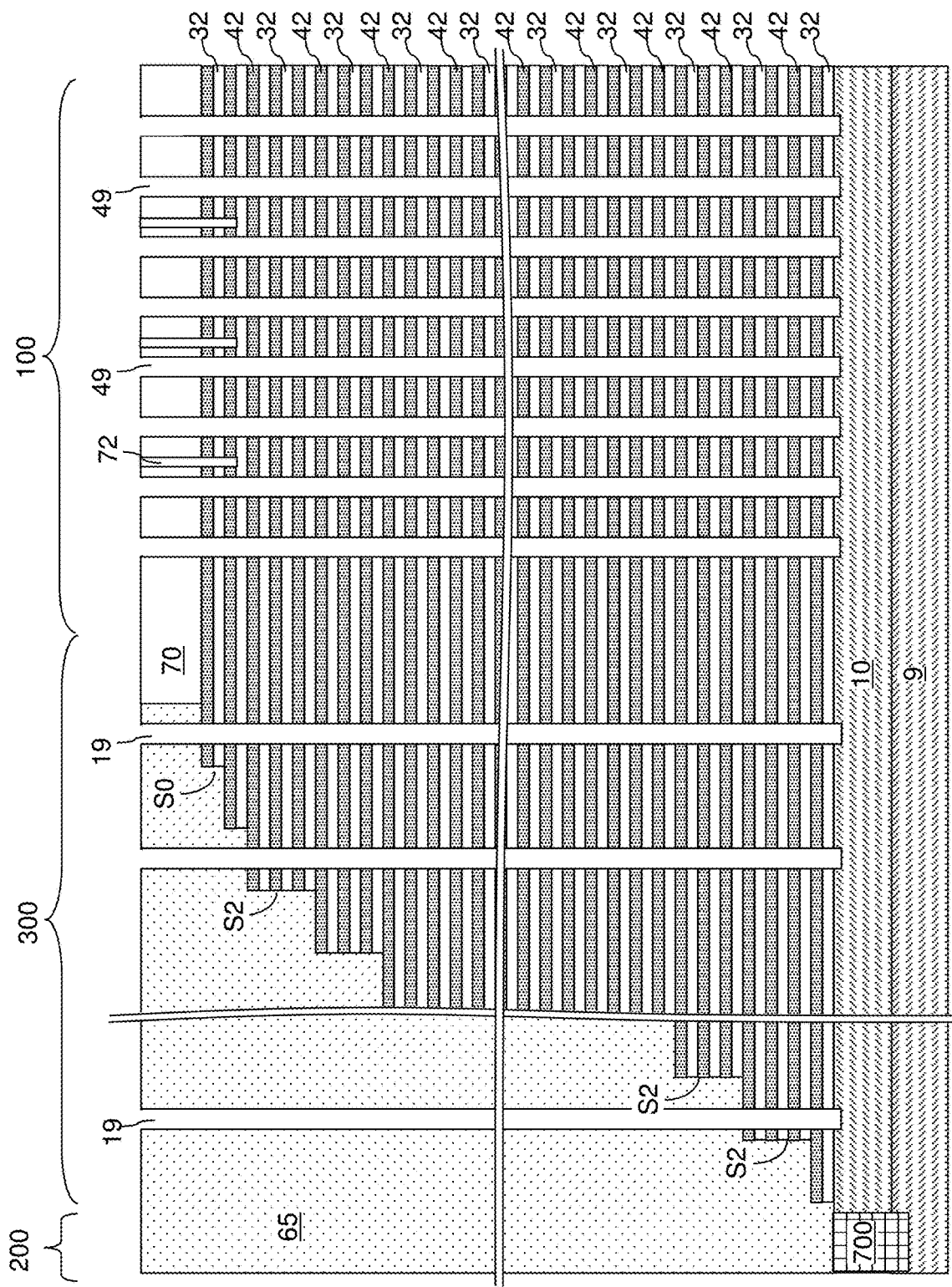
FIG. 4A is a schematic vertical cross-sectional view of the exemplary structure after formation of memory openings and support openings according to an embodiment of the present disclosure.
Figure 4B:
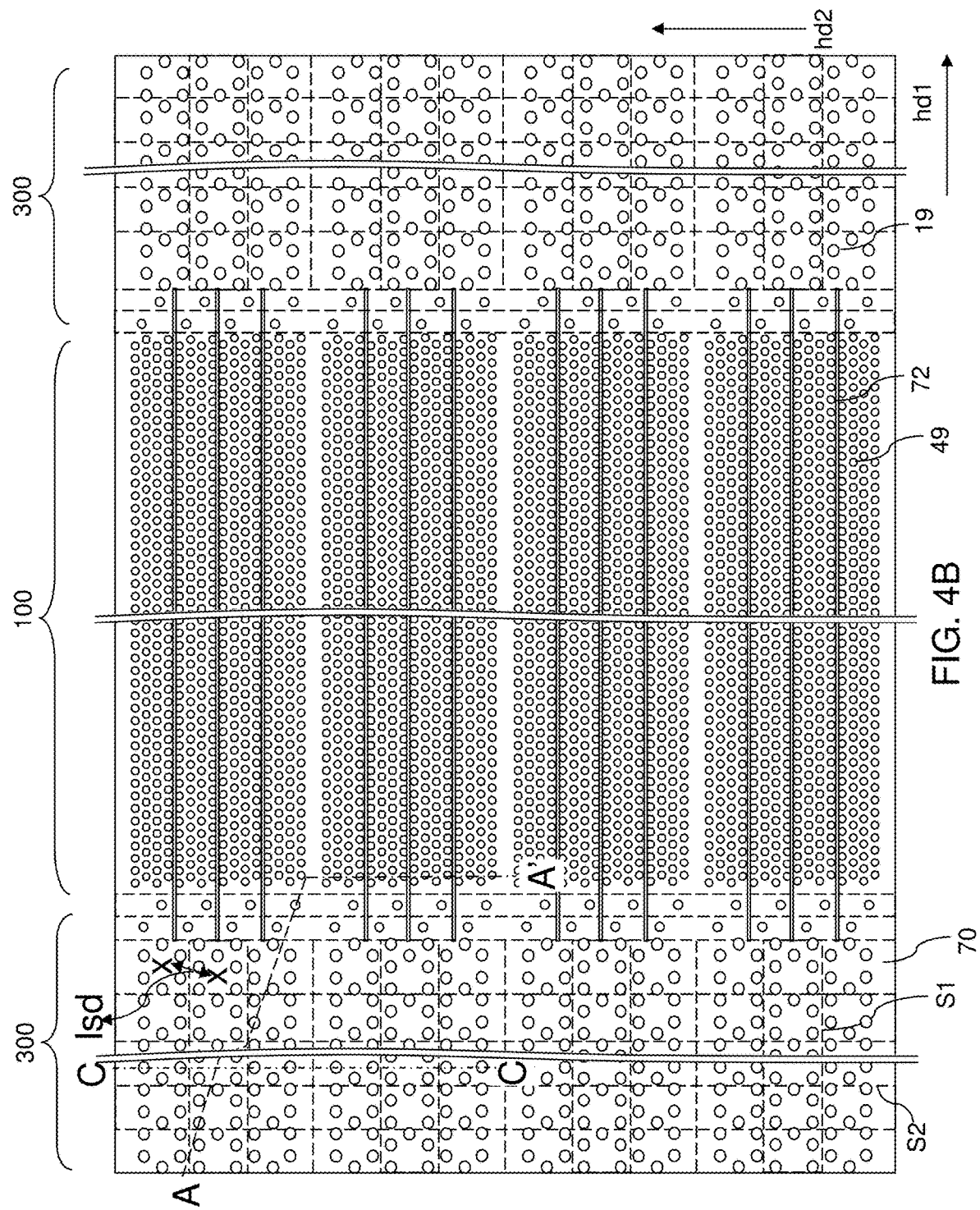
FIG. 4B is a schematic top-down view of the exemplary structure of FIG. 4A. The zig-zag vertical plane A-A' is the plane of the vertical cross-section of FIG. 4A.
Figure 4C:
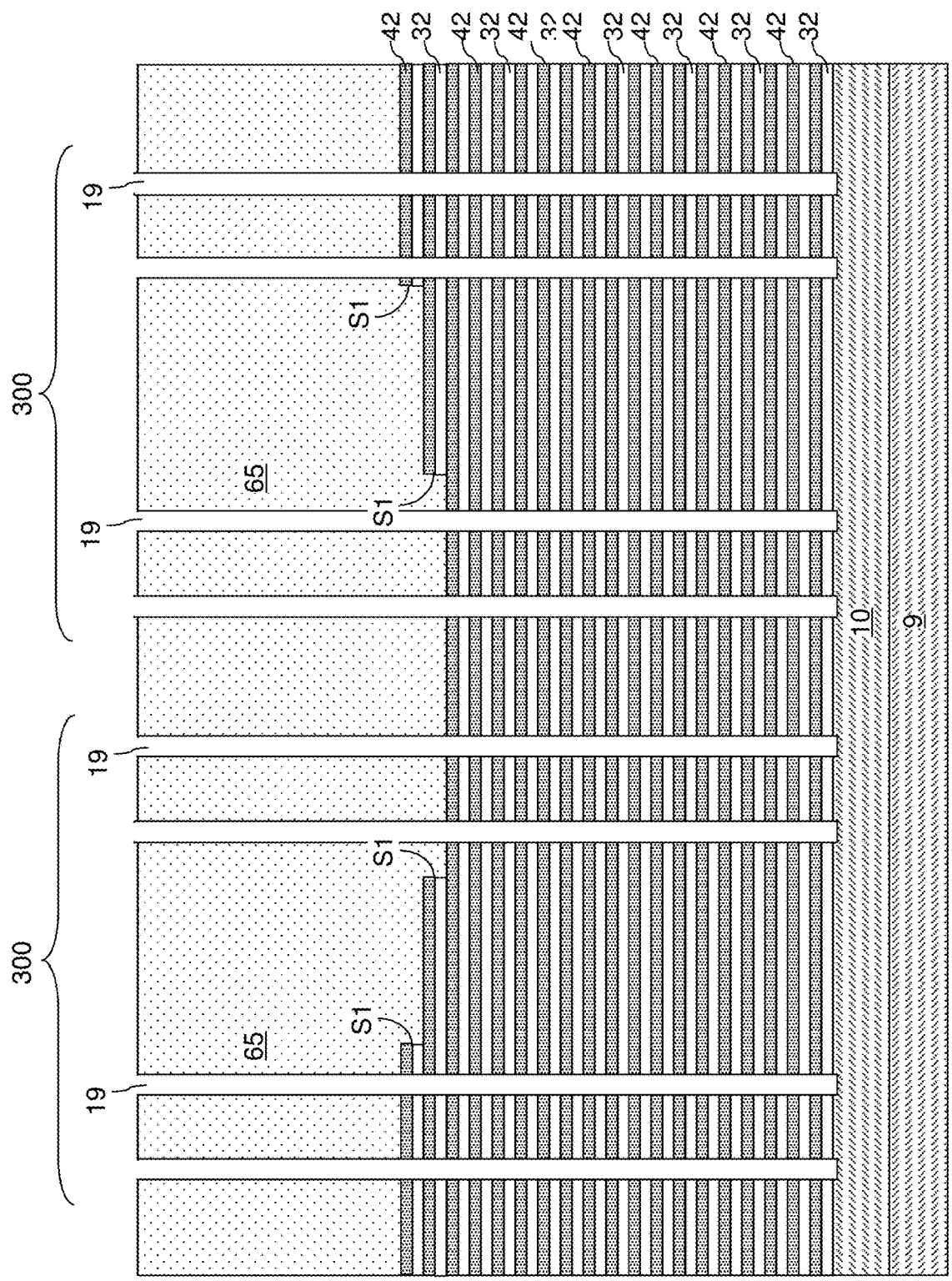
FIG. 4C is a schematic vertical cross-sectional view of the exemplary structure along the vertical plane C-C' of FIG. 4B.

FIGS. 5A-5H illustrate structural changes in a memory opening 49, which is one of the memory openings 49 in the exemplary structure of FIGS. 4A-4C. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 may extend through the insulating cap layer 70, the vertically alternating sequence (32, 42), and optionally into an upper portion of the semiconductor material layer 10. At this processing step, each support opening 19 may extend through the retro-stepped dielectric material portion 65, a subset of layers in the vertically alternating sequence (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 42 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' may be present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Figure 5C:
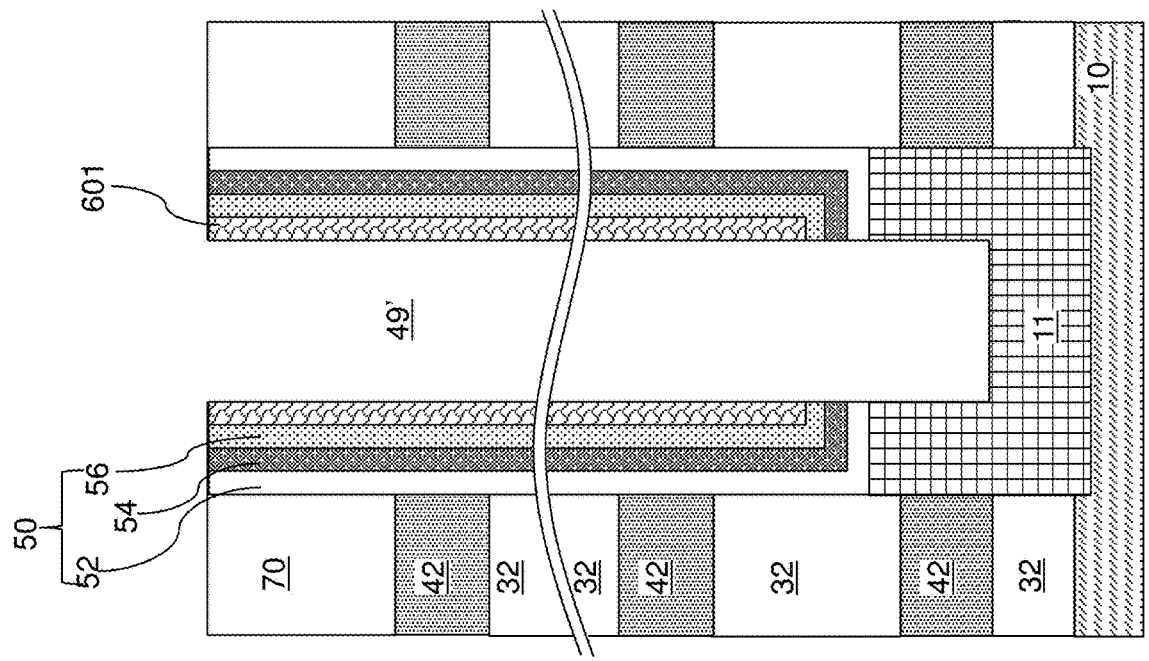

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Figure 5D:
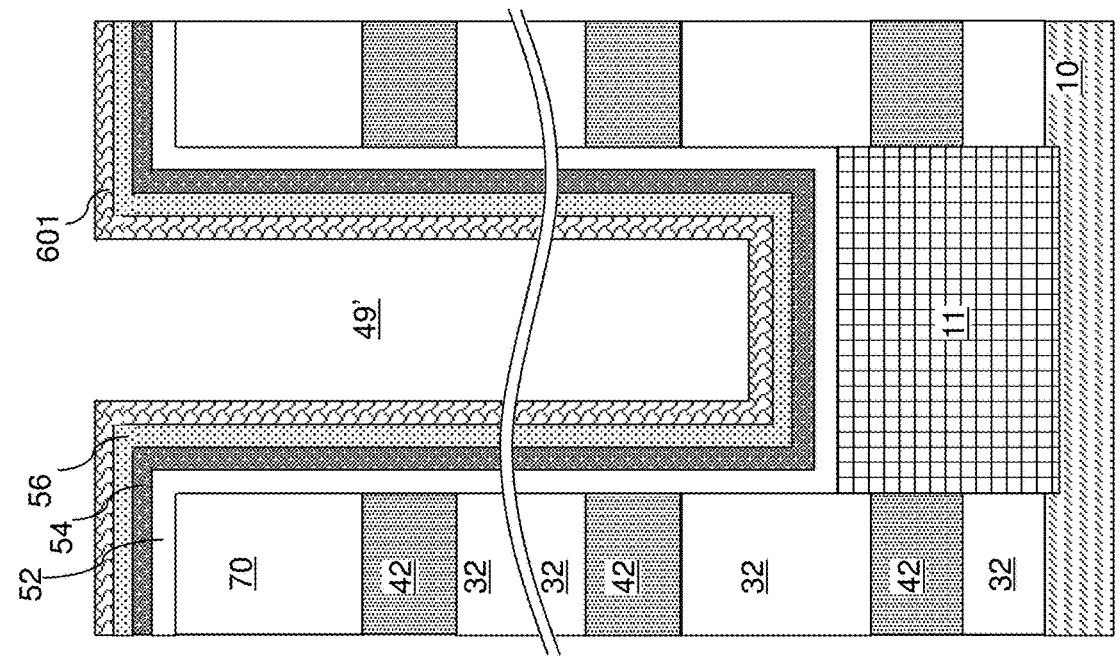

Referring to FIG. 5D, the optional first semiconductor channel layer 601, the tunneling dielectric layer 56, the charge storage layer 54, and the blocking dielectric layer 52 may be sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 may be located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 5E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 5G, the horizontal portion of the dielectric core layer 62L may be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may use a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a portion of the vertical semiconductor channel 60. Each adjoining set of a blocking dielectric layer 52, a charge storage layer 54, and a tunneling dielectric layer 56 may collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 may constitute a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and may constitute a support pillar structure 20.

Figure 6A:
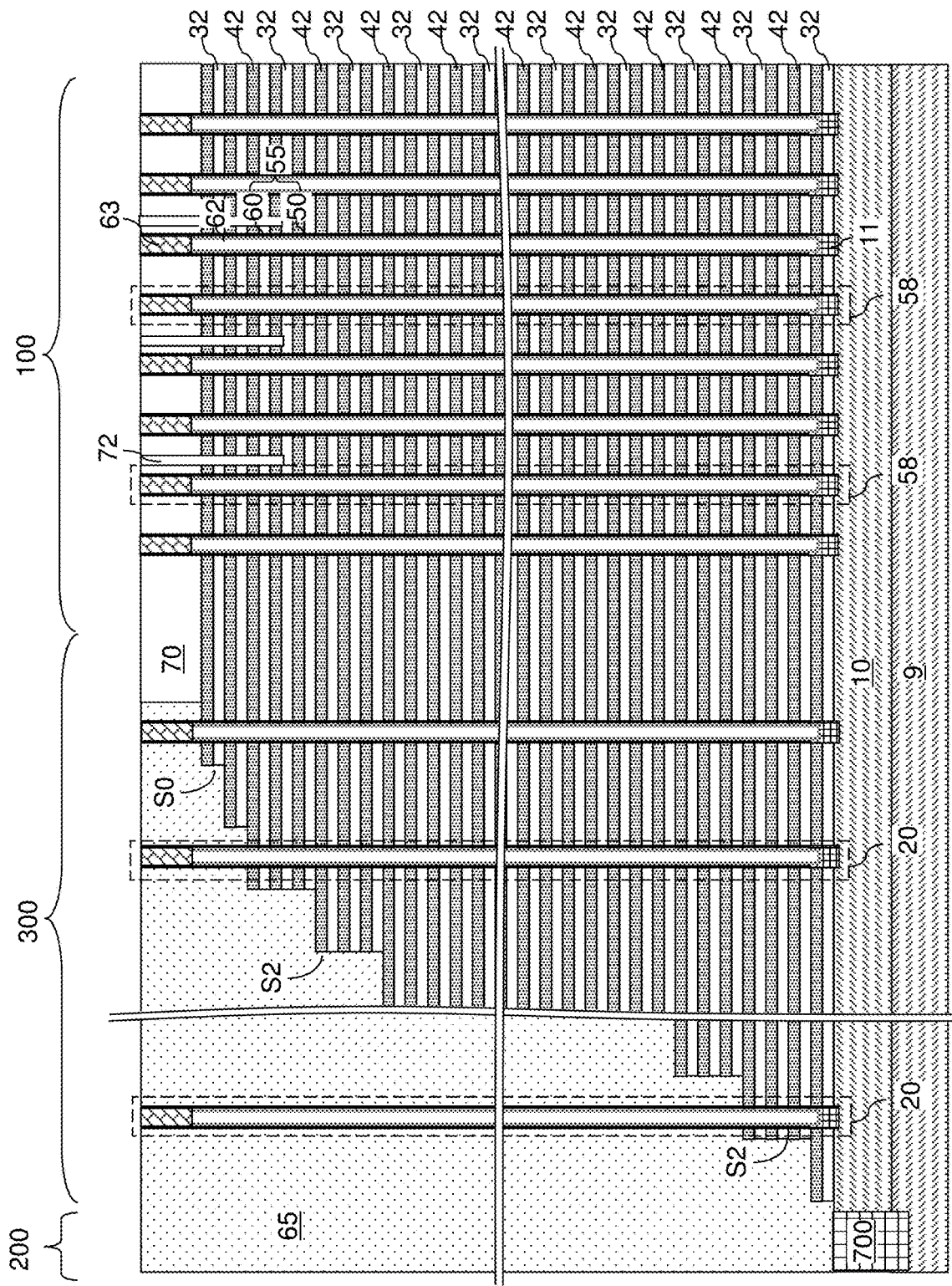
FIG. 6A is a schematic vertical cross-sectional view of the exemplary structure after formation of memory stack structures and support pillar structures according to an embodiment of the present disclosure.
Figure 6B:
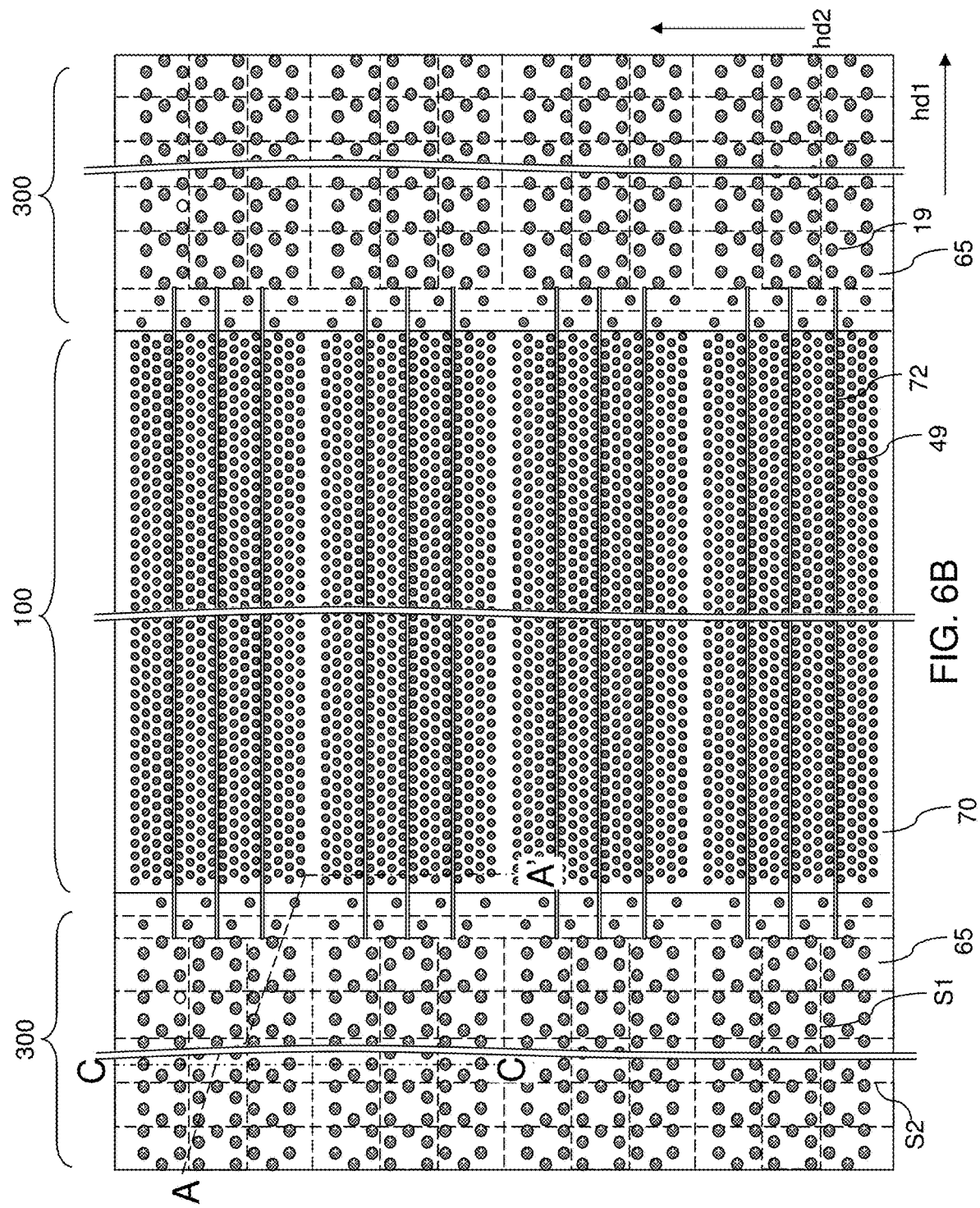
FIG. 6B is a schematic top-down view of the exemplary structure of FIG. 6A. The zig-zag vertical plane A-A' is the plane of the vertical cross-section of FIG. 6A.
Figure 7A:
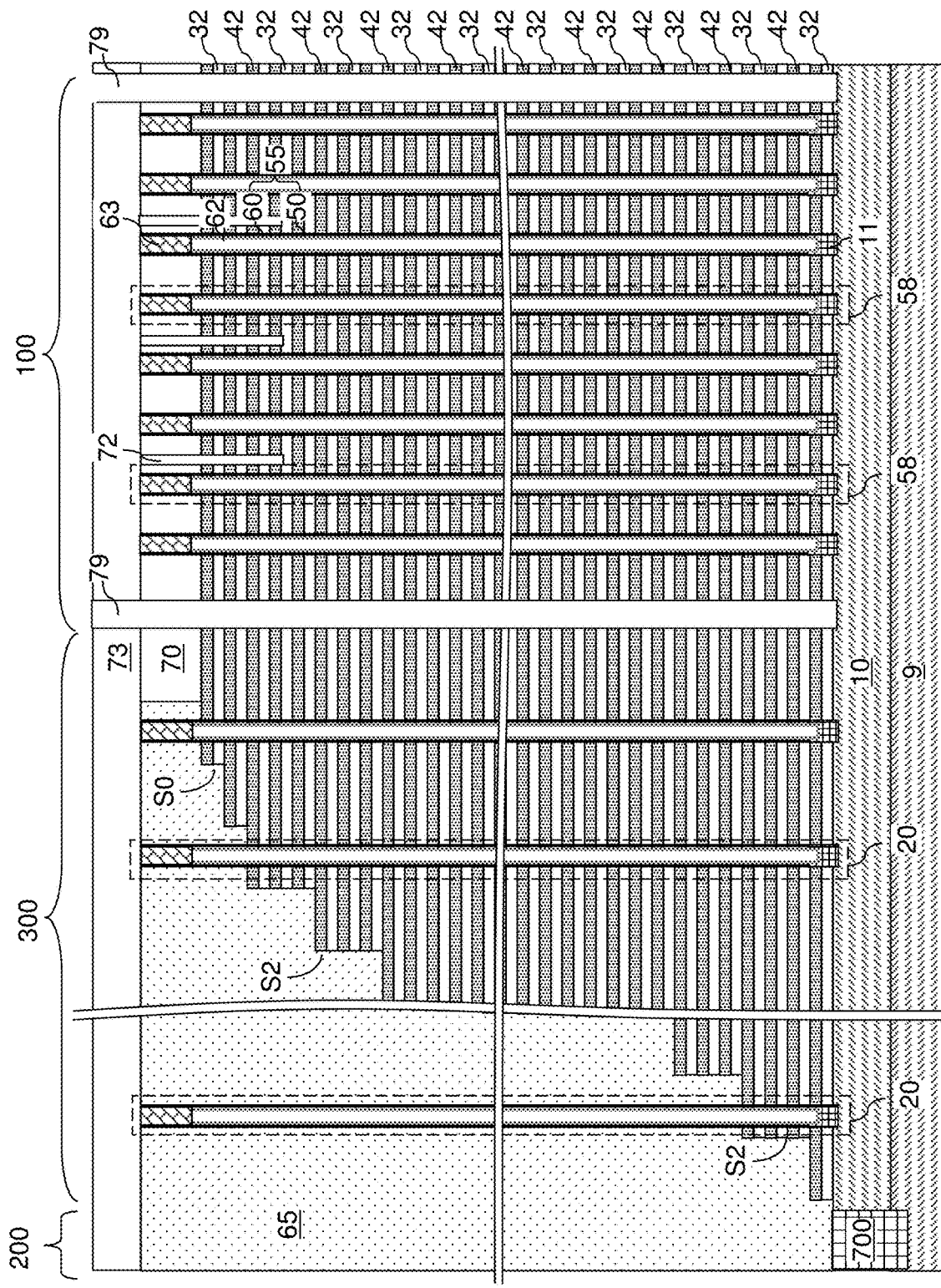
FIG. 7A is a schematic vertical cross-sectional view of the exemplary structure after formation of a contact level dielectric layer and trenches according to an embodiment of the present disclosure.
Figure 7B:
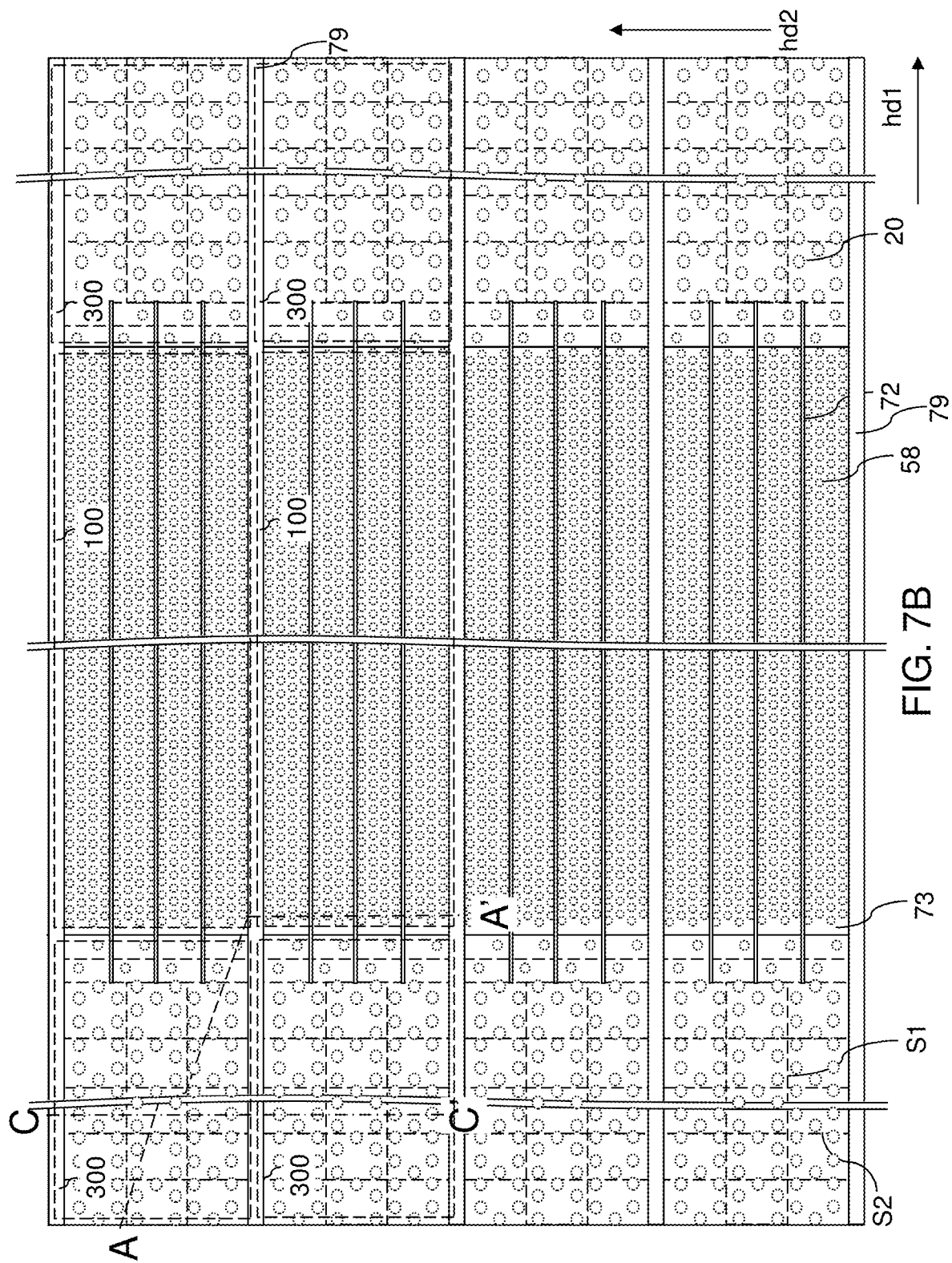
FIG. 7B is a schematic top-down view of the exemplary structure of FIG. 7A. The zig-zag vertical plane A-A' is the plane of the vertical cross-section of FIG. 7A.
Figure 7C:
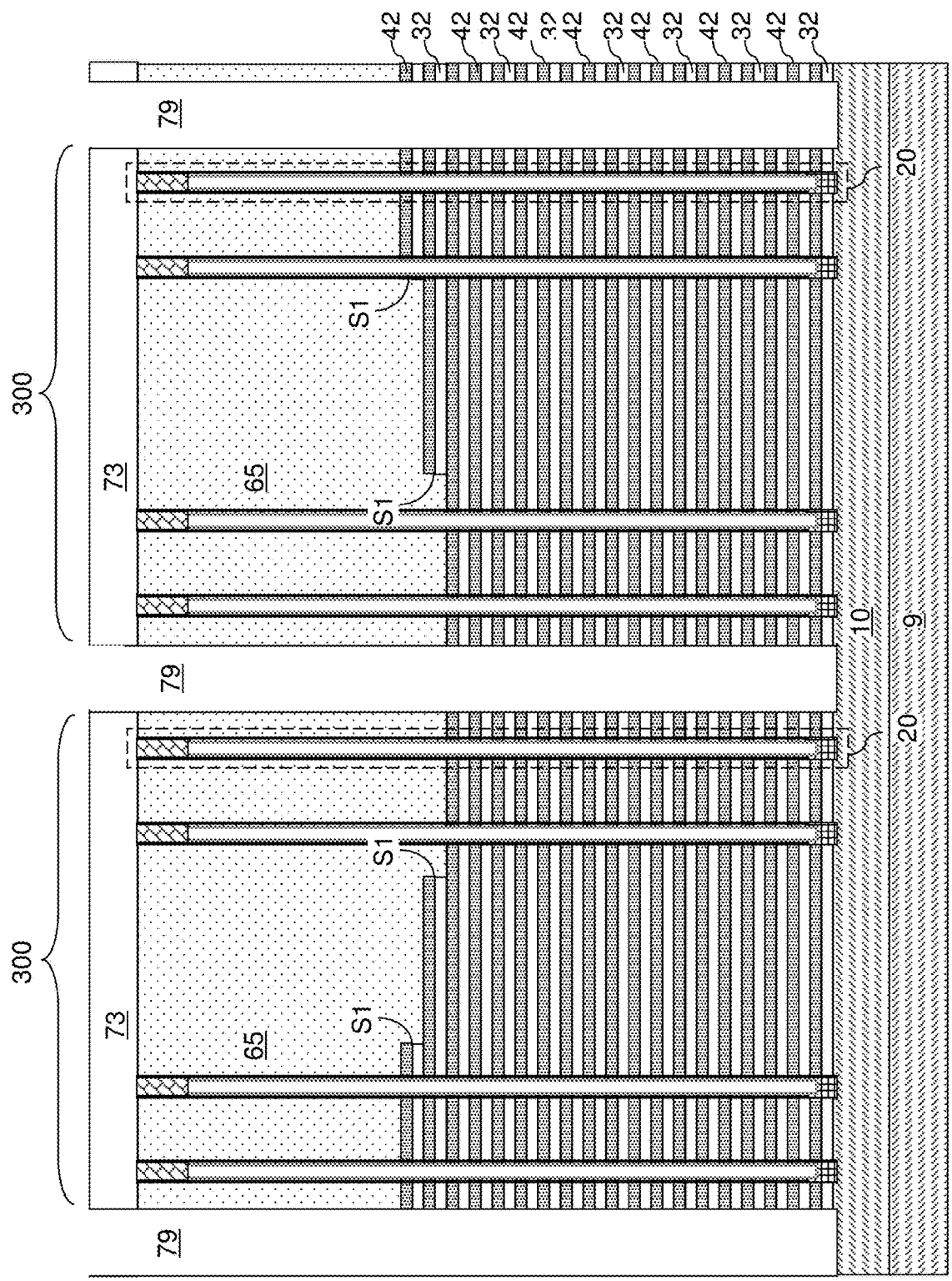
FIG. 7C is a schematic vertical cross-sectional view along the vertical plane C-C' of FIG. 7B.

Referring to FIGS. 6A-6C, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A-4D. An instance of the support pillar structure 20 may be formed within each support opening 19 of the structure of FIGS. 4A-4D.

Each memory stack structure 55 may include a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. Each memory stack structure 55 may be formed through the memory array region 100 in which each layer of the vertically alternating sequence (32, 42) is present. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Generally, the memory opening fill structures 58 (and thus, the memory stack structures 55) may be arranged within the memory array region 100 as at least one two-dimensional hexagonal array in the plan view, i.e., the view along the vertical direction. In one embodiment, each of the support pillar structures 20 comprises: a respective semiconductor material layer 60 having a same composition, and a same thickness, as each of the vertical semiconductor channels 60 of the memory stack structures 55; and a dielectric layer stack 50 including a same set of materials as sublayers within the memory films 50.

In an alternative embodiment, the memory opening 49 and the support openings 19 may be formed in separate processing steps, and/or may be filled with different materials using a different set of deposition steps. Alternatively, the memory openings 49 and the support openings 19 may be formed using a same lithographic patterning step, and may be filled with sacrificial fill materials. The sacrificial fill material portions in the memory openings 49 and the sacrificial material potions in the support openings 19 may be removed using different processing steps, and may be replaced with memory opening fill structures 58 or support pillar structures using different processing steps. In this case, the support openings 19 may be formed prior to, or after, formation of the memory openings 49, and the support pillar structures may be formed prior to, or after, formation of the memory opening fill structures 58. In one embodiment, the support pillar structures consist of at least one dielectric material and may be located at the same locations as the support pillar structures 20 described above.

Referring to FIGS. 7A-7D, a contact level dielectric layer 73 may be formed over the vertically alternating sequence (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form a network of openings and isolated openings. The pattern in the photoresist layer may be transferred through the contact level dielectric layer 73, the vertically alternating sequence (32, 42) and/or the retro-stepped dielectric material portion 65 using an anisotropic etch to form trenches 79, which vertically extend from the top surface of the contact level dielectric layer 73 at least to the top surface of the substrate (9, 10), and laterally extend through the memory array region 100 and the staircase region 300.

The vertically alternating sequence (32, 42) is patterned by forming backside trenches 79 through the vertically alternating sequence (32, 42) in areas in which the memory stack structures 55 and the support pillar structures 20 are not present. The areas in which the memory stack structures 55 and the support pillar structures 20 may be arranged as narrow rectangular strips that laterally extend along the first horizontal direction between a respective pair of groups of memory stack structures 55. Further, each narrow rectangular strip may be located between groups of support pillar structures 20 that are laterally spaced apart along the second horizontal direction hd2. In one embodiment, each of the backside trenches 79 may laterally extend along a first horizontal direction hd1.

The backside trenches 79 may laterally extend along the first horizontal direction hd1 with a respective uniform width. The memory array region 100 and the staircase region 300 may be divided into multiple memory array regions 100 and multiple staircase regions 300. A combination of a memory array region 100 and an adjoined pair of staircase regions 300 includes a respective patterned portion of a respective alternating stack (32, 42). Thus, the vertically alternating sequence (32, 42) of the insulating layers 32 and the sacrificial material layers 42 may be divided into a plurality of alternating stacks of insulating layers 32 and sacrificial material layers 42. Each insulating layer 32 within an alternating stack (32, 42) may be a patterned portion of a respective insulating layer 32 within the vertically alternating sequence (32, 42). Each sacrificial material layer 42 within an alternating stack (32, 42) may be a patterned portion of a respective sacrificial material layer 42 within the vertically alternating sequence (32, 42). The alternating stacks (32, 42) within the plurality of alternating stacks (32, 42) may be laterally spaced apart from one another by the backside trenches 79. A group of memory stack structures 55 may extend through each alternating stack (32, 42). A group of support pillar structures 20 may extend through each staircase region 300. Each support pillar structure 20 within a group of support pillar structures 20 may be located at lattice sites of a hexagonal periodic array.

In one embodiment, a horizontal direction along which a neighboring pair of support pillar structures 20 is laterally spaced apart (such as the direction of the nearest vertex-to-vertex distance "a" illustrated in FIG. 7D) is parallel to, or perpendicular to, the first horizontal direction hd1. In one embodiment, the horizontal direction along which a neighboring pair of support pillar structures 20 is laterally spaced apart may be parallel to the lengthwise direction of the backside trenches 79, i.e., the first horizontal direction hd1.

Figure 8A:
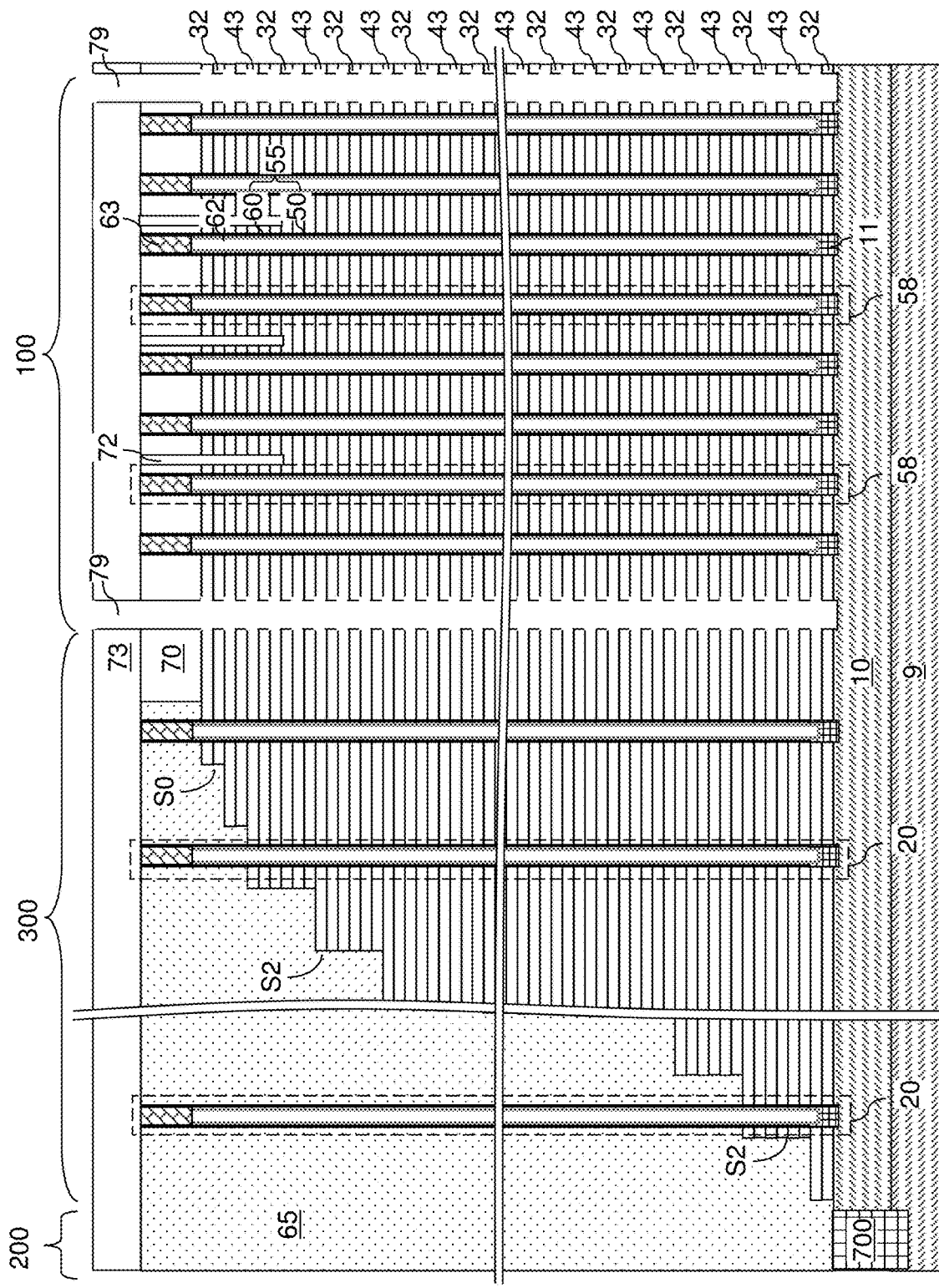
FIG. 8A is a schematic vertical cross-sectional view of the exemplary structure after formation of backside recesses according to an embodiment of the present disclosure.
Figure 8B:
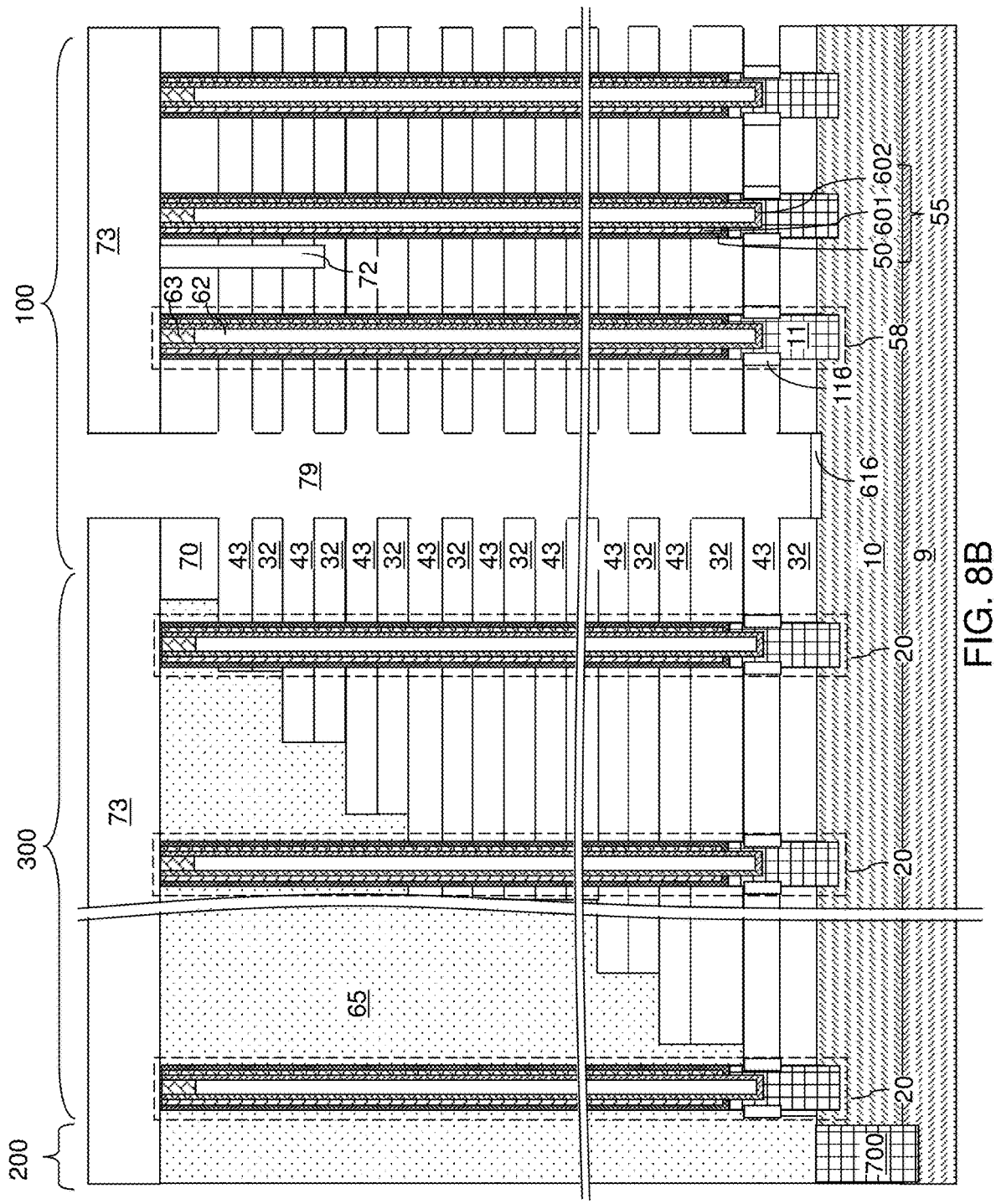
FIG. 8B is another schematic vertical cross-sectional view of the exemplary structure of FIG. 8A.

Referring to FIGS. 8A, 8B, and 9A, an etchant that selectively etches the second material of the sacrificial material layers 42 with respect to the first material of the insulating layers 32 may be introduced into the backside trenches 79, for example, using an etch process. Each of the sacrificial material layers 42 may be removed selective to the insulating layers 32 of the alternating stacks (32, 42) using an isotropic etch process that provides an isotropic etchant into the backside trenches 79. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. The tubular dielectric spacers 116 and the planar dielectric portions 616 are omitted in FIG. 8A for clarity. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each trench 79 that is not filled with the backside blocking dielectric layer 44.

Referring to FIG. 9C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 10:
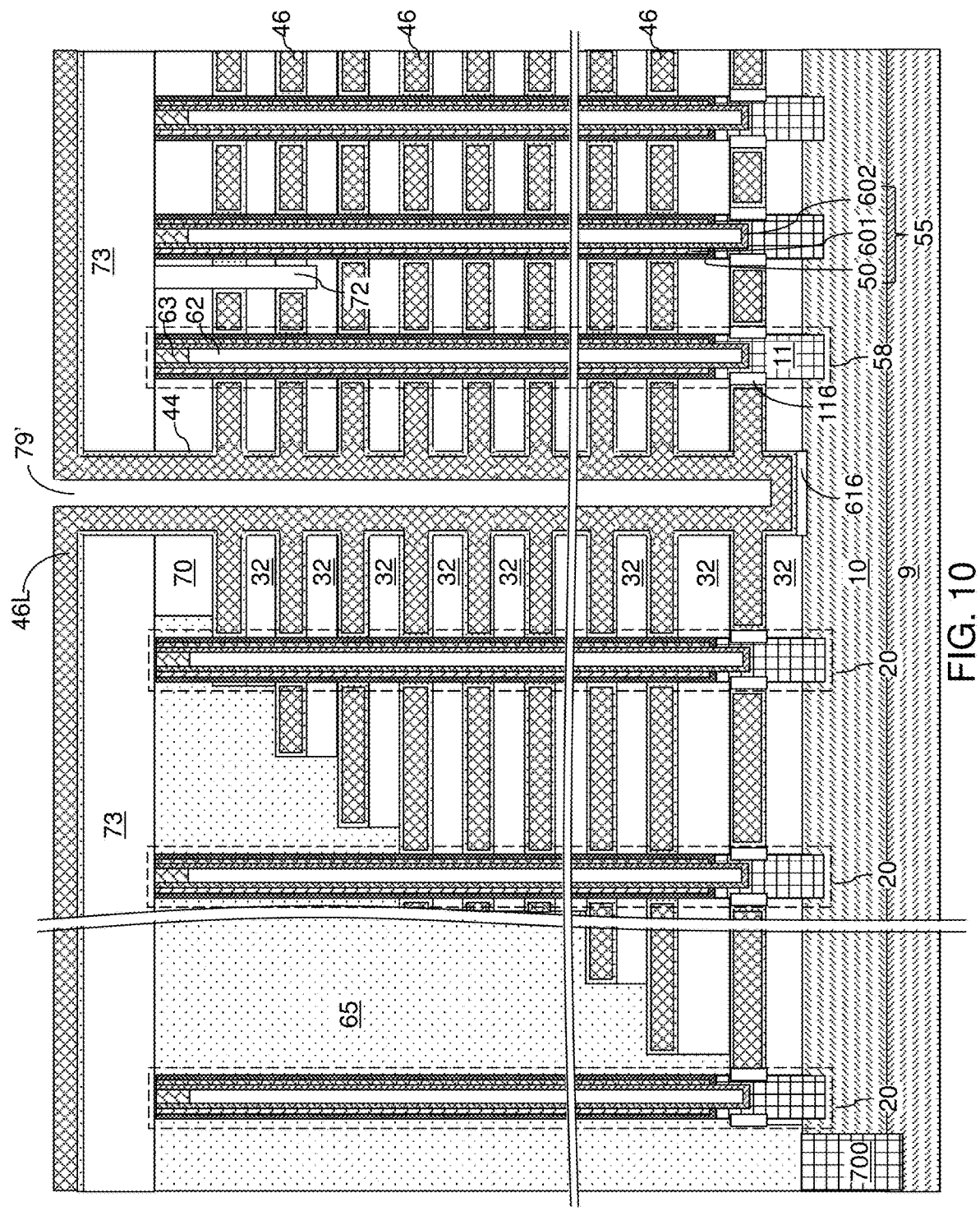
FIG. 10 is a schematic vertical cross-sectional view of the exemplary structure at the processing steps of FIG. 9D.
Figure 11A:
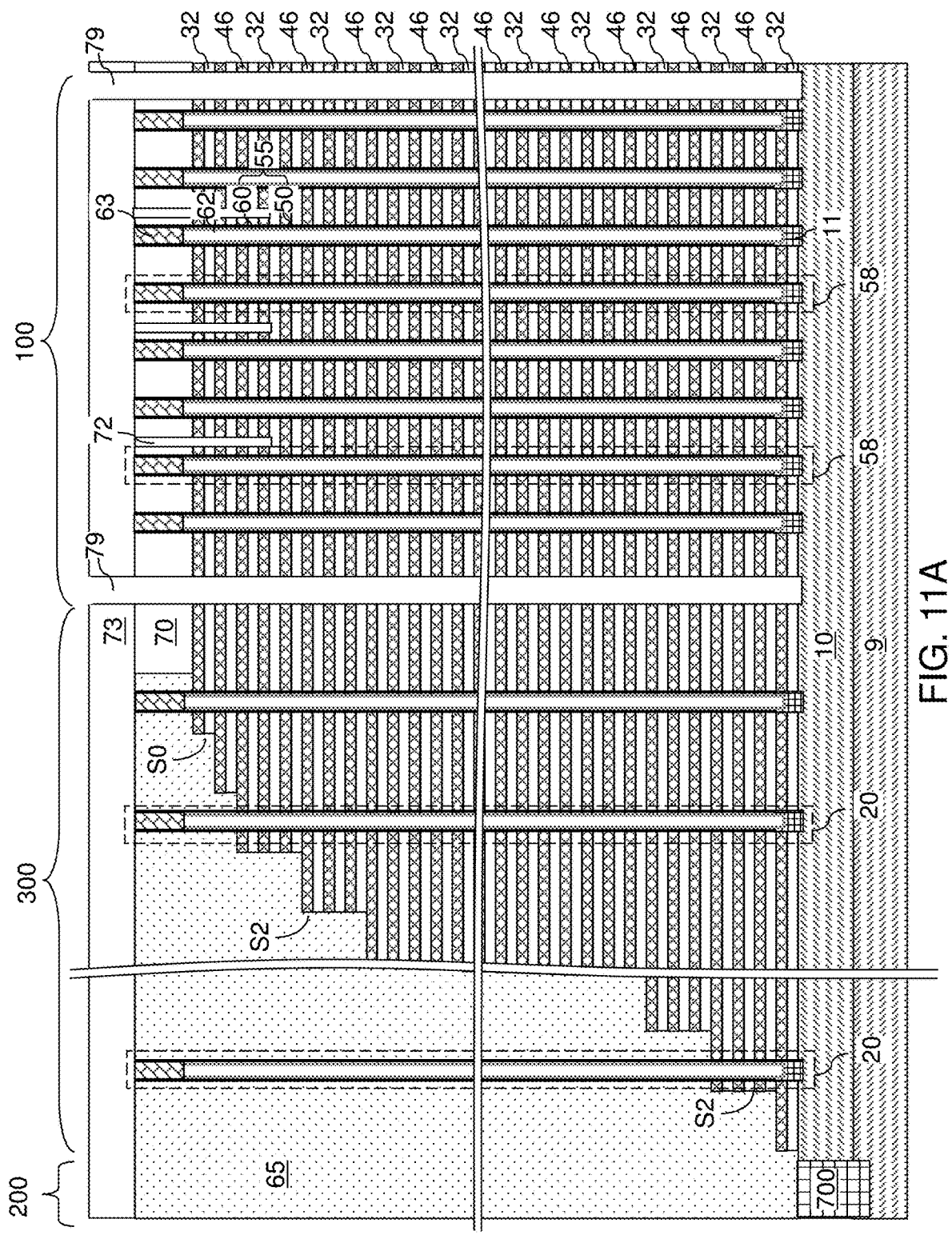
FIG. 11A is a schematic vertical cross-sectional view of the exemplary structure after removal of electrically conductive material from inside the backside trenches and from above the contact-level dielectric layer according to an embodiment of the present disclosure.
Figure 11B:
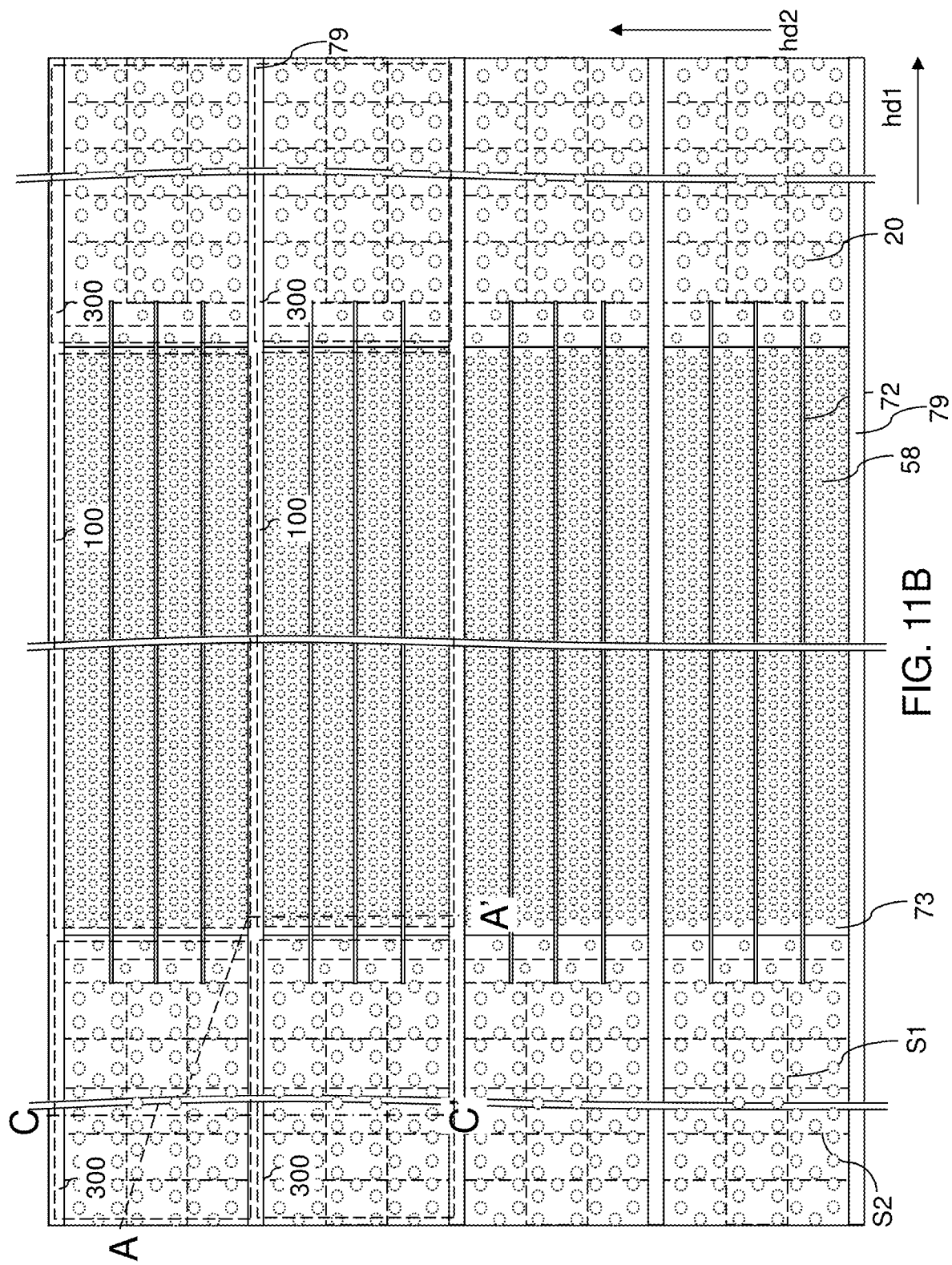
FIG. 11B is a schematic top-down view of the exemplary structure of FIG. 11A. The zig-zag vertical plane A-A' is the plane of the vertical cross-section of FIG. 11A.
Figure 11C:
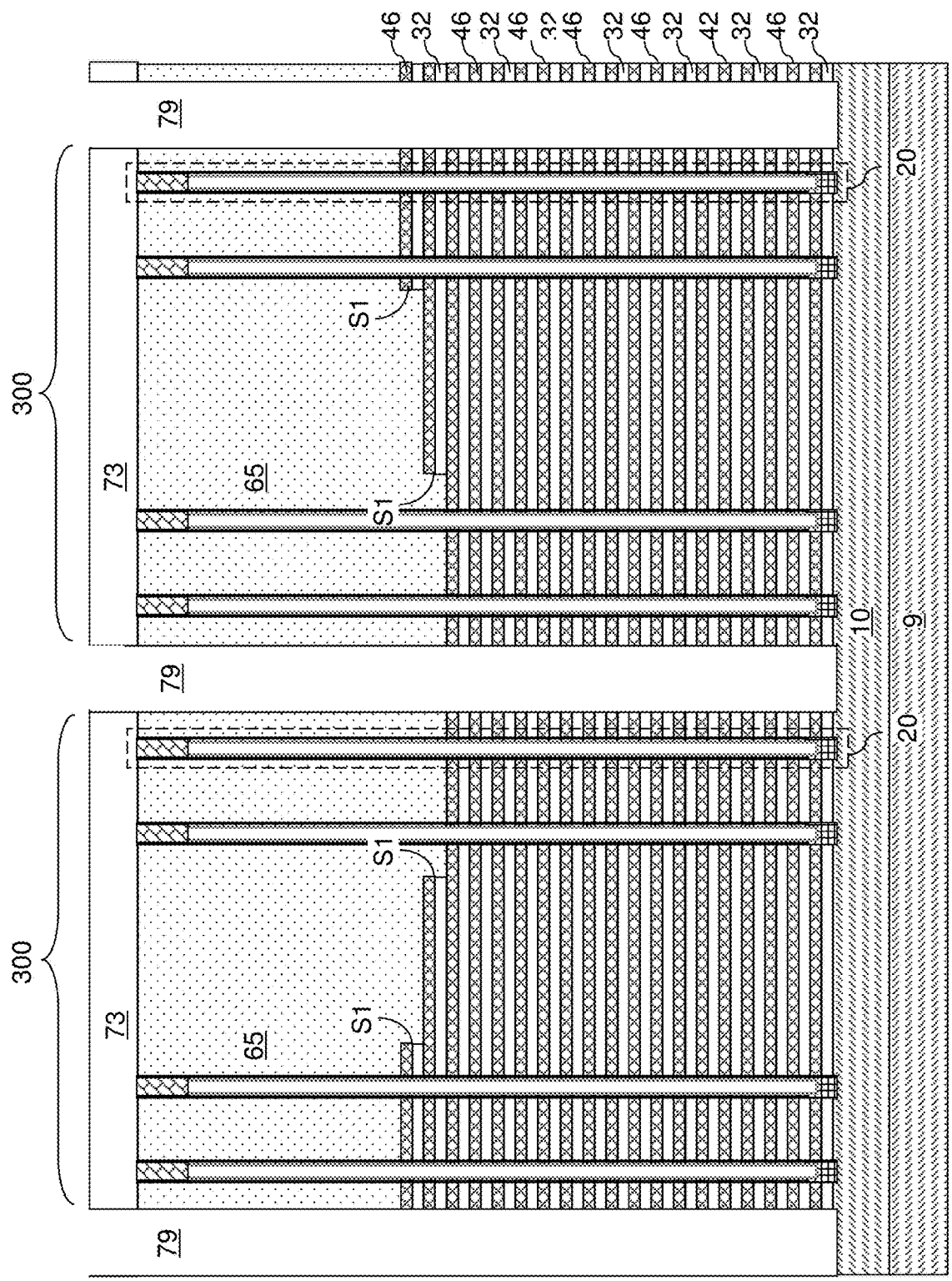
FIG. 11C is a schematic vertical cross-sectional view along the vertical plane C-C' of FIG. 11B.
Figure 11D:
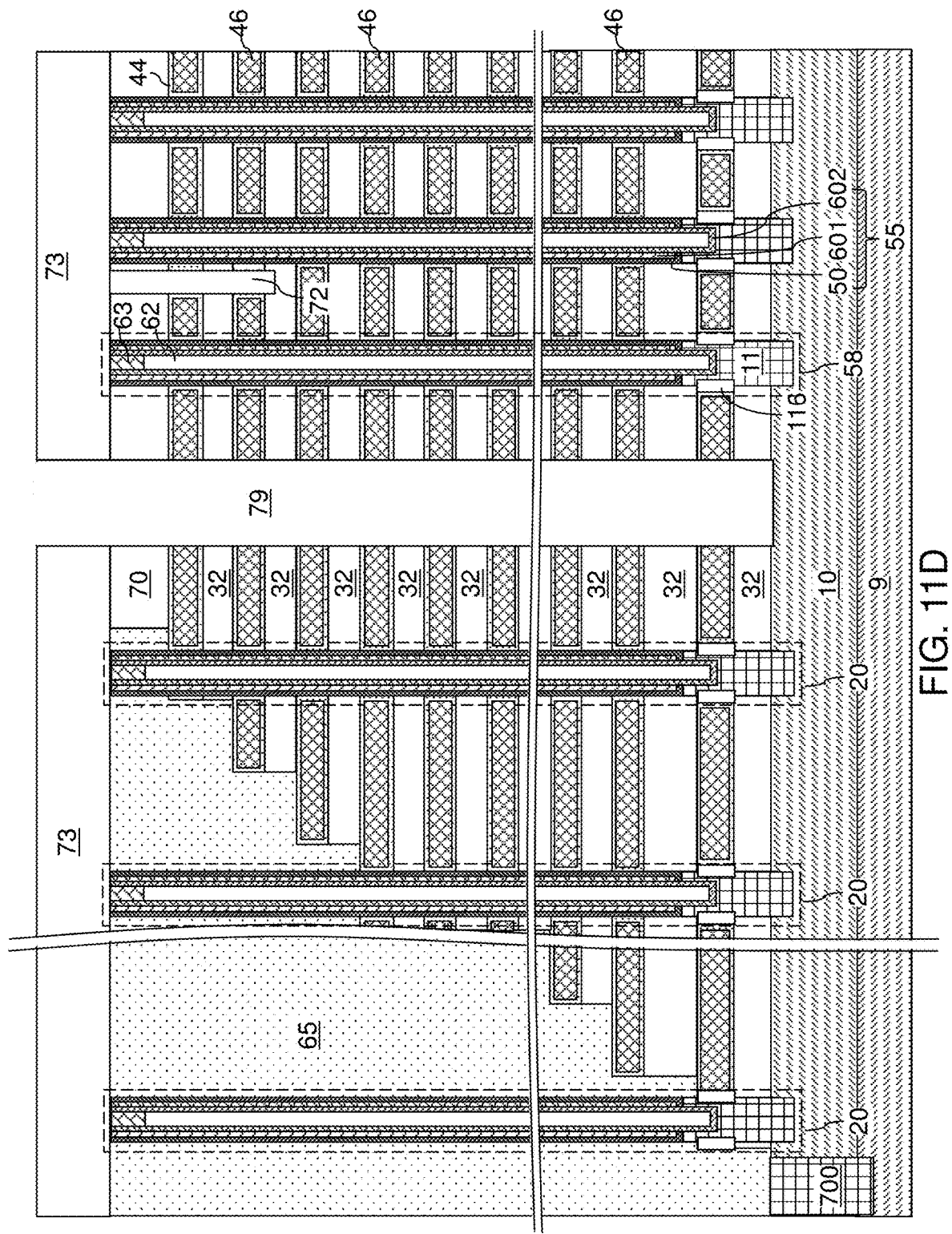
FIG. 11D is a magnified vertical cross-sectional view of the exemplary structure of FIGS. 11A-11C.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each trench 79 and over the contact level dielectric layer 73. Each electrically conductive layer 46 may include a portion of the metallic barrier layer 46A and a portion of the metallic fill material layer 46B that are located between a vertically neighboring pair of dielectric material layers such as a pair of insulating layers 32. The continuous electrically conductive material layer 46L may include a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' may be present in the portion of each trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Referring to FIGS. 11A-11D, the deposited metallic material of the continuous electrically conductive material layer 46L may be etched back from the sidewalls of each trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive liner structure. Thus, the sacrificial material layers 42 may be replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity is present within each trench 79.

Figure 12A:
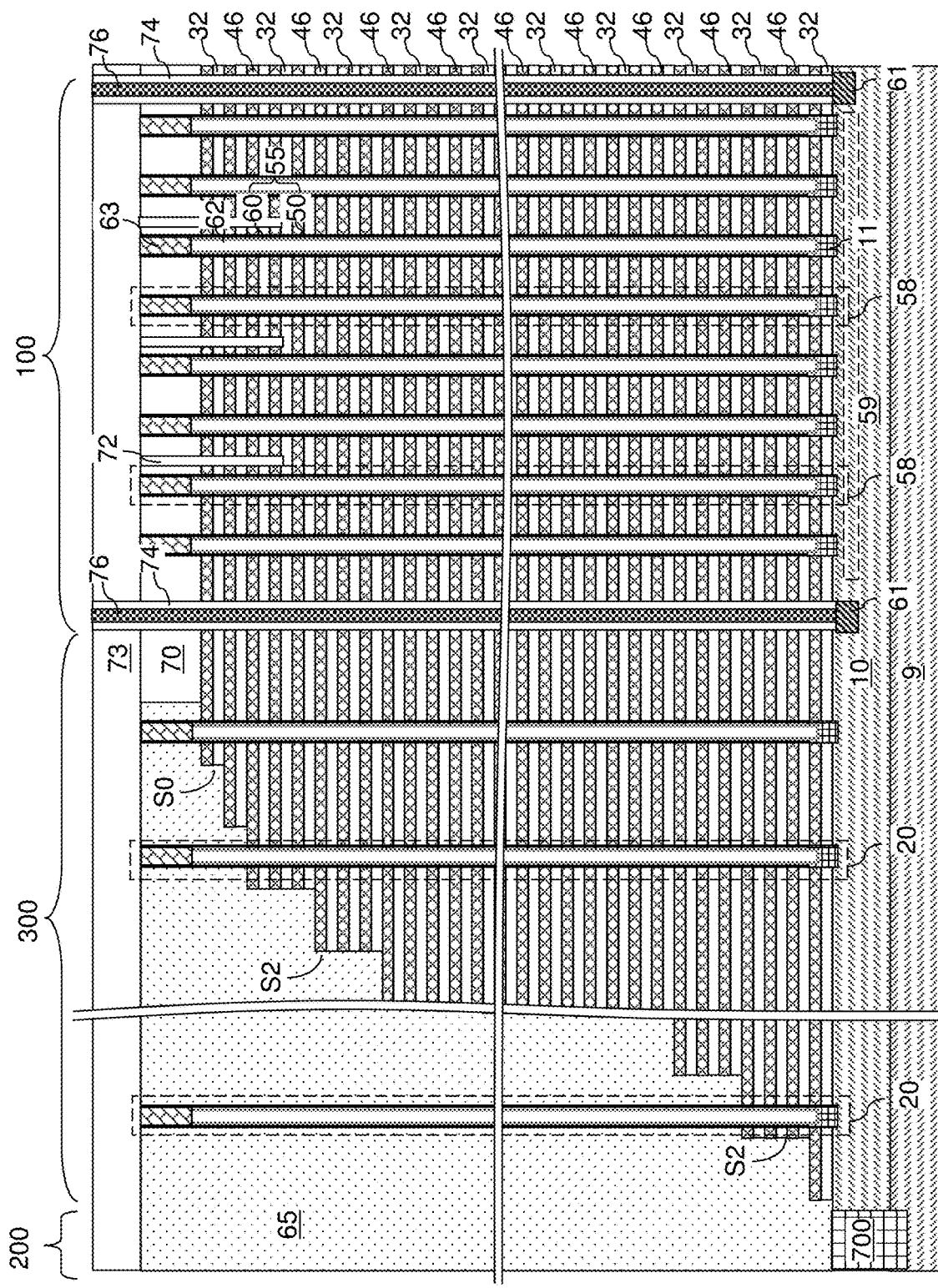
FIG. 12A is a schematic vertical cross-sectional view of the exemplary structure after formation of backside contact via structures according to an embodiment of the present disclosure.
Figure 12B:
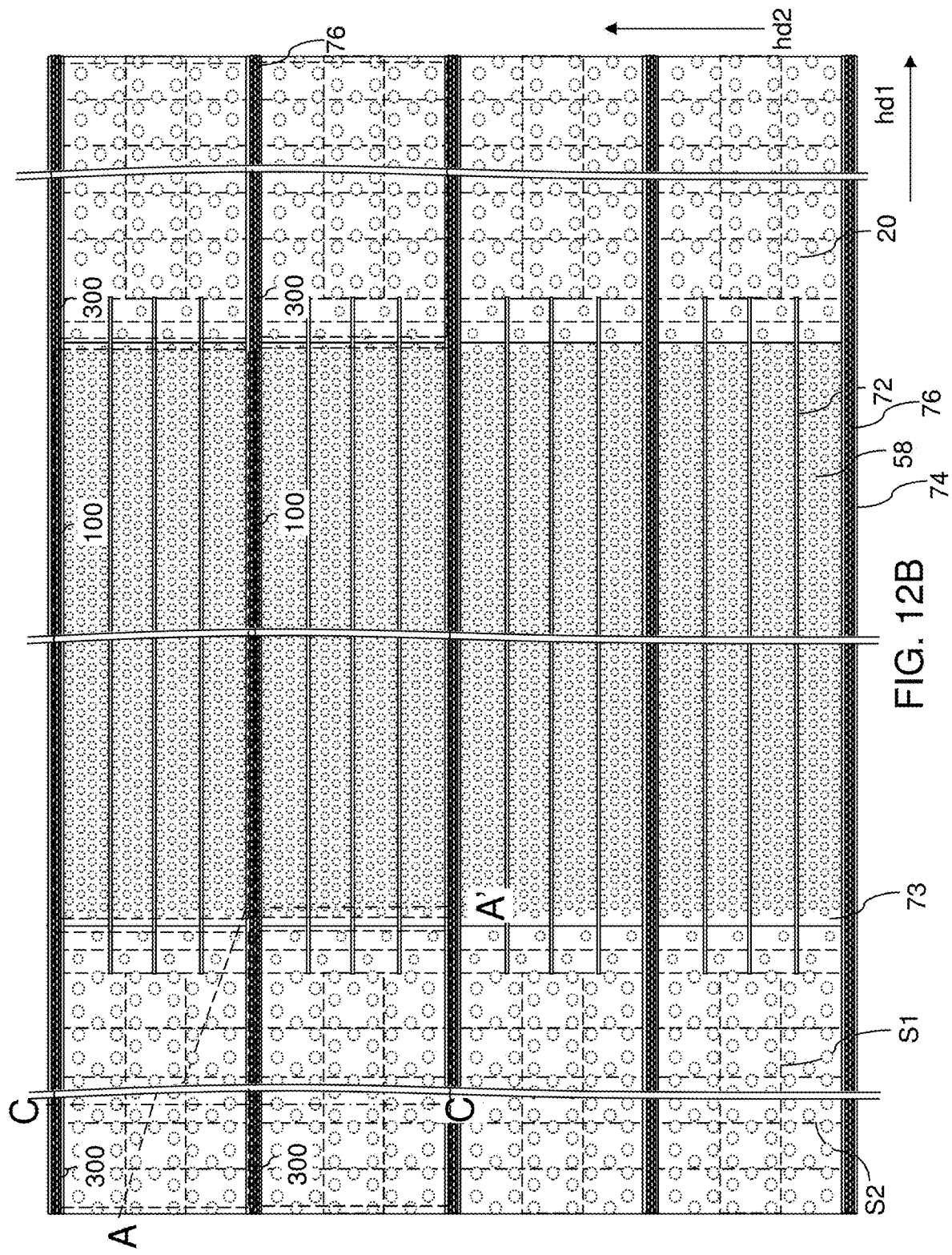
FIG. 12B is a schematic top-down view of the exemplary structure of FIG. 12A. The zig-zag vertical plane A-A' is the plane of the vertical cross-section of FIG. 12A.
Figure 12C:
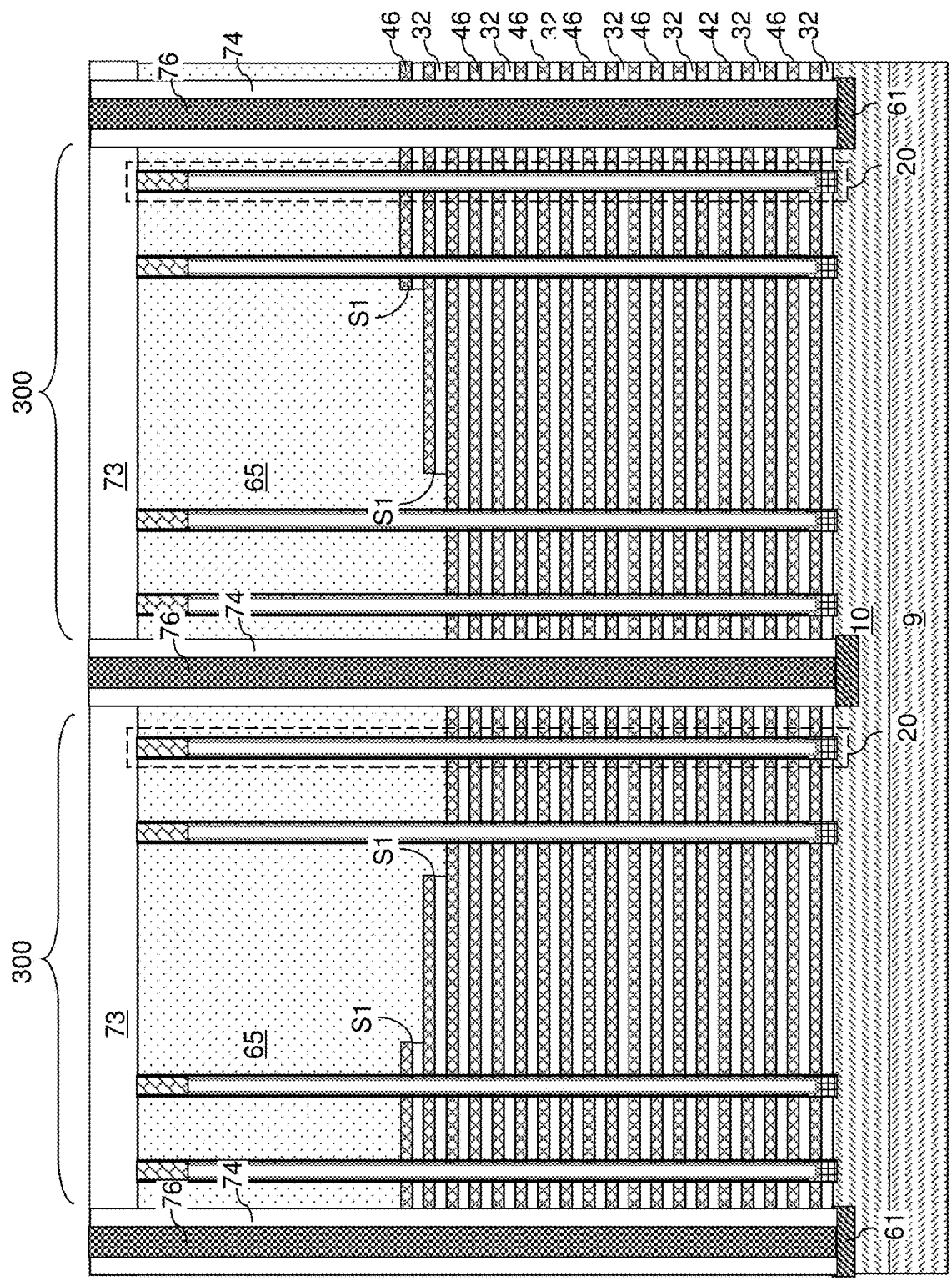
FIG. 12C is a schematic vertical cross-sectional view along the vertical plane C-C' of FIG. 12B.

Referring to FIGS. 12A-12C, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each trench 79. Each remaining portion of the insulating material layer may constitute an insulating spacer 74. A backside cavity 79' may be present within a volume surrounded by each insulating spacer 74. A top surface of the semiconductor material layer 10 may be physically exposed at the bottom of each trench 79.

A source region 61 may be formed at a surface portion of the semiconductor material layer 10 under each backside trench 79 by implantation of electrical dopants into physically exposed surface portions of the semiconductor material layer 10. The source region 61 may be formed in a surface portion of the substrate (9, 10) that underlies an opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner and a conductive fill material portion. The conductive liner may include a conductive metallic liner such as TiN, TaN, WN, TiC, TaC, WC, an alloy thereof, or a stack thereof. The thickness of the conductive liner may be in a range from 3 nm to 30 nm, although lesser and greater thicknesses may also be used. The conductive fill material portion may include a metal or a metallic alloy. For example, the conductive fill material portion may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Referring to FIGS. 13A-13D, drain contact via structures 88 may be formed through the contact level dielectric layer 73 on each drain region 63. Layer contact via structures (e.g., word line contact via structures) 86 (CC) may be formed on the electrically conductive layers 46 through the contact level dielectric layer 73, and through the retro-stepped dielectric material portion 65. Support device contact via structures (not shown) may be formed through the retro-stepped dielectric material portion 65 directly on respective nodes of the support devices. The various contact via structures (88, 86) may be formed by forming via cavities vertically extending to the drain regions in the memory array regions 100, top surfaces of the electrically conductive layers 46 in the staircase regions 300, to top surfaces of semiconductor devices or metal interconnect structures (not shown) in the peripheral region 200, and by filling the various via cavities with at least one conductive material such as at least one metallic material. Excess portions of the metallic material may be removed from above the top surface of the contact level dielectric layer 73. Remaining portions of the at least one conductive material constitute the various via structures (88, 86). The layer contact via structures 86 may be omitted in the peripheral region 200 (e.g., dummy region) and only support pillar structures 20 arranged in an equilateral triangular periodic array are present in the peripheral region 200.

According to an embodiment of the present disclosure, the layer contact via structures 86 may be formed at unoccupied lattice sites of each hexagonal periodic array in the staircase regions 300. In one embodiment, each lattice site of each hexagonal periodic array in the staircase regions 300 may be occupied either by a support pillar structure 20 or by a layer contact via structure 86. In one embodiment, each geometrical center of the support pillar structures 20 and the layer contact via structures 86 in the staircase regions 300 may be located at the lattice sites of the hexagonal periodic arrays within the staircase regions 300.

Figure 13A:
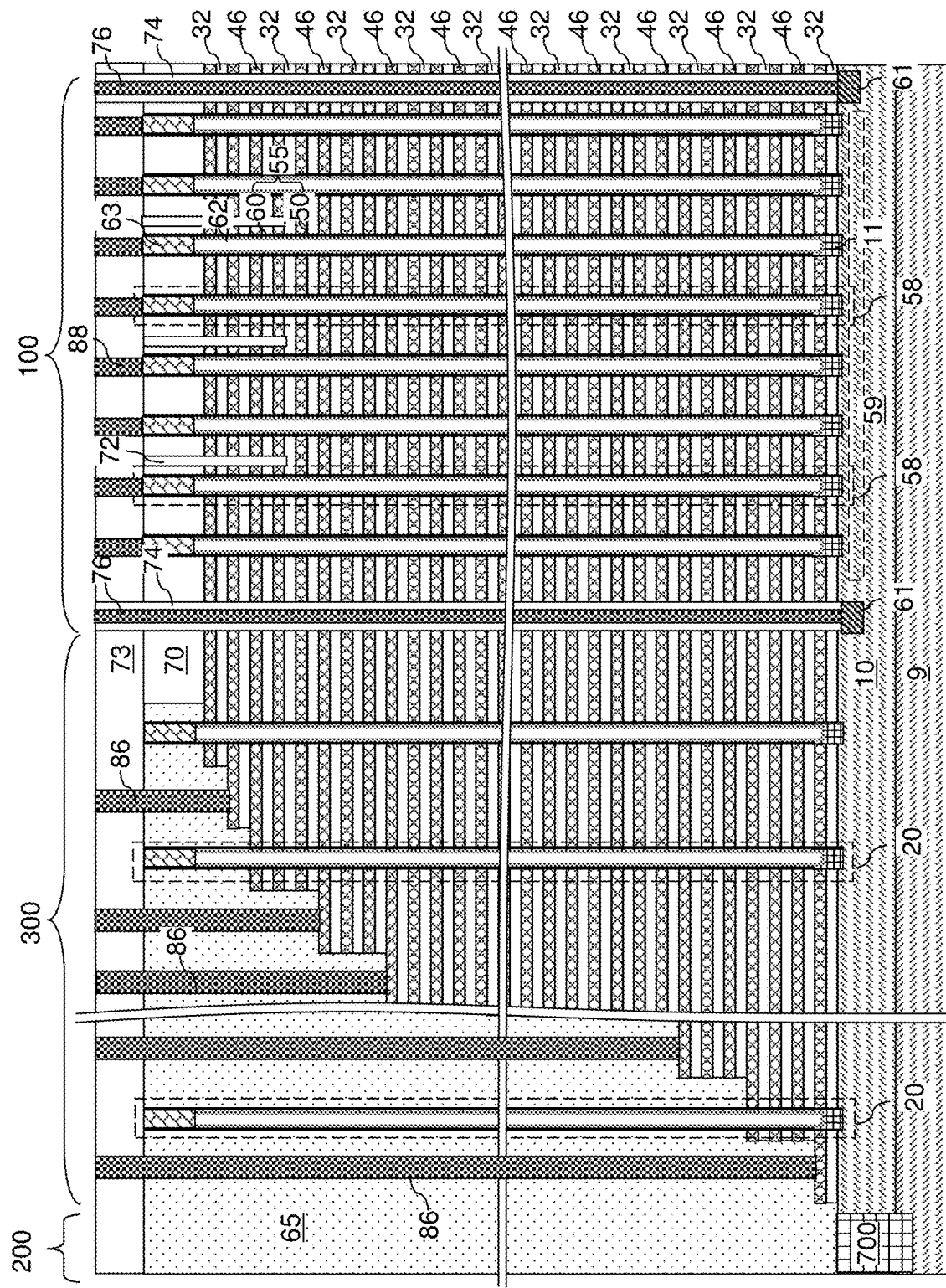
FIG. 13A is a schematic vertical cross-sectional view of the exemplary structure after formation of additional contact via structures according to an embodiment of the present disclosure.
Figure 13B:
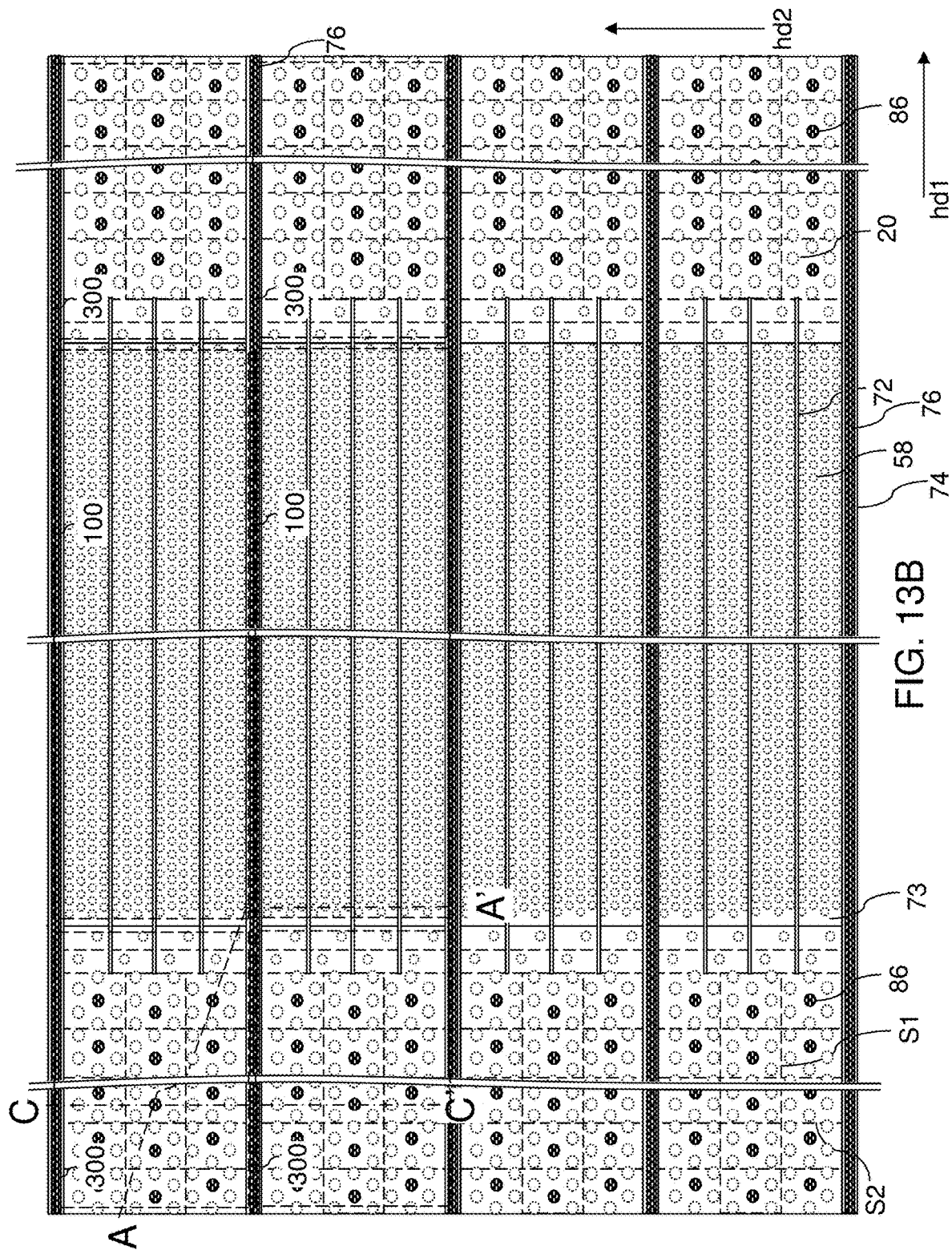
FIG. 13B is a schematic top-down view of the exemplary structure of FIG. 13A. The zig-zag vertical plane A-A' is the plane of the vertical cross-section of FIG. 13A.
Figure 13C:
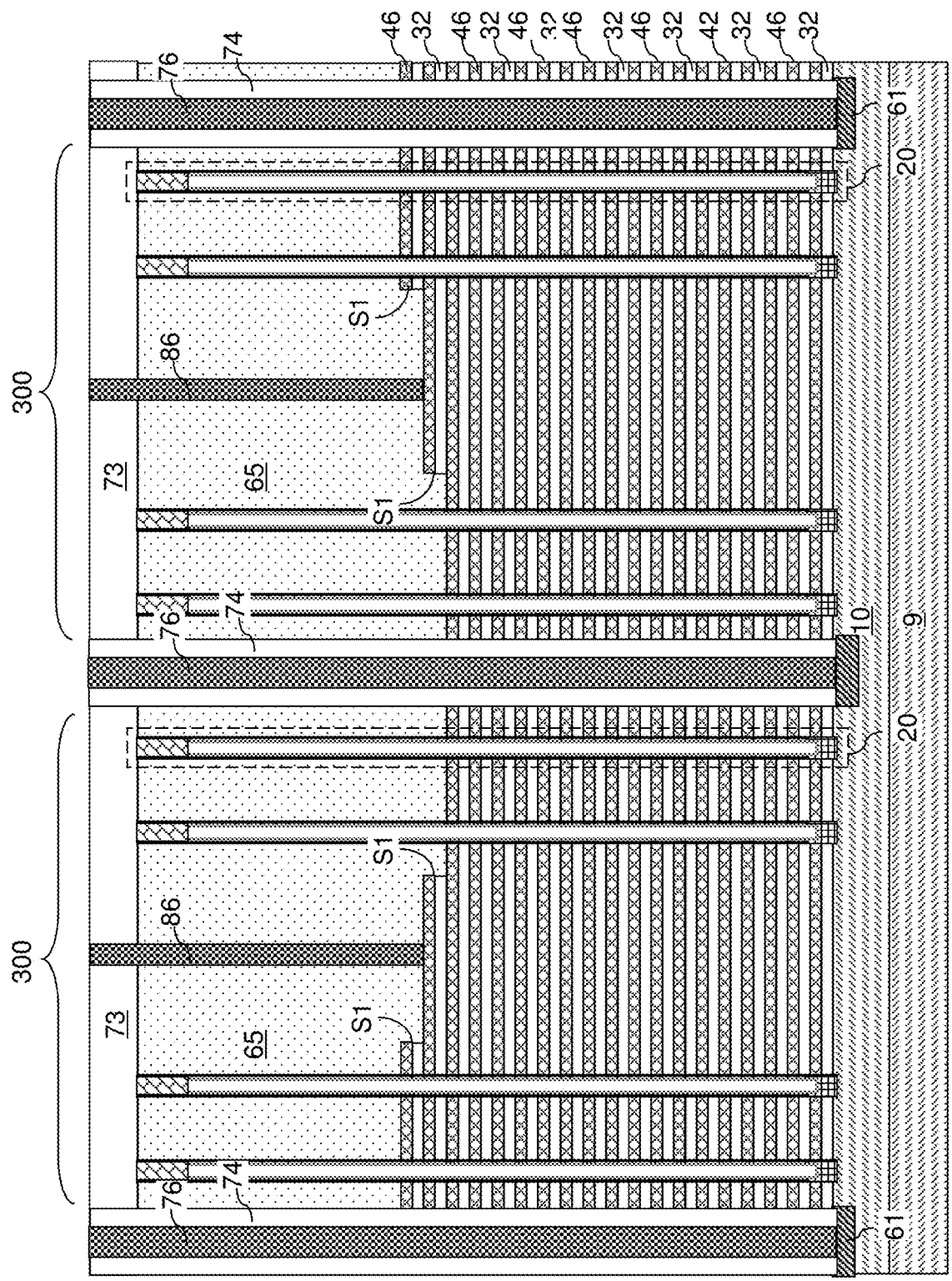
FIG. 13C is a schematic vertical cross-sectional view along the vertical plane C-C' of FIG. 13B.
Figure 13D:
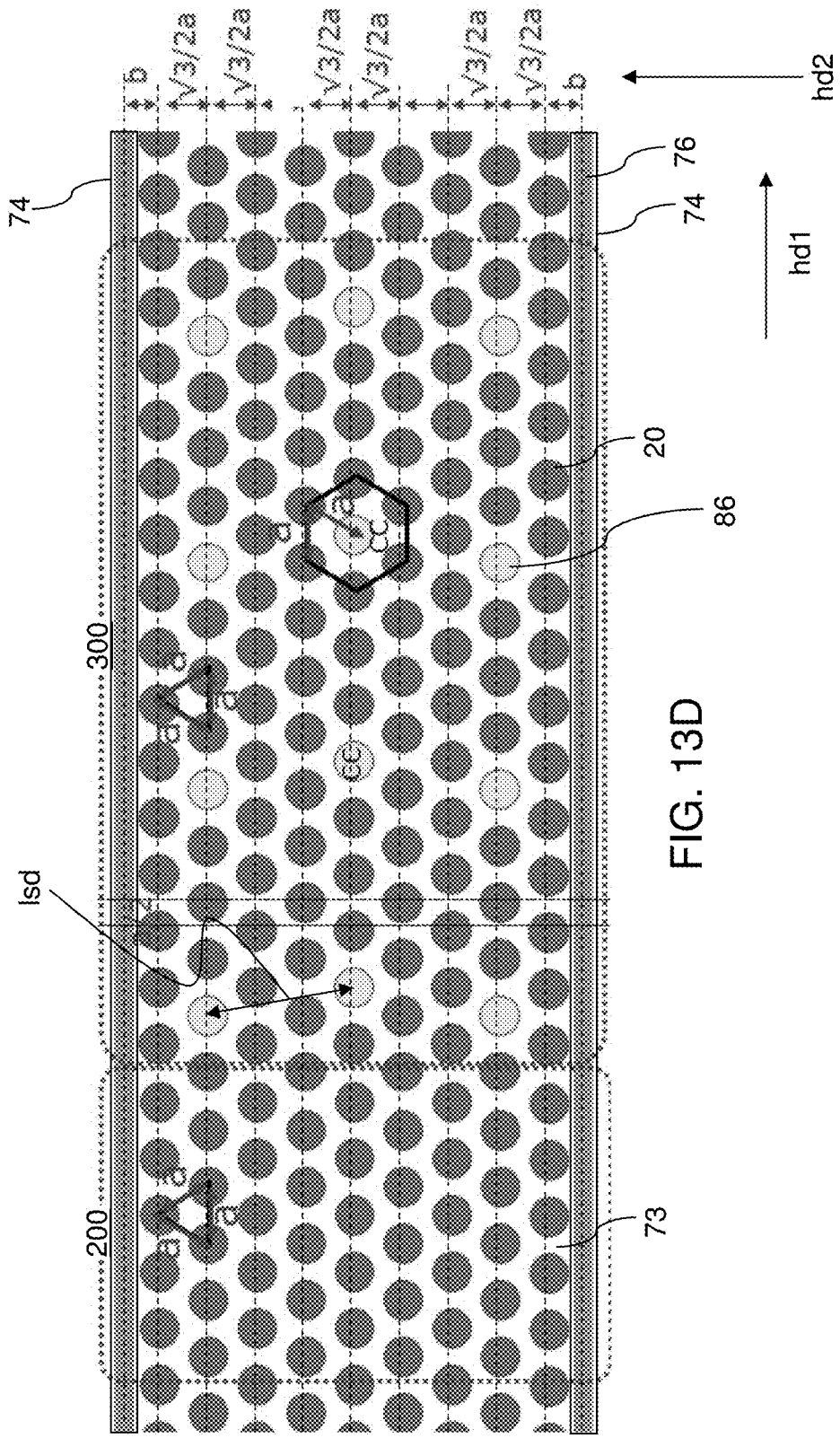
FIG. 13D is a magnified horizontal cross-sectional view of a staircase region and a peripheral region of the exemplary structure at the level of the horizontal cross-sectional plane B-B' of FIG. 13B.
Figure 13E:
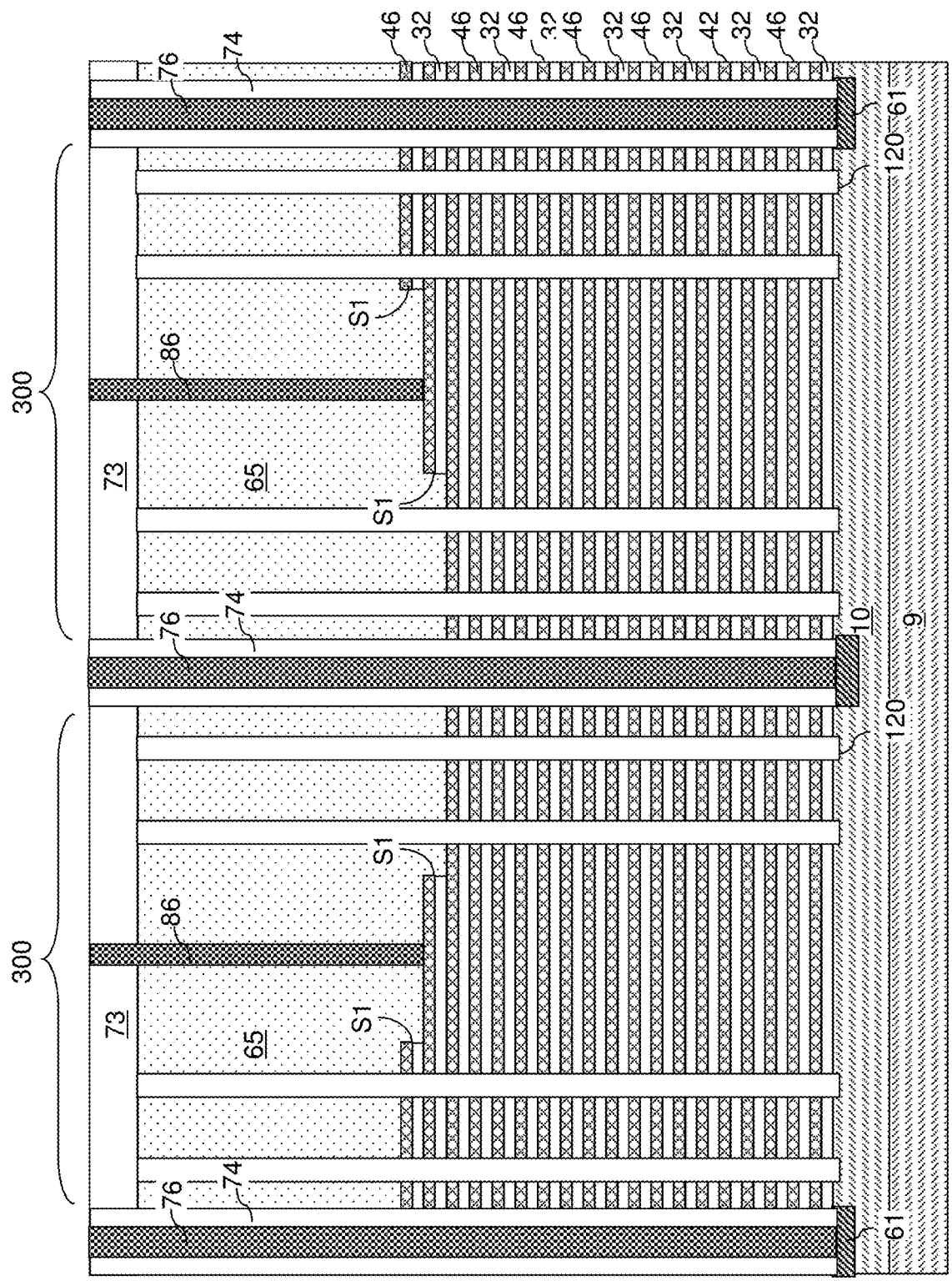
FIG. 13E is a schematic vertical cross-sectional view of an alternative embodiment of the exemplary structure.

Referring to FIG. 13E, an alternative configuration of the exemplary structures is illustrated, which may be derived from the exemplary structure by forming support pillar structures 120 consisting of at least one dielectric material. In this case, the memory opening 49 and the support openings 19 may be formed in separate processing steps, and/or may be filled with different materials using a different set of deposition steps. Alternatively, the memory openings 49 and the support openings 19 may be formed using a same lithographic patterning step, and may be filled with sacrificial fill materials. The sacrificial fill material portions in the memory openings 49 and the sacrificial material potions in the support openings 19 may be removed using different processing steps, and may be replaced with memory opening fill structures 58 or support pillar structures 120 using different processing steps. In this case, the support openings 19 may be formed prior to, or after, formation of the memory openings 49, and the support pillar structures 120 may be formed prior to, or after, formation of the memory opening fill structures 58. In one embodiment, the support pillar structures 120 consist of at least one dielectric material and may be located at the same locations as the support pillar structures 20 described above.

Figure 14B:
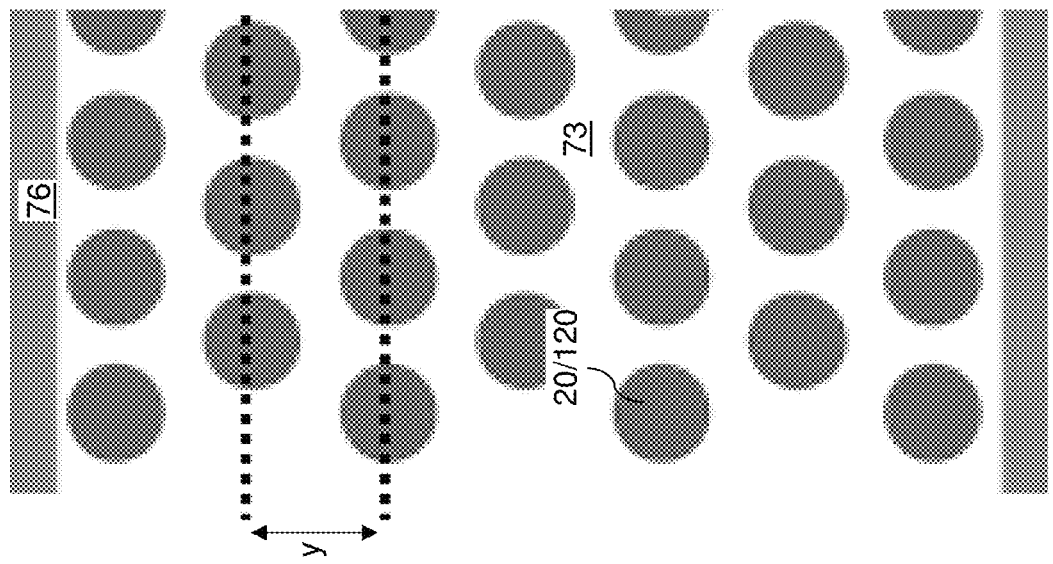
FIG. 14B is a layout of the support pillar structures according to an embodiment of the present disclosure.
Figure 14A:
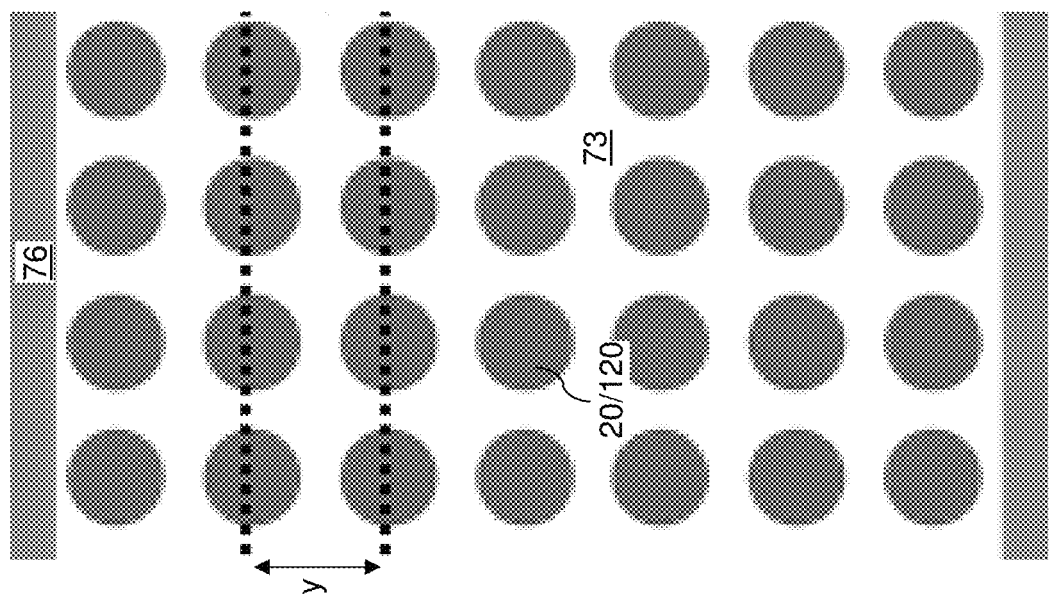
FIG. 14A is a comparative exemplary layout of support pillar structures.

FIG. 14A illustrates a comparative exemplary layout of support pillar structures 20/120 between a pair of backside contact via structures 76 for subsequent discussion on simulation results on structural distortion of insulating layers 32 while backside recesses 43 are present. FIG. 14B illustrates a layout of the support pillar structures according to an embodiment of the present disclosure for subsequent discussion on simulation results on structural distortion of insulating layers 32 while backside recesses 43 are present.

Figure 15:
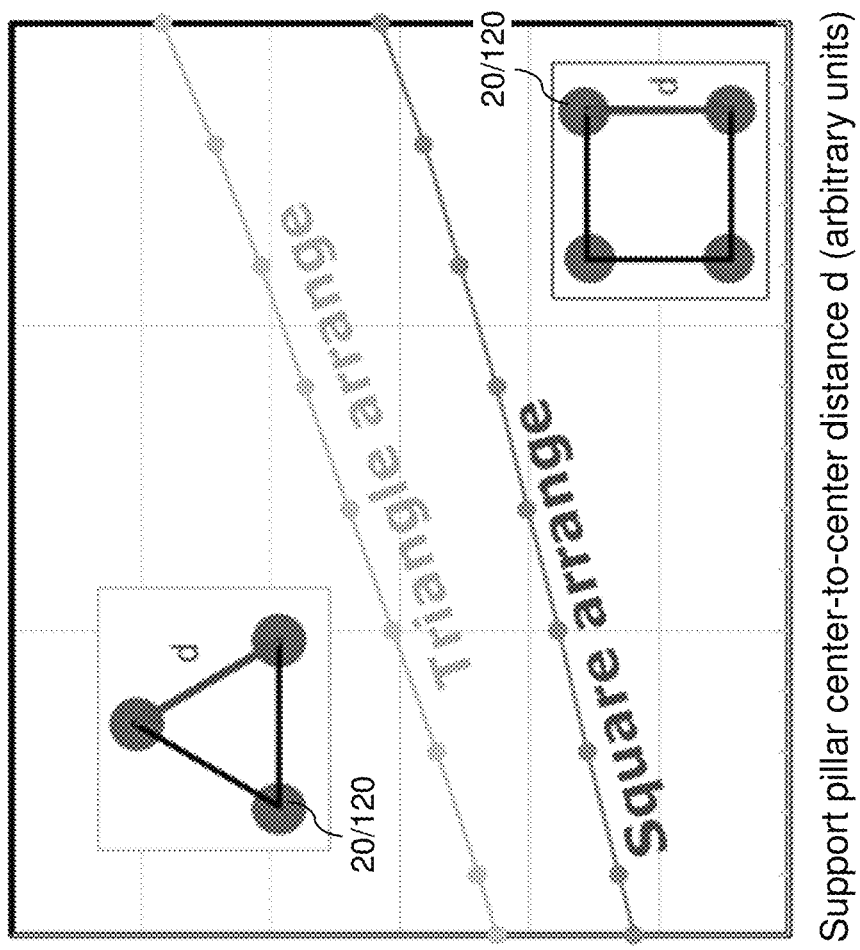
FIG. 15 is a graph illustrating the maximum deformation-free separation distance as a function of a support pillar center-to-center distance for a triangular arrangement and a square arrangement for support pillar structures.

Referring FIG. 15, a graph illustrates the maximum deformation-free separation distance as a function of a support pillar center-to-center distance for a triangular arrangement and a square arrangement for support pillar structures. The "maximum deformation free separation distance" refers to the maximum value for a lateral distance b (illustrated in FIG. 13D) between a vertical plane passing through the geometrical center of a backside trench 79 and extending along the lengthwise direction of the backside trench 79 (such as the first horizontal direction hd1) and a line passing through geometrical centers of a most proximal row of support pillar structures (20, 120) that limits the maximum lateral distortion of support pillar structures (20, 120) to less than one-half of the initial nearest-neighbor distance between the support pillar structures (20, 120). In other words, if the lateral distance b (illustrated in FIG. 13D) between a vertical plane passing through the geometrical center of a backside trench 79 and extending along the lengthwise direction of the backside trench 79 is less than the maximum deformation free separation distance, contact between support pillar structures (20, 120) due to tilting (caused by bending of the insulating layers 32 after formation of the backside recesses 43) of the support pillar structures (20, 120) is absent.

FIG. 15 illustrates that a triangular arrangement, such as an equilateral triangular arrangement, of the support pillar structures (20, 120) that is present within a regular hexagonal periodic array provides a higher maximum deformation-free separation distance b than a square arrangement of the support pillar structures (20, 120) that is present within a square periodic array illustrated in FIG. 14A for all values of the support pillar center-to-center distance d, which corresponds to the nearest vertex-to-vertex distance a.

Figure 16:
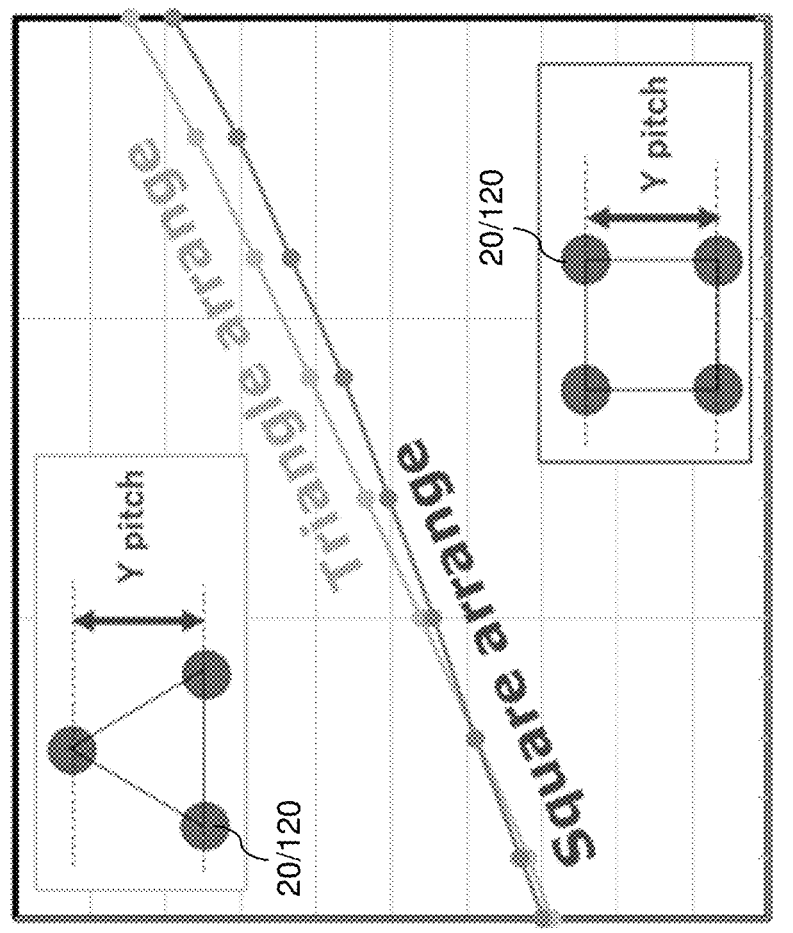
FIG. 16 is a graph illustrating the maximum deformation-free separation distance as a function of a support pillar row-to-row pitch for a triangular arrangement and a square arrangement for support pillar structures.

FIG. 16 compares the maximum deformation-free separation distance as a function of a support pillar row-to-row pitch for the square arrangement for support pillar structures illustrated in FIG. 14A and for the triangular arrangement for support pillar structures illustrated in FIG. 14B. The triangular arrangement of the support pillar structures (20, 120) that is present within a regular hexagonal periodic array provides a higher maximum deformation-free separation distance b than a square arrangement of the support pillar structures (20, 120) that is present within a square periodic array illustrated in FIG. 14A for large values of the support pillar row-to-row pitch y, which corresponds to the nearest vertex-to-vertex distance in the case of the square array and corresponds to $$\left(\frac{\sqrt{3}}{2}\right)$$

times the nearest vertex-to-vertex distance "a" in the case of the regular hexagonal periodic array.

Figure 17:
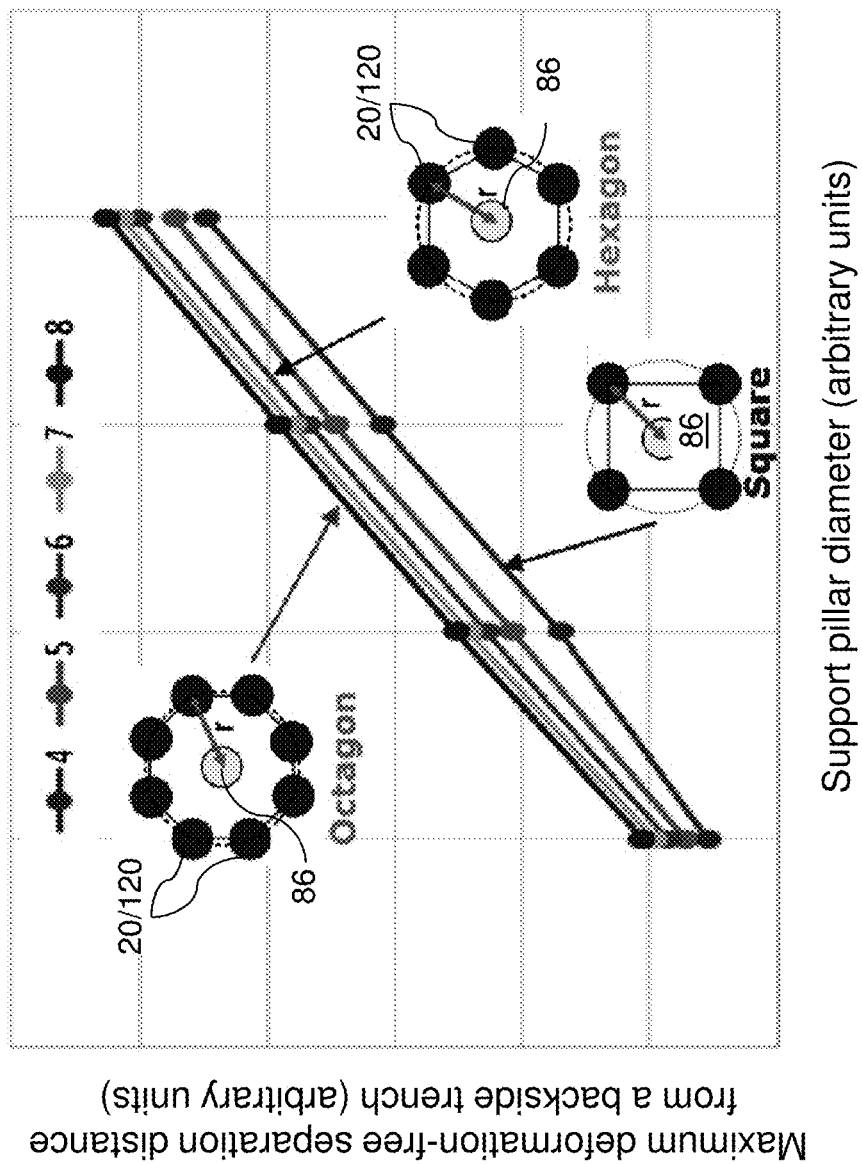
FIG. 17 is a graph illustrating the maximum deformation-free separation distance as a function of a support pillar diameter for various polygonal arrangements for support pillar structures.

FIG. 17 is a graph illustrating the maximum deformation-free separation distance as a function of a support pillar diameter for various polygonal arrangements for support pillar structures. The maximum deformation-free separation distance increase with an increase in the total number of support pillar structures that surrounds a support pillar structure located at the center location as expected. While an octagonal arrangement of support pillar structures around a support pillar structure at the center provides a longer maximum deformation-free separation distance, the nearest neighbor center-to-center distance for an arrangement including seven or more support pillar structures around a center support pillar structure is no longer the radius r of a circle passing through the geometrical centers of the peripheral support pillar structures. When the nearest neighbor center-to-center distance is selected as a parameter, the regular hexagonal arrangement provides the largest maximum deformation-free separation distance of the support pillar structures using a regular polygonal arrangement around a center support pillar structure.

Figure 18:
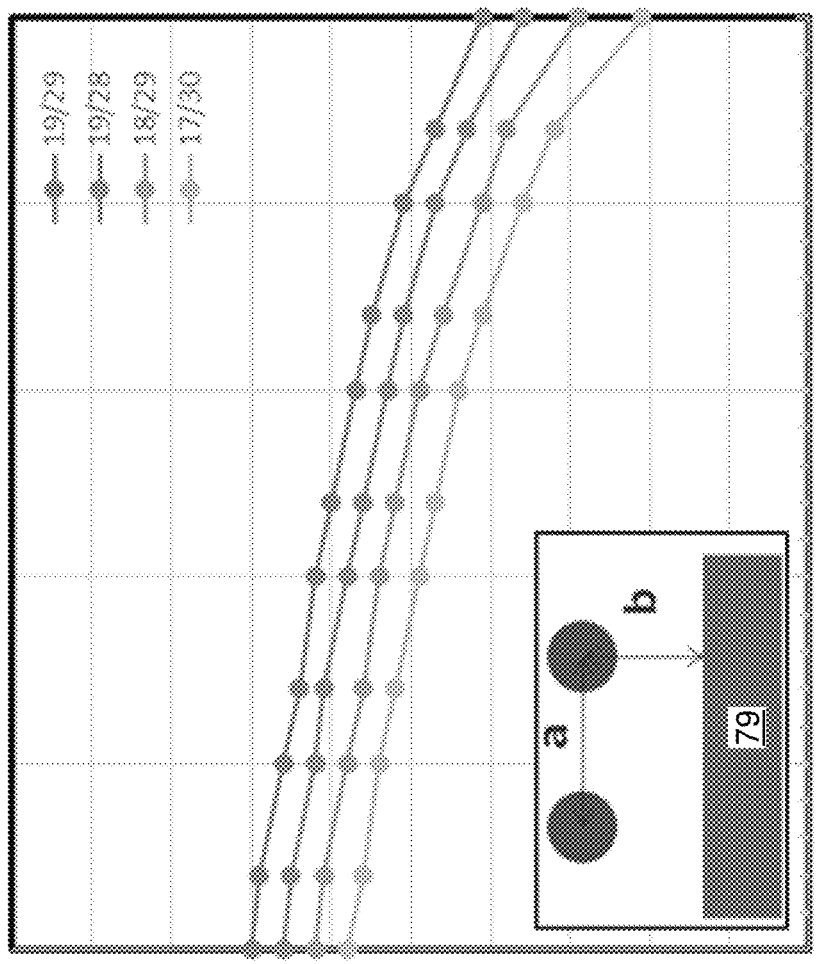
FIG. 18 is a graph illustrating the maximum deformation-free separation distance as a function of a support pillar center-to-center distance for a hexagonal array layout for support pillar structures according to an embodiment of the present disclosure.

Referring to FIG. 18, the maximum deformation-free separation distance as a function of a support pillar center-to-center depends on the material used for the insulating layers 32, the thickness of each insulating layer 32, and the height of each backside recess 43 (which is the same as the thickness of each sacrificial material layer 42). Four simulation results are shown in which the insulating layers 32 include densified undoped silicate glass, and the thickness of the insulating layers 32 and the height of the backside recesses 43 are 19 nm and 29 nm each, 19 nm and 28 nm each, 18 nm and 28 nm each, and 17 nm and 30 nm each.

Figure 19A:
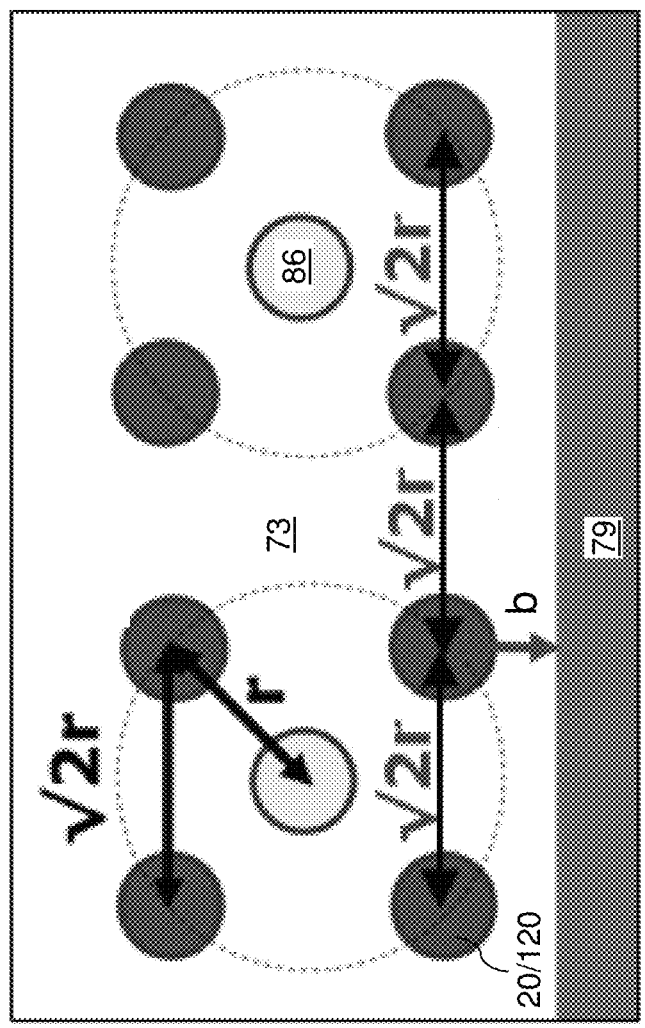
FIG. 19A is a comparative exemplary layout for support pillar structures and contact via structures.

FIG. 19A is a comparative exemplary layout for support pillar structures (20, 120) and contact via structures 86 that is derived from the layout of FIG. 14A by replacing a row of support pillar structures (20, 120) with contact via structures 86. In this case, the sites of the contact via structures 86 are not occupied by any support pillar structure (20, 120) while backside recesses 43 are present. Correspondingly, the insulating layers 32 are more prone to deformation and the support pillar structures (20, 120) are more prone to tilting and contact from one another. The contact via structures 86 are subsequently formed at every other center location of a unit square lattice.

Figure 19B:
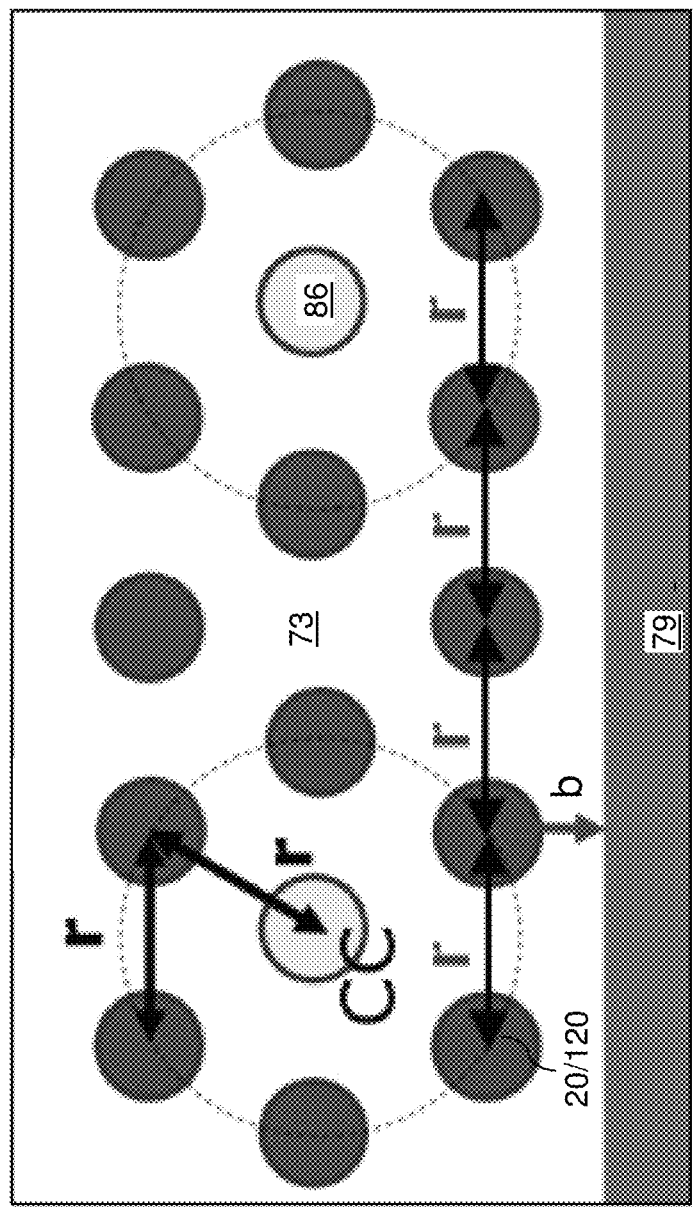
FIG. 19B is an exemplary layout for support pillar structures and contact via structures according to an embodiment of the present disclosure.

FIG. 19B is an exemplary layout for support pillar structures (20, 120) and contact via structures 86 according to an embodiment of the present disclosure, which is derived from the layout of FIG. 14B by replacing a row of support pillar structures (20, 120) with contact via structures 86. In this case, the sites of the contact via structures 86 are not occupied by any support pillar structure (20, 120) while backside recesses 43 are present. Every third lattice site does not include a support pillar structure (20, 120) in a row that is the second proximal row to the backside trench 79. Correspondingly, the insulating layers 32 are more prone to deformation and the support pillar structures (20, 120) are more prone to tilting and contact from one another. The contact via structures 86 are subsequently formed at every third location of a unit square lattice.

Figure 20:
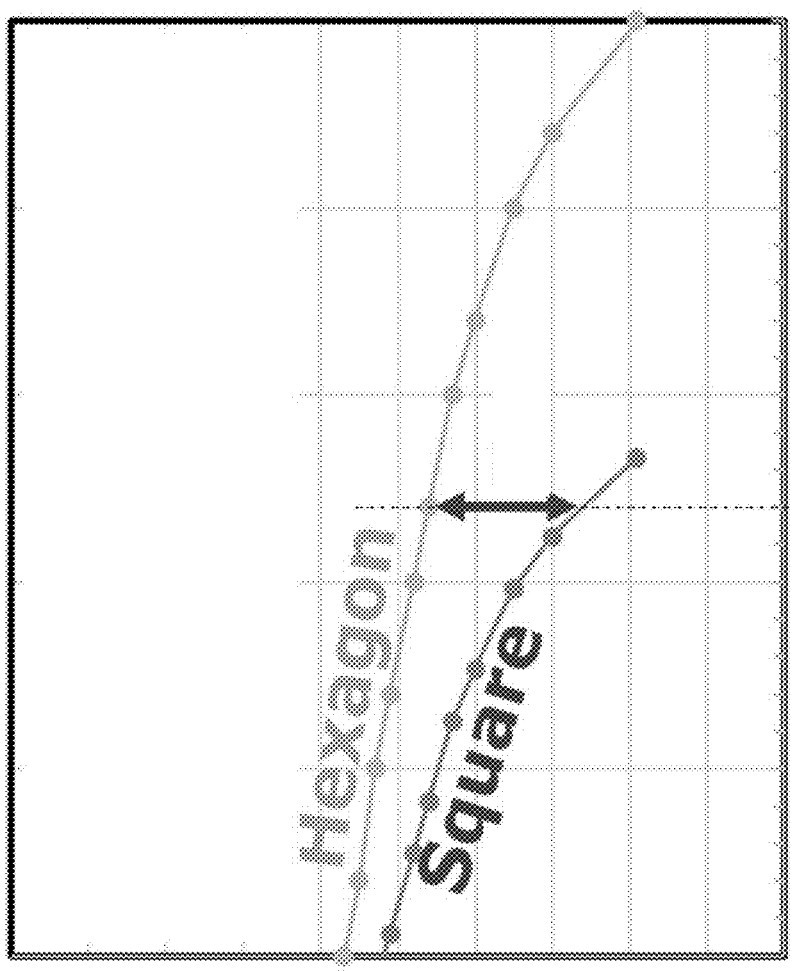
FIG. 20 is a graph illustrating the maximum deformation-free separation distance as a function of a support-pillar-to-contact-structure center-to-center distance r according to an embodiment of the present disclosure.

FIG. 20 is a graph illustrating the maximum deformation-free separation distance as a function of a support-pillar-to-contact-structure center-to-center distance r according to an embodiment of the present disclosure. The regular hexagonal lattice used in FIG. 19B provides a significantly higher maximum deformation-free separation distance from a backside trench relative to the layout using a square lattice used in FIG. 19A for a wide range of support-pillar-to-contact-structure center-to-center distance r. The advantage becomes considerable as the support-pillar-to-contact-structure center-to-center distance r increases.

Referring to all drawings and according to various embodiments of the present disclosure, a three-dimensional memory device is provided, which comprises: an alternating stack of insulating layers 32 and electrically conductive layers 46 located over a substrate (9, 10); memory stack structures 55 extending through a memory array region 100 of the alternating stack (32, 46); a combination of support pillar structures 20 and contact via structures 86 located in a staircase region 300 of the alternating stack (32, 46) that includes stepped surfaces of the alternating stack that include contains surfaces that are adjoined by vertical steps (S1, S2). The contact via structures (e.g., word line contact via structures) 86 contact a respective one of the electrically conductive layers (e.g., word lines) 46. Geometrical centers of the support pillar structures (20, 120) are arranged at vertices of a polygon having more than four vertices (and more than four sides) and having a respective contact via structure 86 located at a geometric center of the polygon in a plan view.

For example, as shown in FIG. 17, the polygon may have five or more vertices and five or more vertices and sides, such as six to ten vertices and sides, including seven, eight and nine vertices and sides. Thus, the polygon may be a pentagon, a hexagon or an octagon as shown in FIG. 17. The geometrical centers of the support pillar structures (20, 120) are arranged at vertices of the polygon while one respective contact via structure 86 is located at a geometric center of the polygon in the plan view.

As shown in FIG. 13D, the geometrical centers of the support pillar structures (20, 120) and contact via structures 86 are arranged in an equilateral triangular periodic array in plan view. In region 300, each vertex of the equilateral triangle contains a contact via structure 86 or a support pillar structure (20, 120). For example, two of the vertices of the equilateral triangle may contain a respective support pillar structure, and the third vertex may contain either another support pillar structure or a contact via structure 86.

As also shown in FIG. 13D, a peripheral region 200 lacks the contact via structures 86. The peripheral region 200 contains geometrical centers of the support pillar structures (20, 120) arranged in an equilateral triangular periodic array in plan view, in which each vertex of the equilateral triangle contains a support pillar structure.

In one embodiment shown in FIG. 13D, geometrical centers of the support pillar structures (20, 120) and contact via structures 86 are arranged in a hexagonal periodic array in a plan view in region 300.

In one embodiment, the three-dimensional memory device comprises a retro-stepped dielectric material potion 65 that overlies, and contacts, the stepped surfaces of the alternating stack (32, 46). In one embodiment, the support pillar structures (20, 120) vertically extend from a horizontal plane including a bottom surface of a bottommost layer of the alternating stack (32, 46) to a horizontal plane including a top surface of the retro-stepped dielectric material portion 65.

Figure 4D:
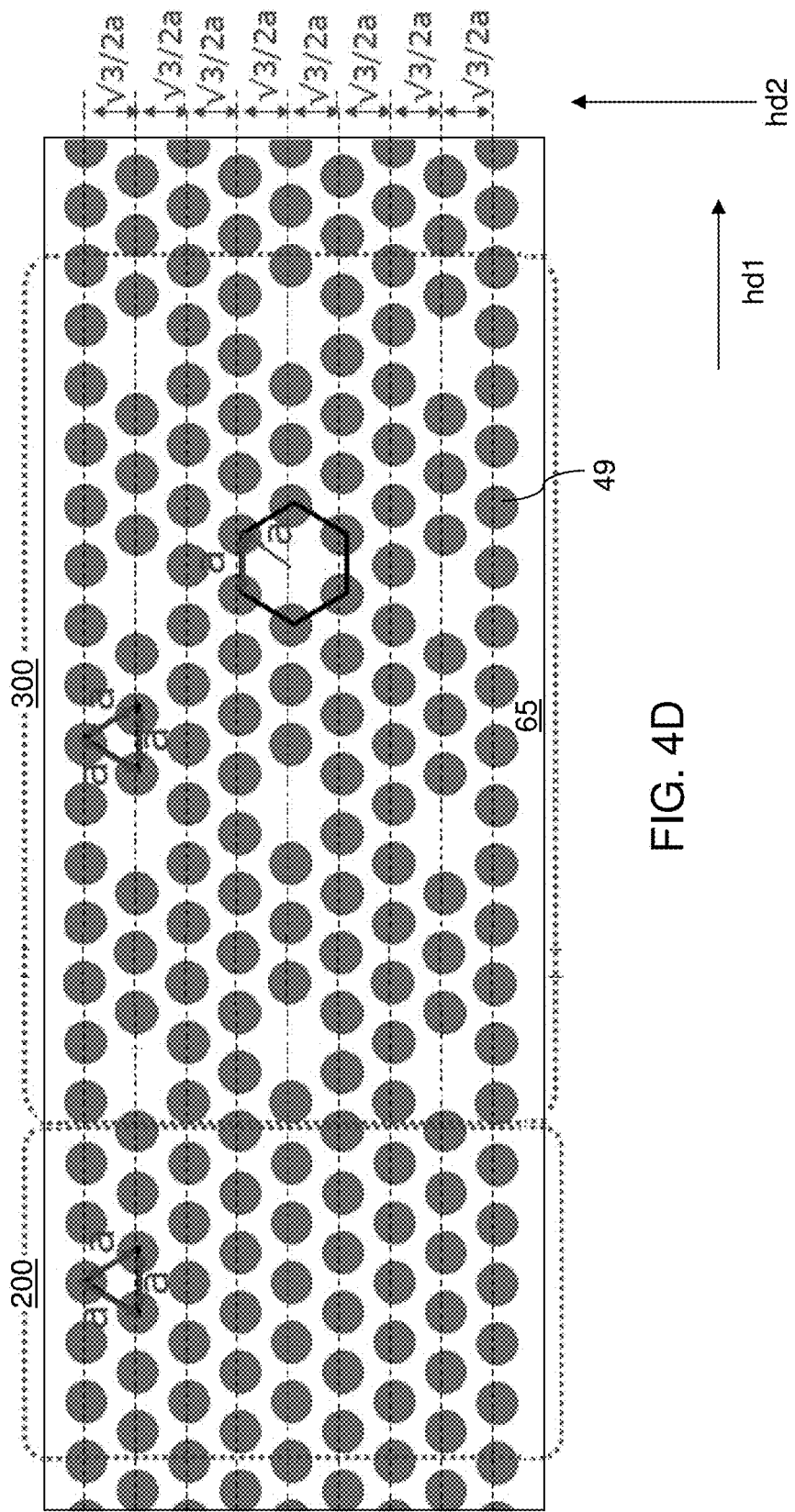
FIG. 4D is a magnified horizontal cross-sectional view of a staircase region and a peripheral region of the exemplary structure of at the level of the horizontal cross-sectional plane B-B' of FIG. 4B.

In one embodiment, three-dimensional memory device comprises a pair of backside trench fill structures (74, 76) laterally extending along a first horizontal direction hd1, wherein the alternating stack (32, 46) comprises a pair of lengthwise sidewalls that contact a respective one of the pair of backside trench fill structures (74, 76), and a horizontal direction along which a neighboring pair of support pillar structures (20, 120) (i.e., the direction of the nearest vertex-to-vertex distance a illustrated in FIGS. 4D, 7D, and 13D) is laterally spaced apart is parallel to, or perpendicular to, the first horizontal direction hd1.

In one embodiment, the stepped surfaces of the alternating stack (32, 46) comprise: first vertical steps S1 including first sidewalls of the insulating layers 32 that are parallel to the first horizontal direction hd1; and second vertical steps S2 including second sidewalls of the insulating layers 32 that are perpendicular to the first horizontal direction hd1. In one embodiment, the first vertical steps S1 may be located within a plurality of vertical planes that are located between the pair of backside trench fill structures (74, 76). In one embodiment, at least one of the second vertical steps S2 comprise sidewalls of multiple insulating layers 32 selected from the insulating layers 32 that are vertically coincident with each other and are perpendicular to the first horizontal direction hd1.

In one embodiment, the hexagonal periodic array may comprise a regular hexagonal periodic array in which each geometrical center of the support pillar structures (20, 120) and contact via structures 86 is located at a lattice site of a regular hexagonal lattice. The nearest vertex-to-vertex distance "a" (illustrated in FIGS. 4D, 7D, and 13D) is the same for each vertex in the regular hexagonal lattice. In one embodiment, neighboring pairs of contact via structures 86 may be laterally spaced apart by a lateral separation distance lsd that is greater than a separation distance between a neighboring pair of lattice sites of the regular hexagonal lattice (i.e., the nearest vertex-to-vertex distance).

In one embodiment, each of the memory stack structures 55 comprises a respective vertical semiconductor channel 60 and a respective memory film 50. In one embodiment, the memory stack structures 55 are arranged within the memory array region 100 as at least one two-dimensional hexagonal array in the plan view along the vertical direction.

In one embodiment, each of the support pillar structures 20 comprises: a respective semiconductor material layer 60 having a same composition, and a same thickness, as each of the vertical semiconductor channels 60 of the memory stack structures 55; and a dielectric layer stack 50 including a same set of materials as sublayers within the memory films 50.

In one embodiment, the support pillar structures 120 consist of at least one dielectric material.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit (comprising a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

The embodiments of the present disclosure provide a three-dimensional memory device in which the support pillar structures (20, 120) provide significantly enhanced structural support compared to prior art structures in which the support pillar structures are arranged in a rectangular array. The layer contact via structures 86 in the various embodiments disclosed herein may be formed at the lattice sites of the hexagonal lattice. During formation of the backside recesses 43, an imperfect hexagonal array of support pillar structures (20, 120) with unoccupied sites for subsequently forming the layer contact via structures 86 is used. As illustrated in FIG. 20, use of such an arrangement provides a significant enhancement to the structural integrity of the in-process three-dimensional memory device, and prevents deformation of, and/or contact from, the support pillar structures (20, 120). Thus, reliability of a three-dimensional memory device may be used by implementing embodiments of the present disclosure. In addition, the configuration of contact via structures 86 and support pillar structures (20/120) in the hexagonal array configuration improves the density of devices permitted in the memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory stack structures extending through a memory array region of the alternating stack;
a combination of support pillar structures and contact via structures located in a staircase region of the alternating stack that includes stepped surfaces of the alternating stack that also include surfaces that are adjoined by vertical steps, wherein:
the contact via structures contact a respective one of the electrically conductive layers;
geometrical centers of the support pillar structures are arranged at vertices of a polygon having five to eight vertices and having a respective contact via structure located at a geometric center of the polygon in a plan view; and
a peripheral region which lacks the contact via structures and which contains geometrical centers of the support pillar structures arranged in an equilateral triangular periodic array in plan view.

2. The three-dimensional memory device of claim 1, wherein the geometrical centers of the support pillar structures and contact via structures are arranged in an equilateral triangular periodic array in plan view.

3. The three-dimensional memory device of claim 1, wherein geometrical centers of the support pillar structures and contact via structures are arranged in a hexagonal periodic array in a plan view.

4. The three-dimensional memory device of claim 3, further comprising a retro-stepped dielectric material portion that overlies, and contacts, the stepped surfaces of the alternating stack, wherein the support pillar structures vertically extend from a horizontal plane including a bottom surface of a bottommost layer of the alternating stack to a horizontal plane including a top surface of the retro-stepped dielectric material portion.

5. The three-dimensional memory device of claim 3, wherein the hexagonal periodic array comprises a regular hexagonal periodic array in which each geometrical center of the support pillar structures and contact via structures is located at a lattice site of a regular hexagonal lattice.

6. The three-dimensional memory device of claim 5, wherein neighboring pairs of contact via structures are laterally spaced apart by a lateral separation distance that is greater than a separation distance between a neighboring pair of lattice sites of the regular hexagonal lattice.

7. The three-dimensional memory device of claim 1, further comprising a pair of backside trench fill structures laterally extending along a first horizontal direction, wherein the alternating stack comprises a pair of lengthwise sidewalls that contact a respective one of the pair of backside trench fill structures, and a neighboring pair of support pillar structures is laterally spaced apart along a horizontal direction that is parallel to, or perpendicular to, the first horizontal direction.

8. The three-dimensional memory device of claim 7, wherein:
the stepped surfaces of the alternating stack comprise first vertical steps including first sidewalls of the insulating layers that are parallel to the first horizontal direction, and second vertical steps including second sidewalls of the insulating layers that are perpendicular to the first horizontal direction;
the first vertical steps are located within a plurality of vertical planes that are located between the pair of backside trench fill structures; and
at least one of the second vertical steps comprise sidewalls of multiple insulating layers selected from the insulating layers that are vertically coincident with each other and are perpendicular to the first horizontal direction.

9. The three-dimensional memory device of claim 1, wherein each of the memory stack structures comprises a respective vertical semiconductor channel and a respective memory film.

10. The three-dimensional memory device of claim 9, wherein the memory stack structures are arranged within the memory array region as at least one two-dimensional hexagonal array in the plan view along a vertical direction.

11. The three-dimensional memory device of claim 9, wherein each of the support pillar structures comprises:
a respective semiconductor material layer having a same composition, and a same thickness, as each of the vertical semiconductor channels of the memory stack structures; and
a dielectric layer stack including a same set of materials as sublayers within the memory films.

12. The three-dimensional memory device of claim 9, wherein the support pillar structures comprise at least one dielectric material.

13. A method of forming a three-dimensional memory device, comprising:
    forming a vertically alternating sequence of continuous insulating layers and continuous sacrificial material layers over a substrate;
    forming stepped surfaces on the vertically alternating sequence by patterning the insulating layers and the continuous sacrificial material layers in a staircase region, wherein the stepped surfaces comprise horizontal surfaces adjoined by vertical steps;
    forming memory stack structures extending through the vertically alternating sequence in a memory array region;
    forming support pillar structures through the vertically alternating sequence within the staircase region and a peripheral region;
    forming an alternating stack of insulating layers and electrically conductive layers by patterning the vertically alternating sequence and replacing remaining portions of the continuous sacrificial material layers with electrically conductive layers; and
    forming contact via structures on a respective one of the electrically conductive layers, wherein geometrical centers of the support pillar structures and contact via structures are arranged in a hexagonal periodic array in a plan view in the staircase region;
    wherein the peripheral region lacks contact via structures and contains geometrical centers of the support pillar structures arranged in an equilateral triangular periodic array in plan view.

14. The method of claim 13, further comprising forming a retro-stepped dielectric material portion over the stepped surfaces of the alternating stack, wherein the support pillar structures are formed through the retro-stepped dielectric material portion.

15. The method of claim 14, wherein the support pillar structures vertically extend from a horizontal plane including a bottom surface of a bottommost layer of the alternating stack to a horizontal plane including a top surface of the retro-stepped dielectric material portion.

16. The method of claim 13, wherein patterning the vertically alternating sequence comprises forming backside trenches through the vertically alternating sequence in areas in which the memory stack structures and the support pillar structures are not present, wherein each of the backside trenches laterally extends along a first horizontal direction, wherein a neighboring pair of support pillar structures is laterally spaced apart along a horizontal direction that is parallel to, or perpendicular to, the first horizontal direction.

17. The method of claim 16, wherein the stepped surfaces comprise:
    first vertical steps including first sidewalls of the insulating layers that are parallel to the first horizontal direction; and
    second vertical steps including second sidewalls of the insulating layers that are perpendicular to the first horizontal direction.

18. The method of claim 17, wherein:
    the first vertical steps are located within a plurality of vertical planes that are located between the pair of backside trench fill structures; and
    at least one of the second vertical steps comprise sidewalls of multiple insulating layers selected from the insulating layers that are vertically coincident with each other and are perpendicular to the first horizontal direction.

19. The method of claim 13, wherein:
    the hexagonal periodic array comprises a regular hexagonal periodic array in which each geometrical center of the support pillar structures and contact via structures is located at a lattice site of a regular hexagonal lattice; and
    neighboring pairs of contact via structures are laterally spaced apart by a lateral separation distance that is greater than a separation distance between a neighboring pair of lattice sites of the regular hexagonal lattice.

* * * * *